(12) United States Patent
Jung et al.

(10) Patent No.: US 11,697,763 B2
(45) Date of Patent: Jul. 11, 2023

(54) QUANTUM DOT COMPOSITION AND METHOD OF MANUFACTURING LIGHT-EMITTING DEVICE USING THE QUANTUM DOT COMPOSITION

(71) Applicant: SAMSUNG DISPLAY CO., LTD., Yongin-si (KR)

(72) Inventors: Yunku Jung, Yongin-si (KR); Hyekyoung Choi, Yongin-si (KR); Sungwoon Kim, Yongin-si (KR); Jaekook Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 97 days.

(21) Appl. No.: 17/356,463

(22) Filed: Jun. 23, 2021

(65) Prior Publication Data
US 2022/0098481 A1    Mar. 31, 2022

(30) Foreign Application Priority Data

Sep. 28, 2020 (KR) .......................... 10-2020-0126368

(51) Int. Cl.
*C09K 11/62* (2006.01)
*C09K 11/56* (2006.01)
(Continued)

(52) U.S. Cl.
CPC .......... *C09K 11/626* (2013.01); *C09K 11/025* (2013.01); *C09K 11/0883* (2013.01); *C09K 11/565* (2013.01); *C09K 11/70* (2013.01); *C09K 11/883* (2013.01); *B82Y 20/00* (2013.01); *B82Y 40/00* (2013.01); *H10K 50/115* (2023.02)

(58) Field of Classification Search
CPC ........................... C09K 11/025; H10K 50/115
See application file for complete search history.

(56) References Cited

U.S. PATENT DOCUMENTS 8,765,014 B2   7/2014   Cho et al.
10,311,994 B2   6/2019   He et al.
(Continued)

FOREIGN PATENT DOCUMENTS

CN   109021701 A   12/2018
CN   109651887 A    4/2019
(Continued)

OTHER PUBLICATIONS

English transation for KR 2013-0047943, May 9, 2013.*
(Continued)

*Primary Examiner* — C Melissa Koslow
(74) *Attorney, Agent, or Firm* — Lewis Roca Rothgerber Christie LLP

(57) ABSTRACT

A quantum dot composition may include: a first solvent; a second solvent different from the first solvent; first quantum dots including a hole-transporting ligand; and second quantum dots including an electron-transporting ligand, wherein the first solvent and the second solvent are miscible solvents having different boiling points from each other, a degree of dispersion of the first quantum dots is greater in the first solvent than in the second solvent, and a degree of dispersion of the second quantum dots is greater in the second solvent than in the first solvent.

20 Claims, 4 Drawing Sheets

(51) Int. Cl.
*C09K 11/88* (2006.01)
*C09K 11/70* (2006.01)
*C09K 11/02* (2006.01)
*C09K 11/08* (2006.01)
*B82Y 20/00* (2011.01)
*B82Y 40/00* (2011.01)
*H10K 50/115* (2023.01)

(56) References Cited

U.S. PATENT DOCUMENTS

| | | | |
|---|---|---|---|
| 11,005,060 B2 * | 5/2021 | Chung | ............... H01L 51/5056 |
| 2018/0230321 A1 | 8/2018 | Pan et al. | |
| 2019/0326539 A1 | 10/2019 | Chung et al. | |
| 2021/0020858 A1 | 1/2021 | Qin | |

FOREIGN PATENT DOCUMENTS

| | | |
|---|---|---|
| EP | 2221355 A1 | 8/2010 |
| KR | 10-2013-0047943 A | 5/2013 |
| KR | 10-2019-0004827 A | 1/2019 |
| WO | 2020/048527 A1 | 3/2020 |

OTHER PUBLICATIONS

Govor et al. (2006) "Self-assembled treelike patterns from an evaporating binary solution", University of Oldenburg, Physical Review, E 74, DOI: 10.1103/PhysRevE.74.061603 (8 pages).

Extended European Search Report dated Mar. 18, 2022, in corresponding EP Patent Application No. 21198134.5 (8 pages).

* cited by examiner

QUANTUM DOT COMPOSITION AND METHOD OF MANUFACTURING LIGHT-EMITTING DEVICE USING THE QUANTUM DOT COMPOSITION

CROSS-REFERENCE TO RELATED APPLICATION

This application claims priority to and the benefit of Korean Patent Application No. 10-2020-0126368, filed on Sep. 28, 2020, in the Korean Intellectual Property Office, the entire content of which is hereby incorporated by reference.

BACKGROUND

1. Field

One or more embodiments of the present disclosure relate to a quantum dot composition and a method of manufacturing a light-emitting device using the quantum dot composition.

2. Description of Related Art

Light-emitting devices are devices that convert electrical energy into light energy. Examples of such light-emitting devices are an organic light-emitting device using an organic material for an emission layer, a quantum dot light-emitting device using quantum dots for an emission layer, and/or the like, without limitation.

In a light-emitting device, a first electrode is arranged on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

SUMMARY

One or more embodiments of the present disclosure are directed towards a quantum dot composition and a method of manufacturing a light-emitting device using the quantum dot composition. One or more embodiments are directed towards a quantum dot composition including solvents having different boiling points from each other, and a method of manufacturing a light-emitting device in which a double-layered emission layer structure (referred to as a double-layered emission layer) is formed using the quantum dot composition by a single process.

Additional embodiments will be set forth in part in the description which follows and, in part, will be apparent from the description, or may be learned by practice of the presented embodiments of the disclosure.

According to one or more embodiments, a quantum dot composition includes:
a first solvent,
a second solvent different from the first solvent,
first quantum dots including a hole-transporting ligand, and
second quantum dots including an electron-transporting ligand,
wherein the first solvent and the second solvent are miscible solvents having different boiling points from each other,
a degree of dispersion of the first quantum dots is greater in the first solvent than in the second solvent, and
a degree of dispersion of the second quantum dots is greater in the second solvent than in the first solvent.

According to one or more embodiments, a method of manufacturing a light-emitting device includes
providing a quantum dot composition on a first electrode, wherein the quantum dot composition includes a first solvent, a second solvent different from the first solvent, first quantum dots including a hole-transporting ligand, and second quantum dots including an electron-transporting ligand, wherein the first solvent and the second solvent are miscible solvents having different boiling points from each other, a degree of dispersion of the first quantum dots is greater in the first solvent than in the second solvent, and a degree of dispersion of the second quantum dots is greater in the second solvent than in the first solvent,
forming a first emission layer by removing a solvent having a lower boiling point among the first solvent and the second solvent,
forming a second emission layer by removing a solvent having a higher boiling point among the first solvent and the second solvent, and
forming a second electrode on the second emission layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
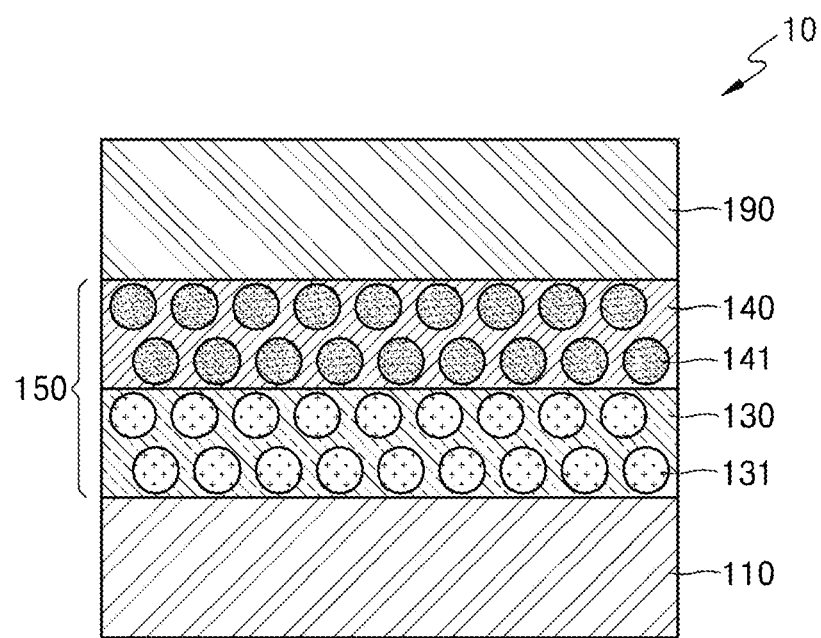
FIG. 1 is a schematic cross-sectional view of a light-emitting device manufactured using a quantum dot composition according to one or more embodiments.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. Expressions such as "at least one selected from," "one of," and "selected from," when preceding a list of elements, modify the entire list of elements and do not modify the individual elements of the list. Further, the use of "may" when describing embodiments of the present disclosure refers to "one or more embodiments of the present disclosure."

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are not provided.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or component is referred to as being "on" or "onto" another layer, region, or component, it may be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

In the present specification, the term "room temperature" refers to about 25° C.

The term "interlayer" as used herein refers to a single layer and/or all layers between a first electrode and a second electrode of a light-emitting device. A material included in the "interlayer" may be an organic material and/or an inorganic material.

The expression "(an interlayer) includes at least one compound represented by Formula 1" as used herein may include a case in which "(an interlayer) includes one or more identical compounds represented by Formula 1" and a case in which "(an organic layer) includes two or more different compounds represented by Formula 1".

In the present specification, the term "quantum dot" refers to a crystal of a semiconductor compound, and may include any material capable of emitting light of various emission wavelengths according to the size of the crystal.

In the present specification, the term "miscible" refers to ability of one or more components, such as liquids, solids, and/or gases, to mix with each other in a single and homogeneous shape. For example, two liquids are referred to be miscible when different components therein can be mixed to a single and homogeneous liquid that is only distinguished at a molecular level.

In the present specification, the term "immiscible" refers to ability of two or more components, such as liquids, solids, and/or gases, to mix with each other in two or more shapes (e.g., layers). For example, when an organic solvent is immiscible with a water-soluble solvent (e.g., hexane and water), the organic solvent may be seen as a separate layer that does not mix with the water-soluble solvent.

Quantum Dot Composition

One or more embodiments of the present disclosure provide a quantum dot composition including: a first solvent; a second solvent different from the first solvent; first quantum dots including a hole-transporting ligand; and second quantum dots including an electron-transporting ligand, wherein the first solvent and the second solvent may be miscible solvents having different boiling points from each other, a degree of dispersion of the first quantum dots is greater in the first solvent than in the second solvent, and a degree of dispersion of the second quantum dots is greater in the second solvent than in the first solvent.

Quantum Dots

The first quantum dot and the second quantum dot may each include crystals of a semiconductor compound. The hole-transporting ligand may be coordinated on the surface of the first quantum dot, and the electron-transporting ligand may be coordinated on the surface of the second quantum dot.

In one or more embodiments, the first quantum dot and the second quantum dot may each independently include: a Group III-VI semiconductor compound; a Group II-VI semiconductor compound; a Group III-V semiconductor compound; a Group I-III-VI semiconductor compound; a Group IV-VI semiconductor compound; a Group IV element or compound; or any combination thereof.

Non-limiting examples of the Group III-VI semiconductor compound are: a binary compound, such as GaS, GaSe, $Ga_2Se_3$, GaTe, InS, InSe, $In_2S_3$, $In_2Se_3$, and/or InTe; a ternary compound, such as $InGaS_3$, and/or $InGaSe_3$; or any combination thereof.

Non-limiting examples of the Group II-VI semiconductor compound are: a binary compound, such as CdSe, CdTe, ZnS, ZnSe, ZnTe, ZnO, HgS, HgSe, HgTe, MgSe, MgS, and/or the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or the like; a quaternary compound, such as CdZnSeS, CdZnSeTe, CdZnSTe, CdHgSeS, CdHgSeTe, CdHgSTe, HgZnSeS, HgZnSeTe, HgZnSTe, and/or the like; or any combination thereof.

Non-limiting examples of the Group III-V semiconductor compound are: a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and/or the like; a quaternary compound, such as GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, and/or the like; or any combination thereof. In one or more embodiments, the Group III-V semiconductor compound may further include a Group II element. Non-limiting examples of the Group III-V semiconductor compound further including a Group II element are InZnP, InGaZnP, InAlZnP, and/or the like.

Non-limiting examples of the Group semiconductor compound are: a ternary compound, such as AgInS, $AgInS_2$, CuInS, $CuInS_2$, $CuGaO_2$, $AgGaO_2$, $AgAlO_2$ and/or the like; or any combination thereof.

Non-limiting examples of the Group IV-VI semiconductor compound are: a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or any combination thereof.

The Group IV element or compound may include: a single element compound, such as Si and/or Ge; a binary compound, such as SiC and/or SiGe; or any combination thereof, without limitation.

Each element included in a multi-element compound, such as the binary compound, the ternary compound, and/or the quaternary compound, may exist in a particle with a uniform concentration or non-uniform concentration.

In one or more embodiments, the first quantum dot and the second quantum dot may each have a single structure or a dual core-shell structure. In the case of the single structure, the concentration of each element included in the corresponding quantum dots is uniform. For example, a material included in the core may be different from a material included in the shell.

The shell of each of the first quantum dot and the second quantum dot may serve as a protective layer for maintaining semiconductor characteristics by preventing (or reducing) chemical modification of the core of each of the first quantum dot and second quantum dot, and/or may serve as a charging layer for imparting electrophoretic characteristics to the first quantum dot and second quantum dot. The shell may have a single-layered structure or a multi-layered structure. The interface between the core and the shell may have a concentration gradient in which concentration of the element present in the shell decreases toward the center.

Non-limiting examples of the shell of each of the first quantum dot and second quantum dot are an oxide of metal or non-metal, a semiconductor compound, or any combination thereof. Non-limiting examples of the oxide of metal or non-metal are: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound, such as $MgAl_2O_4$, $CoFe_2O_4$, $NiFe_2O_4$, and/or $CoMn_2O_4$; or any combination thereof. Non-limiting examples of the semiconductor compound are: as described herein, a Group III-VI semiconductor compound; a Group II-VI semiconductor compound; a Group III-V semiconductor compound; a Group III-VI semiconductor compound; a Group I-III-VI semiconductor compound; a Group IV-VI semiconductor compound; or any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The first quantum dot and second quantum dot may each have a full width at half maximum (FWHM) of an emission wavelength spectrum of equal to or less than about 45 nm, for example, equal to or less than about 40 nm, and for example, equal to or less than about 30 nm. Within these ranges, a formed light-emitting device using the quantum dot composition may have improved color purity or color reproducibility. In addition, because light emitted through these quantum dots may be emitted in all directions, the wide viewing angle of the formed light-emitting device using the quantum dot composition may be improved.

In one or more embodiments, the first quantum dot and second quantum dot may each be, for example, a spherical, a pyramidal, a multi-arm, and/or cubic nanoparticle, a nanotube, a nanowire, a nanofiber, and/or a nanoplate particle.

Because an energy band gap may be adjusted by controlling the size of the quantum dots, light having various wavelength bands may be obtained from a quantum dot emission layer. Therefore, by using quantum dots of different sizes, a light-emitting device that emits light of various wavelengths may be implemented. In detail, the size of the quantum dots may be selected to emit red, green, and/or blue light. In one or more embodiments, the size of the quantum dots may be configured to emit white light by combining light of various colors.

The first quantum dot and second quantum dot may each independently have a diameter of, for example, about 1 nm to about 15 nm, and for example, about 5 nm to about 15 nm.

The first quantum dot and second quantum dot may each independently be synthesized by a wet chemical process, an organometallic chemical vapor deposition process, a molecular beam epitaxy process, and/or any process similar thereto.

According to the wet chemical process, a precursor material is mixed with an organic solvent to grow quantum dot particle crystals. When the crystals grow, an organic solvent naturally may act as a dispersant coordinated on the surface of the quantum dot crystals and control (or manage) the growth of the crystals, so that the growth of quantum dot particles may be controlled (or managed) through a process which is more easily performed than vapor deposition methods, such as metal organic chemical vapor deposition (MOCVD) and/or molecular beam epitaxy (MBE), and which can be performed at low costs.

The first quantum dot may include a hole-transporting ligand. For example, the hole-transporting ligand may be coordinated on the surface of the first quantum dot.

In one or more embodiments, the hole-transporting ligand may include an aromatic hydrocarbon group-containing compound. For example, the hole-transporting ligand may be an aromatic hydrocarbon group-containing carboxylic acid, an aromatic hydrocarbon group-containing amine, an aromatic hydrocarbon group-containing alcohol, an aromatic hydrocarbon group-containing thiol, an aromatic hydrocarbon group-containing phosphine oxide, an aromatic hydrocarbon group-containing phosphine, an aromatic hydrocarbon group-containing phosphonic acid, an aromatic hydrocarbon group-containing ester, an aromatic hydrocarbon group-containing acid anhydride, or any combination thereof.

In one or more embodiments, the aromatic hydrocarbon group may be a $C_6$-$C_{60}$ aryl group unsubstituted or substituted with at least one $R_{10a}$, a $C_1$-$C_{60}$ heteroaryl group unsubstituted or substituted with at least one $R_{10a}$, or any combination thereof.

In one or more embodiments, the aromatic hydrocarbon group may be a phenyl group, a biphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, an acenaphthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, or any combination thereof, each unsubstituted or substituted with at least one $R_{10a}$.

$R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In one or more embodiments, the aromatic hydrocarbon group may be a phenyl group, a biphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, an acenaphthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, or any combination thereof, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, an acenaphthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof, wherein $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

For example, the hole-transporting ligand may be represented by Formula 1:

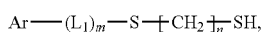 Formula 1 wherein, in Formula 1,

Ar may be a phenyl group, a naphthyl group, a fluorenyl group, a spiro-bifluorenyl group, a phenanthrenyl group, an anthracenyl group, a fluoranthenyl group, an acenaphthenyl group, a triphenylenyl group, a pyrenyl group, a chrysenyl group, a perylenyl group, a thiophenyl group, a furanyl group, an indolyl group, an isoindolyl group, a benzofuranyl group, a benzothiophenyl group, an imidazolyl group, a pyrazolyl group, a thiazolyl group, an isothiazolyl group, an oxazolyl group, an isoxazolyl group, a thiadiazolyl group, an oxadiazolyl group, a pyridinyl group, a pyrimidinyl group, a pyrazinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, a carbazolyl group, a benzofuranyl group, a benzothiophenyl group, a dibenzofuranyl group, a dibenzothiophenyl group, or a dibenzosilolyl group, each unsubstituted or substituted with at least one $R_{10a}$, Li may be a single bond, a $C_1$-$C_{10}$ alkylene group unsubstituted or substituted with at least one $R_{10a}$, a $C_1$-$C_{10}$ alkenylene group unsubstituted or substituted with at least one $R_{10a}$, a $C_1$-$C_{10}$ alkynylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, m may be an integer from 1 to 5, n may be an integer from 1 to 10, and $R_{10a}$ may be the same as described herein.

In one or more embodiments, Ar in Formula 1 may be a phenyl group, a naphthyl group, a fluorenyl group, a spiro-bifluorenyl group, a phenanthrenyl group, an anthracenyl group, a fluoranthenyl group, an acenaphthenyl group, a triphenylenyl group, a pyrenyl group, a chrysenyl group, a perylenyl group, a thiophenyl group, a furanyl group, an indolyl group, an isoindolyl group, a benzofuranyl group, a benzothiophenyl group, an imidazolyl group, a pyrazolyl group, a thiazolyl group, an isothiazolyl group, an oxazolyl group, an isoxazolyl group, a thiadiazolyl group, an oxadiazolyl group, a pyridinyl group, a pyrimidinyl group, a pyrazinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, a carbazolyl group, a benzofuranyl group, a benzothiophenyl group, a dibenzofuranyl group, a dibenzothiophenyl group, or a dibenzosilolyl group, each substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a naphthyl group, a fluorenyl group, a spiro-bifluorenyl group, a phenanthrenyl group, an anthracenyl group, a fluoranthenyl group, an acenaphthenyl group, a triphenylenyl group, a pyrenyl group, a chrysenyl group, a perylenyl group, a thiophenyl group, a furanyl group, an indolyl group, an isoindolyl group, a benzofuranyl group, a benzothiophenyl group, an imidazolyl group, a pyrazolyl group, a thiazolyl group, an isothiazolyl group, an oxazolyl group, an isoxazolyl group, a thiadiazolyl group, an oxadiazolyl group, a pyridinyl group, a pyrimidinyl group, a pyrazinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, a carbazolyl group, a benzofuranyl group, a benzothiophenyl group, a dibenzofuranyl group, a dibenzothiophenyl group, a dibenzosilolyl group, or any combination thereof.

In one or more embodiments, Ar in Formula 1 may be one of groups represented by Formulae 2-1 to 2-8:

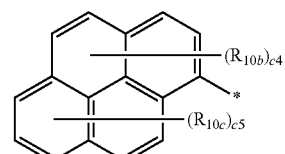

2-1

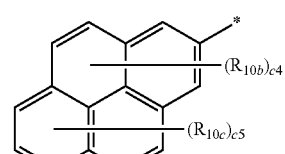

2-2

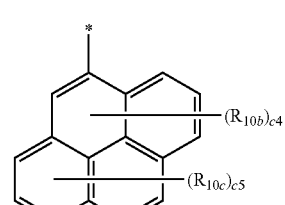

2-3

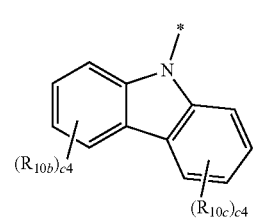

2-4

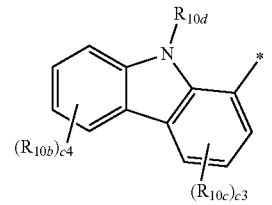

2-5

-continued 2-6

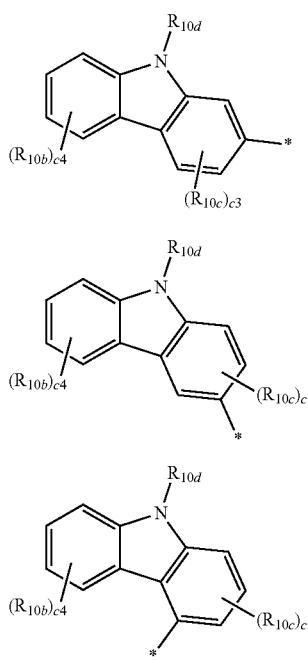

2-7

2-8 wherein, in Formulae 2-1 to 2-8, $R_{10b}$, $R_{10c}$, and $R_{10d}$ may each be the same as described in connection with $R_{10a}$, c3 may be an integer from 0 to 3, c4 may be an integer from 0 to 4, c5 may be an integer from 0 to 5, and

* indicates a binding site to a neighboring atom.

When m in Formula 1 is 2 or more, two or more of Li(s) may be identical to or different from each other.

In Formula 1, *—SH may be an anchoring group binding to the surface of the quantum dots. Here, the anchoring group refers to a linking group that allows a ligand to be attached to a quantum dot when the ligand is coordinated on the quantum dots.

In one or more embodiments, the hole-transporting ligand may be at least one selected from Ligands A to D, but embodiments of the present disclosure are not limited thereto:

Ligand A

Ligand B

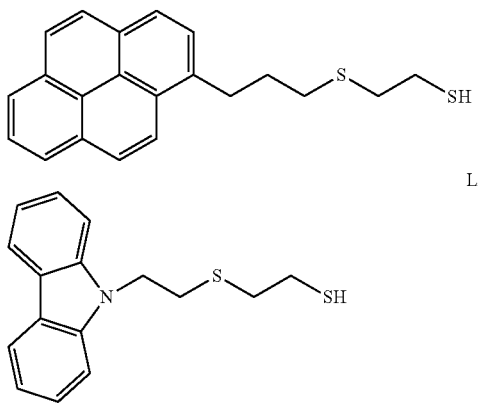

Ligand C

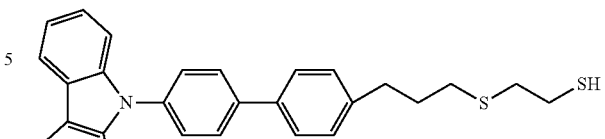

Ligand D

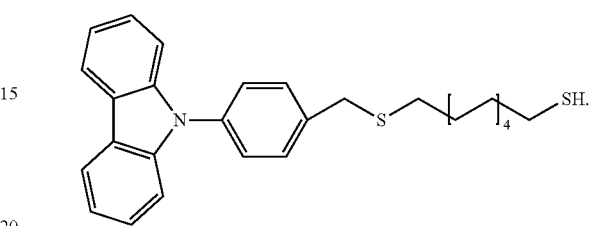

As the hole-transporting ligand includes the aromatic hydrocarbon group according to the present embodiments, a highest occupied molecular orbital (HOMO) level may be improved, thereby facilitating injection of holes into an emission layer.

The hole-transporting ligand may be reacted by mixing a hole-transporting ligand together with an organic solvent and a precursor material for forming the first quantum dots, or may be attached to the surface of the first quantum dots through a ligand exchange reaction after the hole-transporting ligand is added to a mixture of an organic solvent and the first quantum dots to which a random ligand (e.g., any suitable ligand) is attached. However, embodiments of the present disclosure are not limited thereto.

The second quantum dot may include an electron-transporting ligand. For example, the electron-transporting ligand may be coordinated on the surface of the second quantum dot.

In one or more embodiments, the electron-transporting ligand may include an aliphatic hydrocarbon group-containing compound, a halogen ion, $BF_4^-$, or any combination thereof.

In one or more embodiments, the aliphatic hydrocarbon group may include a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_3$-$C_{10}$ cycloalkyl group unsubstituted or substituted with at least one $R_{10a}$, a $C_3$-$C_{10}$ cycloalkenyl group unsubstituted or substituted with at least one $R_{10a}$, or any combination thereof.

In one or more embodiments, the electron-transporting ligand may be an aliphatic hydrocarbon group-containing carboxylic acid, an aliphatic hydrocarbon group-containing amine, an aliphatic hydrocarbon group-containing alcohol, an aliphatic hydrocarbon group-containing thiol, an aliphatic hydrocarbon group-containing phosphine oxide, an aliphatic hydrocarbon group-containing phosphine, an aliphatic hydrocarbon group-containing phosphonic acid, an aliphatic hydrocarbon group-containing ester, an aliphatic hydrocarbon group-containing acid anhydride, an aliphatic hydrocarbon group-containing halide, an aliphatic hydrocarbon group-containing acyl halide, a halogen ion, $BF_4^-$, or any combination thereof.

In one or more embodiments, the electron-transporting ligand may be RCOOH, RNH$_2$, R$_2$NH, R$_3$N, ROH, RSH, R$_3$PO, R$_3$P, RPO(OH)$_2$, RCOOR', RCOOCOR', R—X, RCOX, a halogen ion, BF$_4^-$, or any combination thereof, wherein R and R' may each independently be a C$_1$-C$_{60}$ alkyl group unsubstituted or substituted with at least one R$_{10a}$, a C$_2$-C$_{60}$ alkenyl group unsubstituted or substituted with at least one R$_{10a}$, a C$_2$-C$_{60}$ alkynyl group unsubstituted or substituted with at least one R$_{10a}$, a C$_3$-C$_{10}$ cycloalkyl group unsubstituted or substituted with at least one R$_{10a}$, or a C$_3$-C$_{10}$ cycloalkenyl group unsubstituted or substituted with at least one R$_{10a}$, and X may be Cl, Br, or I.

In one or more embodiments, the electron-transporting ligand may be formic acid, acetic acid, propanoic acid, butanoic acid, pentanoic acid, hexanoic acid, heptanoic acid, octanoic acid, dodecanoic acid, hexadecanoic acid, octadecanoic acid, oleic acid, stearic acid, palmitic acid, methylamine, ethylamine, propylamine, butylamine, pentylamine, hexylamine, heptylamine, octylamine, dodecylamine, hexadecylamine, octadecylamine, oleylamine, dimethylamine, diethylamine, dipropylamine, methanol, ethanol, propanol, butanol, pentanol, hexanol, heptanol, octanol, dodecanol, hexadecanol, octadecanol, methanethiol, ethanethiol, propanethiol, butanethiol, pentanethiol, hexanethiol, heptanethiol, octanethiol, dodecanthiol, hexadecanthiol, octadecanthiol, trimethylphosphine oxide, triethylphosphine oxide, tripropylphosphine oxide, tributylphosphine oxide, trioctylphosphine oxide, F$^-$, Cl$^-$, Br$^-$, I$^-$, BF$_4^-$, or any combination thereof, but embodiments of the present disclosure are not limited thereto.

In one or more embodiments, the electron-transporting ligand may be dodecanthiol, but embodiments of the present disclosure are not limited thereto.

As the electron-transporting ligand includes the aliphatic hydrocarbon group of the present embodiments, injection of electrons into an emission layer may be facilitated.

The electron-transporting ligand may be reacted by mixing an electron-transporting ligand together with an organic solvent and a precursor material for forming the second quantum dot, or may be attached to the surface of the second quantum dot through a ligand exchange reaction after the electron-transporting ligand is added to a mixture of an organic solvent and the second quantum dots to which a random ligand (e.g., any suitable ligand) is attached. However, embodiments of the present disclosure are not limited thereto.

In one or more embodiments, both the hole-transporting ligand and the electron-transporting ligand may be thiol compounds. For example, the hole-transporting ligand may be an aromatic hydrocarbon group-containing thiol, and the electron-transporting ligand may be an aliphatic hydrocarbon group-containing thiol.

In one or more embodiments, a total amount of the first quantum dots and the second quantum dots may be, based on the total weight of the quantum dot composition, in a range of about 0.1 wt % to about 20 wt %, for example, about 1 wt % to about 20 wt %, and for example, about 3 wt % to about 15 wt %, but embodiments of the present disclosure are not limited thereto. When the total amount is satisfied within these ranges, the quantum dot composition may have a suitable solid content concentration for a soluble process.

Solvent

A degree of dispersion of quantum dots in a solvent may be observed with a naked eye, or may be measured by transmittance comparison using an optical device, such as Turbiscan™, UV-Vis spectrometer, and/or dynamic light scattering (DLS), or may be measured using a particle size analyzer, and/or atom probe tomography (APT).

The degree of dispersion of the first quantum dots may be greater in the first solvent than in the second solvent, and the degree of dispersion of the second quantum dots may be greater in the second solvent than in the first solvent. In this regard, the first solvent may improve the dispersibility of the first quantum dots, and the second solvent may improve the dispersibility of the second quantum dots, and accordingly, the quantum dot composition may have excellent dispersibility.

In one or more embodiments, the first solvent may include an aromatic hydrocarbon solvent. For example, when the first quantum dot includes an aromatic hydrocarbon group-containing compound coordinated on the surface thereof, the first solvent including an aromatic hydrocarbon solvent may improve the dispersibility of the first quantum dots.

For example, the first solvent may include toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, propylanisole, 1-ethylnaphthalene, 2-ethylnaphthalene, 2-ethylbiphenyl, octylbenzene, or any combination thereof.

In one or more embodiments, the second solvent may include an aliphatic hydrocarbon solvent, an aromatic hydrocarbon solvent, or any combination thereof. For example, when the second quantum dot includes an aliphatic hydrocarbon group-containing compound coordinated on the surface thereof, the second solvent including an aliphatic hydrocarbon solvent, an aromatic hydrocarbon solvent, or any combination thereof may improve the dispersibility of the second quantum dots.

For example, the second solvent may include n-octane, n-nonane, n-decane, n-undecane, n-dodecane, n-tridecane, n-tetradecane, n-pentadecane, n-hexadecane, 2-methylheptane, 3-methylheptane, 4-methylheptane, 2,2-dimethylhexane, 2,3-dimethylhexane, 2,4-dimethylhexane, 2,5-dimethylhexane, 3,3-dimethylhexane, 3-ethylhexane, 2,2,4-trimethylpentane, 2-methyloctane, 2-methylnonane, 2-methyldecane, 2-methylundecane, 2-methyldodecane, 2-methyltridecane, methylcyclohexane, ethylcyclohexane, 1,1-dimethylcyclohexane, 1,2-dimethylcyclohexane, cycloheptane, methylcycloheptane, bicyclohexyl, decaline, toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, propylanisole, 1-ethylnaphthalene, 2-ethylnaphthalene, 2-ethylbiphenyl, octylbenzene, or any combination thereof.

The first solvent and the second solvent may be miscible solvents having different boiling points from each other.

In a related art, a quantum dot composition including quantum dots (such as both the first quantum dots and the second quantum dots) including charge-transporting ligands with different characteristics may be prepared by a method of mixing two dispersion solutions, after preparing a dispersion solution for each of dispersing the first quantum dots and the second quantum dots by using immiscible solvents (such as, for example, a hydrophilic solvent and a hydrophobic solvent). However, in this case, the quantum dot composition may have poor dispersibility because the quantum dot(s) having selectivity to a hydrophilic solvent or a hydrophobic solvent may be precipitated.

The quantum dot composition according to one or more embodiments, by using the solvents that are miscible with each other, may reduce a precipitation of the quantum dots during the preparation and storage of the quantum dot composition, thereby significantly improving the dispersibility of the quantum dot composition. In this regard, the quantum dot composition may be suitable for manufacturing a quantum dot emission layer of a light-emitting device by a soluble process.

In addition, because the first solvent and the second solvent have different boiling points from each other, when the quantum dot composition is used in the manufacture of a light-emitting device to be described hereinbelow, there is an advantage in that a double-layered emission layer may be formed by a single process of forming an emission layer by sequentially removing the solvents.

In one or more embodiments, a total amount of the first solvent and second solvent may be, based on the total weight of the quantum dot composition, in a range of about 80 wt % to about 99.9 wt %, for example about 85 wt % to about 97 wt %, but embodiments of the present disclosure are not limited thereto. Within these ranges, the quantum dots may be appropriately (or suitably) dispersed in the quantum dot composition and may have a suitable solid content composition for a soluble process.

In one or more embodiments, a volume ratio of the first solvent to the second solvent may be in a range of about 1:9 to about 9:1, for example, about 2:8 to about 8:2, and for example, about 3:7 to about 7:3, but embodiments of the present disclosure are not limited thereto.

In one or more embodiments, viscosity of the quantum dot composition may be, in the storage state, in a range of about 1 cP to about 10 cP, for example, about 2 cP to about 7 cP, but embodiments of the present disclosure are not limited thereto. The quantum dot composition having the viscosity within these ranges may be suitable for manufacturing a quantum dot emission layer of a light-emitting device by a soluble process. Any suitable method of measuring the viscosity in the art may be used, and for example, a rheometer (for example, a Brookfield DV-I Prime rheometer) may be used for the measurement.

In one or more embodiments, a surface tension of the quantum dot composition may be, at a temperature of 25° C., in a range of about 10 dynes/cm to about 40 dynes/cm, for example, about 25 dynes/cm to about 35 dynes/cm, but embodiments of the present disclosure are not limited thereto. The quantum dot composition having the surface tension within these ranges may be suitable for manufacturing a quantum dot emission layer of a light-emitting device by a soluble process. Any suitable method of measuring the surface tension in the art may be used, and for example, a tensiometer (for example, a bubble pressure tensiometer from SITA Process Solutions) may be used for the measurement.

In one or more embodiments, vapor pressure of the quantum dot composition may be, at a temperature of 25° C., in a range of about $10^{-5}$ mmHg to about $10^{-2}$ mmHg, but embodiments of the present disclosure are not limited thereto. The quantum dot composition having the vapor pressure within these ranges may be suitable for manufacturing a quantum dot emission layer of a light-emitting device by a soluble process.

In one or more embodiments, the quantum dot composition may further include a hole-transporting compound and/or an electron-transporting compound.

The hole-transporting compound may be the same as described in connection with a compound included in a hole transport region to be described hereinbelow, and the electron-transporting compound may be the same as described in connection with a compound included in an electron transport region to be described hereinbelow.

In the quantum dot composition, the amount of the hole-transporting compound or the electron-transporting compound may be, based on the total weight of the quantum dot composition, in a range of about 0.5 wt % to about 20 wt %, for example, about 0.5 wt % to about 15 wt %, but embodiments of the present disclosure are not limited thereto.

Additives

The quantum dot composition may further include an additive for the purpose of controlling an energy band level, controlling charge mobility, and/or improving coating uniformity.

The additive may include a dispersant, an adhesion promoter, a leveling agent, an antioxidant, an ultraviolet absorber, or any combination thereof.

For example, the quantum dot composition may further include a dispersant to improve the degree of dispersion of the first quantum dots and the second quantum dots.

The dispersant may be used to prevent or reduce the agglomeration of the quantum dots in the quantum dot composition, and to impart the role of a protective layer of the quantum dots during a soluble process.

The dispersant may include an anion-based polymer material, a cation-based polymer material, and/or a non-ionic-based polymer material.

An amount of the dispersant may be, per 100 parts by weight of the quantum dots, in a range of about 10 parts by weight to about 50 parts by weight, for example, about 15 parts by weight to about 30 parts by weight. When the amount of the dispersant is satisfied within these ranges, the agglomeration of the quantum dots may be substantially prevented or reduced, and the dispersant may serve as a protective layer for the quantum dots.

The adhesion promoter may include a silane coupling agent having a reactive substituent selected from a carboxyl group, a methacryloyl group, an isocyanate group, an epoxy group, and a combination thereof, which may each independently be added to increase adhesion to a substrate. However, embodiments of the present disclosure are not limited thereto. For example, the silane coupling agent may include trimethoxysilylbenzoic acid, γ-methacryloxypropyltrimethoxysilane, vinyltriacetoxysilane, vinyltrimethoxysilane, γ-isocyanatepropyltriethoxysilane, γ-glysidoxypropyltrimethoxysilane, β-(3,4-epoxycyclohexyl)ethyltrimethoxysilane, or any combination thereof.

The leveling agent may be added to improve coating properties of the quantum dot composition. The leveling agent may include, for example, a silicon-based compound, a fluorine-based compound, a siloxane-based compound, a nonionic surfactant, an ionic surfactant, a titanate coupling agent, and/or the like, but embodiments of the present disclosure are not limited thereto. For example, the leveling agent may include a silicon-based compound, a fluorine-based compound, or any combination thereof.

The silicon-based compound may be, although not particularly limited, dimethyl silicon, methyl silicon, phenyl silicon, methyl phenyl silicon, alkyl-modified silicon, alkoxy-modified silicon, polyether-modified silicon, and/or the like. For example, the silicon-based compound may be dimethyl silicon, methylphenyl silicon, and/or the like.

The fluorine-based compound may be, although not particularly limited, polytetrafluoroethylene, polyvinylidenfluoride, fluoroalkylmethacrylate, perfluoropolyether, perfluoroalkylethylene oxide, and/or the like. For example, the fluorine-based compound may be polytetrafluoroethylene.

The siloxane-based compound may be, although not particularly limited, a dimethyl siloxane compound (product name: KF96L-1, KF96L-5, KF96L-10, and KF96L-100 of Shin-Etsu Chemical Co., Ltd.).

The leveling agent may be used alone or in combination of two or more materials.

An amount of the leveling agent may vary depending on the desired performance, but may be, based on the total weight of the quantum dot composition, in a range of about 0.001 wt % to about 5 wt %, for example, about 0.001 wt % to about 1 wt %. When the amount of the leveling agent is satisfied within these ranges, the fluidity of the quantum dot composition and the film uniformity may be improved.

The quantum dot composition may be used to manufacture a light-emitting apparatus. Considering excellent inkjet ejection stability of the quantum dot composition, the quantum dot composition may be, for example, used for inkjet printing, but embodiments of the present disclosure are not limited thereto.

Method of Manufacturing Light-Emitting Device

One or more embodiments of the present disclosure provide a method of manufacturing a light-emitting device, the method including: providing a quantum dot composition on a first electrode, wherein the quantum dot composition includes a first solvent, a second solvent different from the first solvent, first quantum dots including a hole-transporting ligand, and second quantum dots including an electron-transporting ligand, wherein the first solvent and the second solvent are miscible solvents having different boiling points from each other, a degree of dispersion of the first quantum dots is greater in the first solvent than in the second solvent, and a degree of dispersion of the second quantum dots is greater in the second solvent than in the first solvent;

forming a first emission layer by removing a solvent having a lower boiling point among the first solvent and the second solvent;

forming a second emission layer by removing a solvent having a higher boiling point among the first solvent and the second solvent; and forming a second electrode on the second emission layer.

The quantum dot composition may be the same as described herein.

In the forming of the first emission layer and the second emission layer, the removing of the solvent may be performed by vacuum or heat, but embodiments of the present disclosure are not limited thereto.

In one or more embodiments, the boiling point of the first solvent may be lower than that of the second solvent. For example, at the same temperature, the vapor pressure of the first solvent may be greater than that of the second solvent. In this case, because the first solvent is removed before the second solvent, the first quantum dots having a greater degree of dispersion in the first solvent than in the second solvent may be precipitated first on a first electrode. Accordingly, a first emission layer including the first quantum dots (hereinafter also referred to as a first quantum dot-containing first emission layer) may be formed first on the first electrode. Next, the second solvent having a higher boiling point than the first solvent is removed to form a second emission layer including the second quantum dots (hereinafter also referred to as a second quantum dot-containing second emission layer). Therefore, on the first electrode, the first quantum dot-containing first emission layer and the second quantum dot-containing second emission layer may be sequentially formed in this stated order.

Here, the first quantum dot-containing first emission layer may have a maximum concentration of the first quantum dots, and the second quantum dot-containing second emission layer may have a maximum concentration of the second quantum dots. Although the first solvent and the second solvent are sequentially removed, the first and second emission layers may be prepared by a single process using one composition, rather than separate compositions. In this regard, the first quantum dot-containing first emission layer may further include a small amount of the second quantum dots and the second quantum dot-containing second emission layer may further include a small amount of the first quantum dots.

In one or more embodiments, the first electrode may be an anode, and the second electrode may be a cathode.

In one or more embodiments, the method of manufacturing the light-emitting device may further include: before the providing of the quantum dot composition on the first electrode, forming a hole transport region on the first electrode; and before the forming of the second electrode, forming an electron transport region on the second emission layer, wherein the first electrode may be an anode, and the second electrode may be a cathode. The light-emitting device thus manufactured may have a structure in which the first electrode (which is a hole injection electrode), the hole transport region, the first emission layer, the second emission layer, the electron transport region, and the second electrode (which is an electron injection electrode), are sequentially stacked in this stated order. For example, when the boiling point of the first solvent is lower than that of the second solvent, the first emission layer may be a first quantum dot-containing first emission layer, and the second emission layer may be a second quantum dot-containing second emission layer.

In one or more embodiments, the boiling point of the second solvent may be lower than that of the first solvent. For example, at the same temperature, the vapor pressure of the second solvent may be greater than that of the first solvent. In this case, because the second solvent is removed before the first solvent, the second quantum dots having a greater dispersion degree in the second solvent than in the first solvent may be precipitated first on a first electrode. Accordingly, a first emission layer including the second quantum dots (hereinafter also referred to as a second quantum dot-containing first emission layer) may be formed first on the first electrode. Next, the first solvent having a higher boiling point than the second solvent is removed to form a second emission layer including the first quantum dots (hereinafter also referred to as a first quantum dot-containing second emission layer). Therefore, the second quantum dot-containing first emission layer and the first quantum dot-containing second emission layer may be sequentially formed in this stated order on the first electrode.

Here, the second quantum dot-containing first emission layer may have a maximum concentration of the second quantum dots, and the first quantum dot-containing second emission layer may have a maximum concentration of the first quantum dots. Although the first solvent and the second solvent are sequentially removed, the first emission layer and the second emission layer are prepared in a single process using one composition, rather than separate compositions. In this regard, the second quantum dot-containing first emission layer may further include a small amount of the first quantum dots and the first quantum dot-containing second emission layer may further include a small amount of the second quantum dots.

In one or more embodiments, the first electrode may be a cathode, and the second electrode may be an anode.

In one or more embodiments, the method of manufacturing the light-emitting device may further include: before the providing of the quantum dot composition on the first electrode, forming an electron transport region on the first electrode; and before the forming of the second electrode, forming a hole transport region on the second emission layer, wherein the first electrode may be a cathode, and the second electrode may be an anode. The light-emitting device thus manufactured may have a structure in which the first electrode (which is an electron injection electrode), the electron transport region, the first emission layer, the second emission layer, the hole transport region, and the second electrode (which is a hole injection electrode), are sequentially stacked in this stated order. For example, when the boiling point of the second solvent is lower than that of the first solvent, the first emission layer may be a second quantum dot-containing first emission layer, and the second emission layer may be a first quantum dot-containing second emission layer.

As such, when the first electrode is an anode (which is a hole injection electrode), and the second electrode is a cathode (which is an electron injection electrode), a solvent having a lower boiling point than that of the second solvent may be selected as the first solvent so that the first quantum dots are arranged on a bottom side (i.e., a side closer to the first electrode). However, when the first electrode is a cathode (which is an electron injection electrode), and the second electrode is an anode (which is a hole injection electrode), a solvent having a lower boiling point than that of the first solvent may be selected as the second solvent so that the second quantum dots are arranged on a bottom side (i.e., a side closer to the first electrode). As described above, according to one or more embodiments of the present disclosure, by selecting the first solvent and the second solvent having different boiling points from each other, a light-emitting device having a conventional structure or an inverted structure may be manufactured.

The quantum dot composition may be provided on the first electrode by a soluble process, but embodiments of the present disclosure are not limited thereto.

The soluble process may include an inkjet printing process, a spin coating process, a slit coating process, a drop casting process, a casting process, a gravure coating process, a bar coating process, a roll coating process, a dip coating process, a spray coating process, a screen coating process, a flexographic printing process, an offset printing process, and/or a nozzle printing process, but embodiments of the present disclosure are not limited thereto.

In one or more embodiments, the soluble process may be performed by an inkjet printing method, but embodiments of the present disclosure are not limited thereto. For example, the quantum dot composition may be provided in the form of microdroplets on the first electrode by an inkjet printing method.

The quantum dot composition has excellent (or suitable) inkjet ejection stability, and thus may be suitably used for an inkjet printing method.

For the inkjet printing method, an inkjet printer having an inkjet head equipped with a piezo-type (or kind) nozzle applying pressure according to a voltage may be used.

For example, the quantum dot composition may be ejected from a nozzle of an inkjet head.

Here, an ejection amount of the quantum dot from a nozzle of an inkjet head composition may be in a range of about 1 pL per once to about 50 pL per once, for example, about 1 pL per once to about 30 pL per once, and for example, about 1 pL per once to about 20 pL per once.

To minimize or reduce clogging of the nozzle and improve ejection precision, an aperture diameter of the inkjet head may be in a range of about 5 μm to about 50 μm, for example, about 10 μm to about 30 μm, but embodiments of the present disclosure are not limited thereto.

An ejection pressure of the inkjet head may be, based on the shear rate, in a range of about 1,000 $s^{-1}$ to about 10,000 $s^{-1}$, but embodiments of the present disclosure are not limited thereto.

The temperature at the time of forming a coating film is not particularly limited. However, in consideration of suppression or reduction of crystallization of materials included in the quantum dot composition, the temperature may be in a range of about 10° C. to about 50° C., for example, about 15° C. to about 40° C., for example, about 15° C. to about 30° C., and for example, about 20° C. to about 25° C.

Light-Emitting Device

The light-emitting device manufactured using the quantum dot composition according to one or more of the present embodiments may include: the first electrode; the second electrode facing the first electrode; and the first emission layer and the second emission layer that are arranged between the first electrode and the second electrode.

One of the first emission layer and the second emission layer may include the first quantum dots, and the other of the first emission layer and the second emission layer may include the second quantum dots. For example, one of the first emission layer and the second emission layer may have a maximum concentration of the first quantum dots, and the other of the first emission layer and the second emission layer may have a maximum concentration of the second quantum dots. Because the first emission layer and the second emission layer are prepared by a single process using the quantum dot composition, even when the first emission layer has a maximum concentration of the first quantum dots, the first emission layer may further include a small amount of the second quantum dots. Likewise, even when the second emission layer has a maximum concentration of the second quantum dots, the second emission layer may further include a small amount of the first quantum dots.

In one or more embodiments, the second emission layer may be arranged between the first emission layer and the second electrode.

In one or more embodiments, the first emission layer may be in direct contact with the second emission layer. For example, one surface of the first emission layer and one surface of the second emission layer may be in contact with each other.

In one or more embodiments, the first emission layer and the second emission layer may have different electrical characteristics from each other. In one or more embodiments, the first emission layer may have hole transport characteristics, and the second emission layer may have electron transport characteristics. In one or more embodiments, the first emission layer may have strong electron transport characteristics, and the second emission layer may have strong hole transport characteristics.

A total thickness of the emission layers may be in a range of about 7 nm to about 100 nm, for example, about 10 nm to about 30 nm. Within these ranges, the light-emitting device may have excellent (or improved) emission efficiency and/or lifespan properties due to the control (or substantial control) of pores that may be generated by quantum dot particle arrangement.

In one or more embodiments, both the first emission layer and the second emission layer may emit first light belonging to a predetermined (or set) wavelength region. For example, the first light may belong to one of a first wavelength region between 430 nm and 480 nm, a second wavelength region between 520 nm and 570 nm, or a third wavelength region between 600 nm and 650 nm.

In one or more embodiments, the first emission layer and the second emission layer may emit light having different wavelengths from each other. In this case, the light-emitting device may emit light obtained by mixing light emitted from the first emission layer and light emitted from the second emission layer.

In one or more embodiments, in the light-emitting device, the first electrode may be an anode, and the second electrode may be a cathode. The light-emitting device may further include a hole transport region between the first electrode and the emission layer, and an electron transport region between the emission layer and the second electrode, wherein the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

When the light-emitting device is a full color light-emitting device, the emission layer may include an emission layer that is to emit light of different color for each subpixel.

In one or more embodiments, the emission layer may be patterned, for each subpixel, as a first color emission layer, a second color emission layer, and a third color emission layer. Here, at least one emission layer of the first color emission layer, the second color emission layer, or the third color emission layer may essentially include the first and second emission layers including the quantum dots. For example, the first color emission layer may include the first and second emission layers including the quantum dots, and the second color emission layer and the third color emission layer may each be an organic emission layer including an organic compound. Here, the first color through the third color are different colors, and more particularly, the first color through the third color (e.g., the first color, the second color, and the third color) may have different maximum emission wavelengths from each other. The first color through the third color may be white when combined with each other.

In one or more embodiments, the emission layer may further include a fourth color emission layer, and at least one emission layer among the first color emission layer through the fourth color emission layer may be the first and second emission layers including the quantum dots, and the other emission layers may be organic emission layers each including an organic compound. As such, the emission layer may have various suitable modifications. In this regard, the first color through the fourth color (e.g., the first color, the second color, the third color, and the fourth color) may be different colors, and for example, the first color through the fourth color may have different maximum emission wavelengths from each other. The first color through the fourth color may be white when combined with each other.

The emission layer may further include, in addition to the quantum dots, at least one of an organic compound or a semiconductor compound, but compounds to be included in the emission layer are not limited thereto.

In one or more embodiments, the organic compound may include a host and a dopant. The host and the dopant may each be understood by referring to the related description to be presented hereinbelow.

Description of FIG. 1

FIG. 1 is a schematic view of a light-emitting device 10 manufactured using a quantum dot composition according to one or more embodiments. The light-emitting device 10 includes a first electrode 110, an interlayer 150, and a second electrode 190, and the interlayer 150 includes a first emission layer 130 and a second emission layer 140.

Hereinafter, a structure of the light-emitting device 10 and a manufacturing method thereof will be described with reference to FIG. 1.

First Electrode 110

In FIG. 1, a substrate may be additionally arranged under the first electrode 110 or above the second electrode 190. As the substrate, a glass substrate and/or a plastic substrate may be used. In one or more embodiments, the substrate may be a flexible substrate, and may include plastics with excellent (or suitable) heat resistance and/or durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, the material for forming the first electrode 110 may be a high work function material that facilitates injection of holes.

The first electrode 110 may be a reflective electrode, a semi-transmissive electrode, or a transmissive electrode. In one or more embodiments, when the first electrode 110 is a transmissive electrode, the material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, the material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure including or consisting of a single layer or a multi-layered structure including a plurality of layers. For example, the first electrode 110 may have a three-layered structure of ITO/Ag/ITO.

Interlayer 150

The interlayer 150 is arranged on the first electrode 110. The interlayer 150 includes a first emission layer 130 and a second emission layer 140.

The interlayer 150 may further include a hole transport region between the first electrode 110 and the first emission layer 130 and an electron transport region between the second emission layer 140 and the second electrode 190.

Hole Transport Region in Interlayer 150

The hole transport region may have: i) a single-layered structure including or consisting of a single layer including or consisting of a single material, ii) a single-layered structure including or consisting of a single layer including or consisting of a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially on the first electrode 110.

The hole transport region may include a compound represented by Formula 201, a compound represented by Formula 202, or any combination thereof:

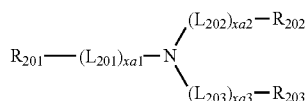

Formula 201

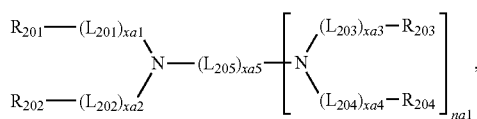

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (see e.g., Compound HT16 and/or the like), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one of groups represented by Formulae CY201 to CY217:

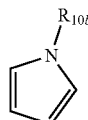

CY201

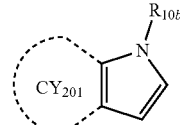

CY202

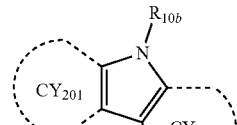

CY203

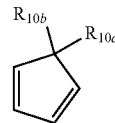

CY204

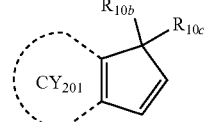

CY205

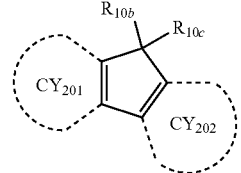

CY206

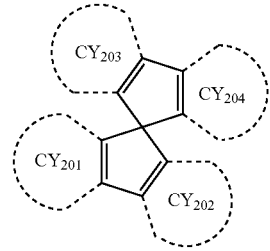

CY207

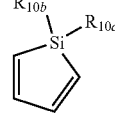

CY208

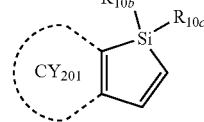

CY209

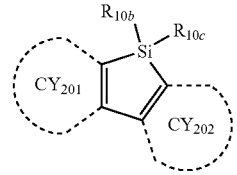

CY210

-continued

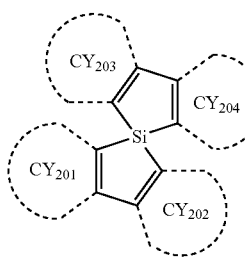
CY211

CY212

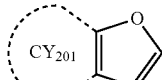
CY213

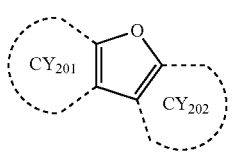
CY214

CY215

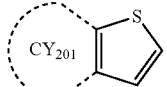
CY216

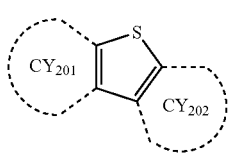
CY217 wherein, in Formulae CY201 to CY217, $R_{10b}$ and $R_{10c}$ may each be the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with at least one $R_{10a}$.

In one or more embodiments, ring CY201 to ring CY204 in Formulae CY201 to CY217 may each independently be a benzene group, a naphthalene group, a phenanthrene group, or an anthracene group.

In one or more embodiments, each of Formulae 201 and 202 may include at least one of groups represented by Formulae CY201 to CY203.

In one or more embodiments, Formula 201 may include at least one of the groups represented by Formulae CY201 to CY203 and at least one of groups represented by Formulae CY204 to CY217.

In one or more embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include a group represented by one of Formulae CY201 to CY203.

In one or more embodiments, each of Formulae 201 and 202 may not include a group represented by one of Formulae CY201 to CY203, and may include at least one of groups represented by Formulae CY204 to CY217.

In one or more embodiments, each of Formulae 201 and 202 may not include a group represented by one of Formulae CY201 to CY217.

For example, the hole transport region may be selected from Compounds HT1 to HT44, m-MTDATA, TDATA, 2-TNATA, NPB(NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), and any combinations thereof:

HT1

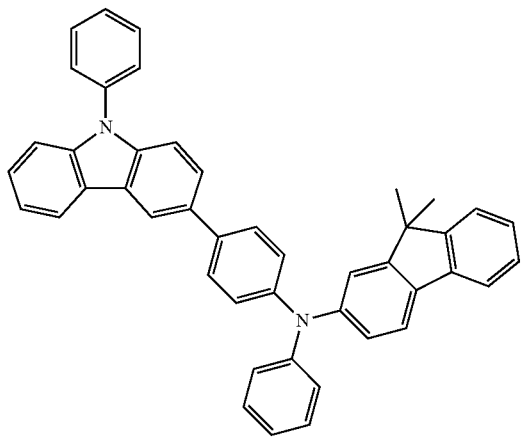

HT2

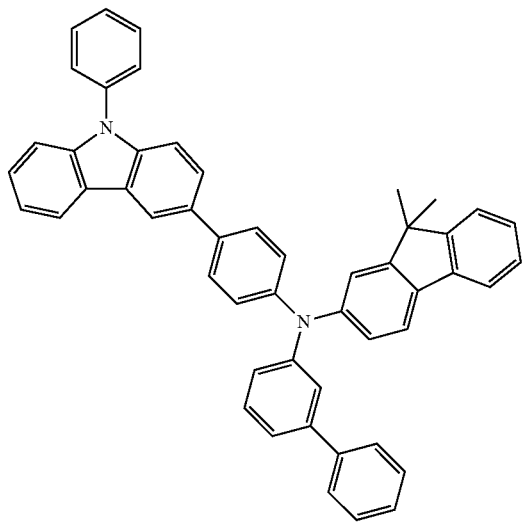

-continued
HT3
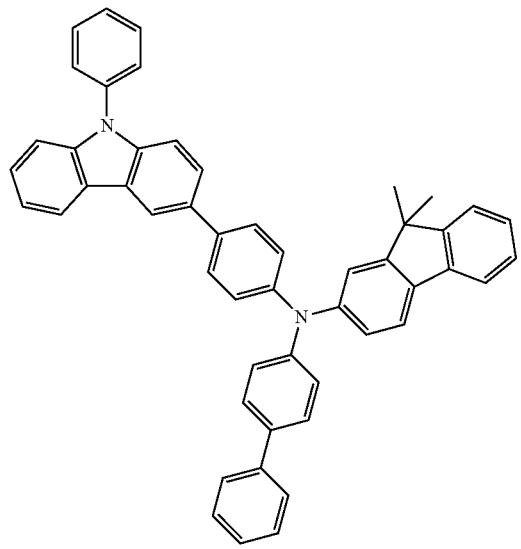
HT4
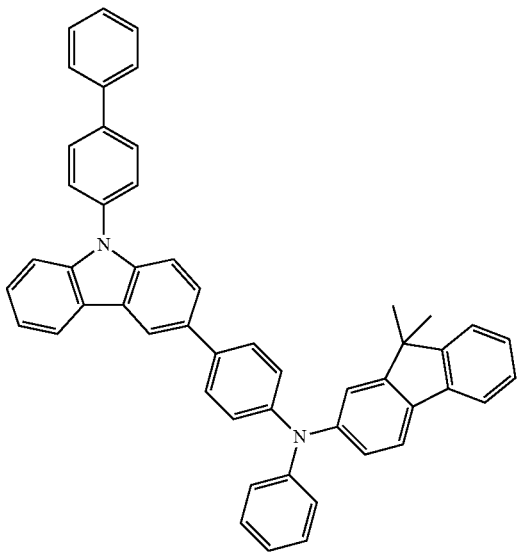
HT5
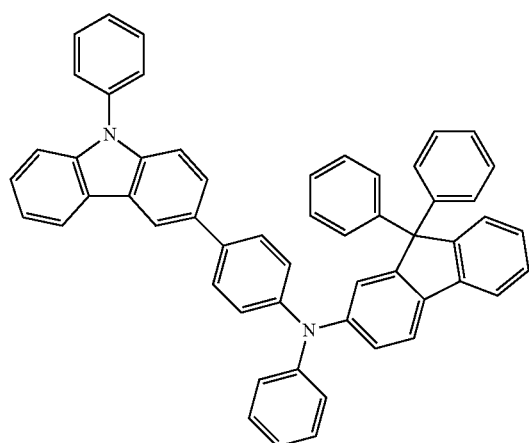
HT6
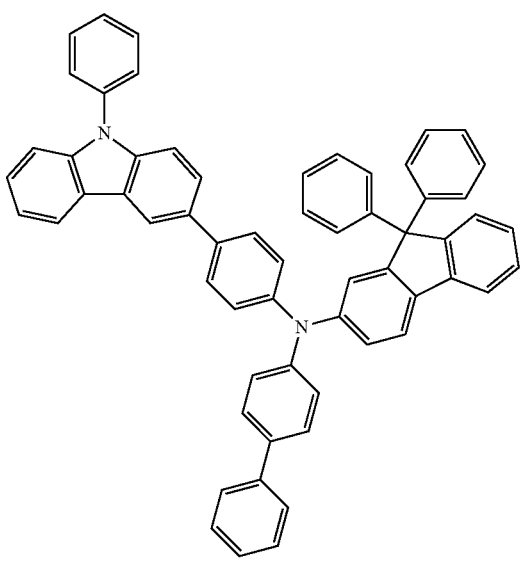

-continued
HT7
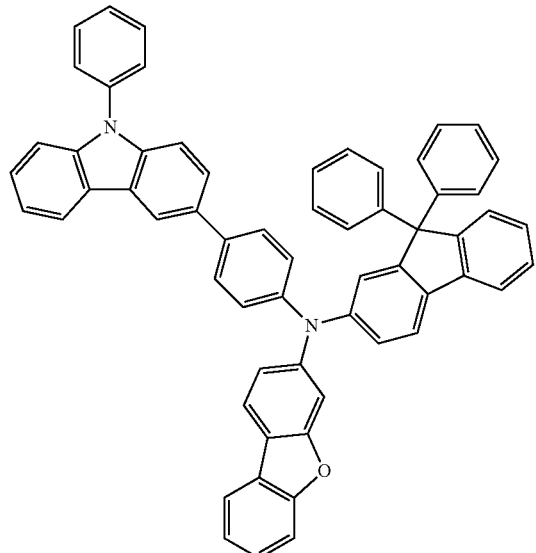
HT8
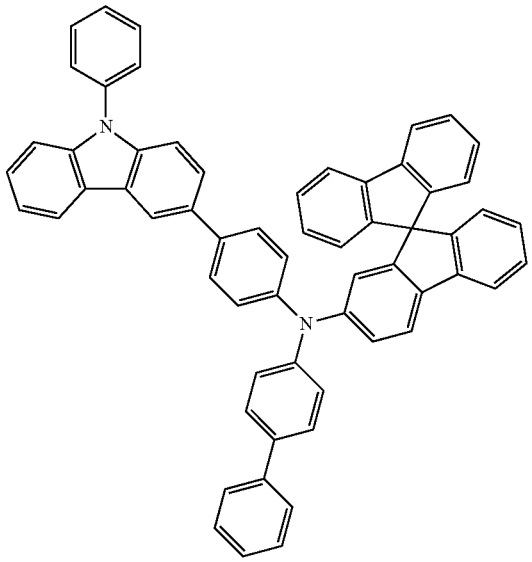
HT9
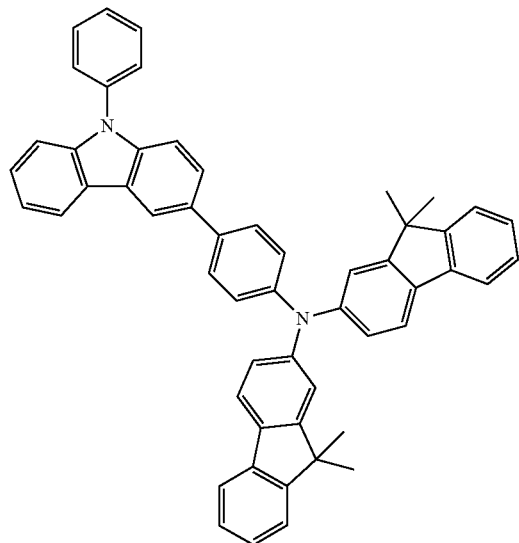
HT10
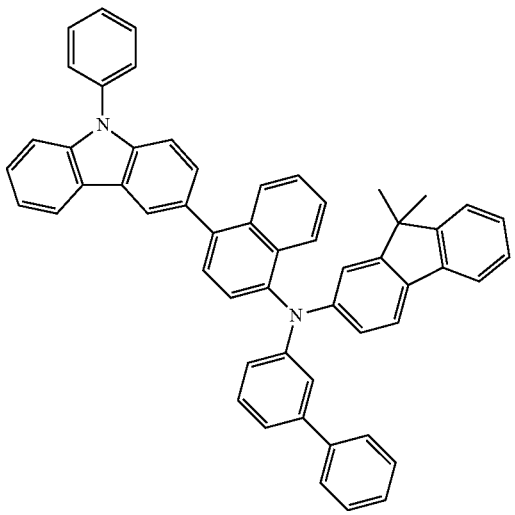
HT11
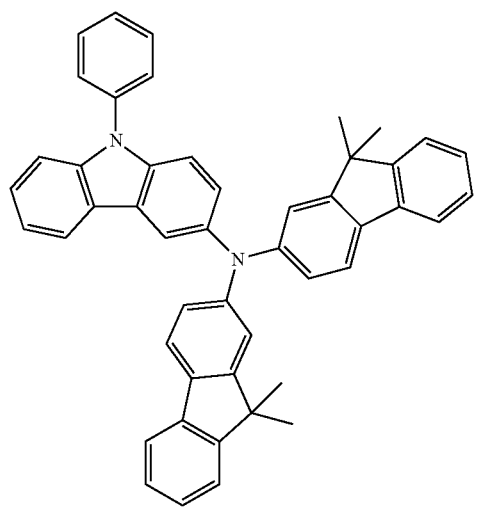
HT12
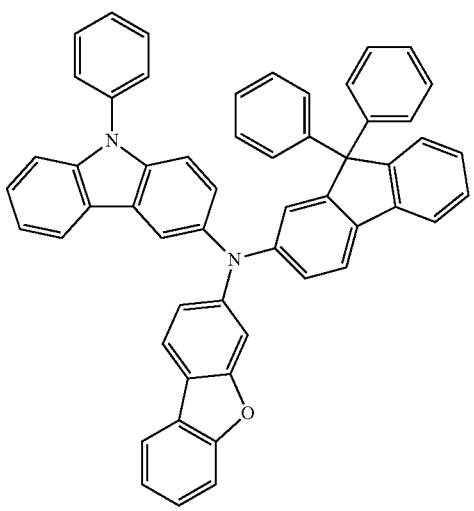

-continued
HT13
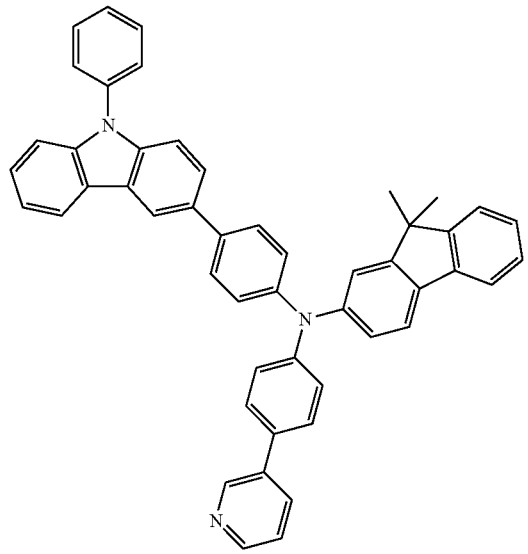
HT14
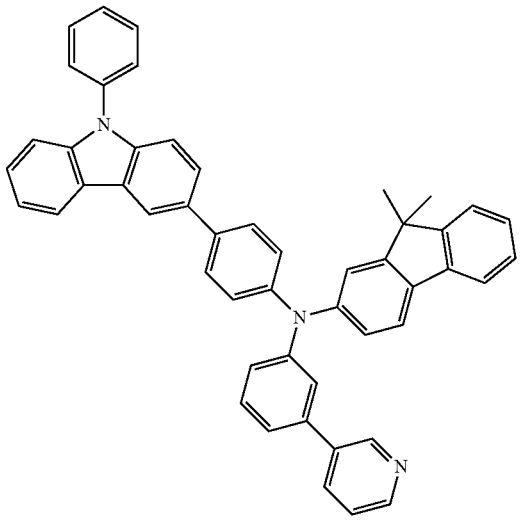
HT15
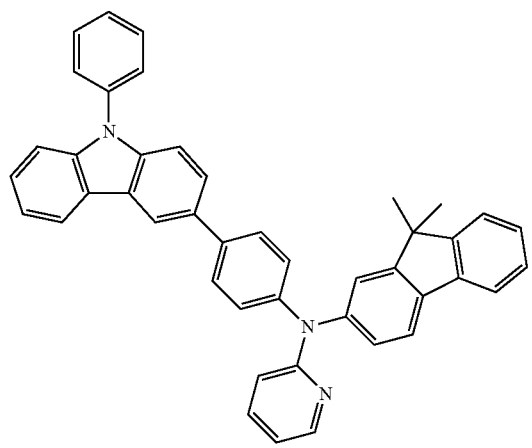
HT16
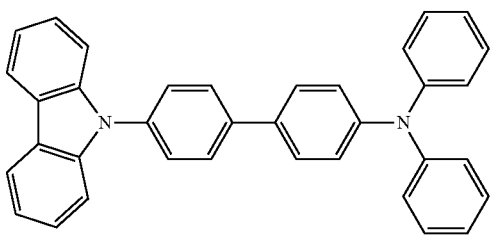
HT17
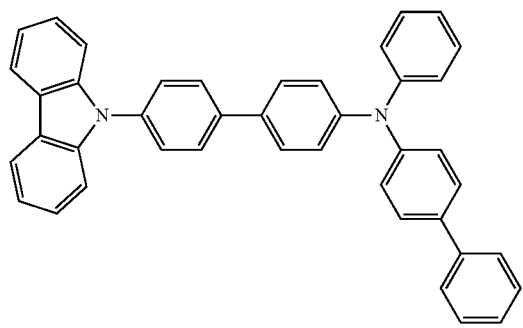
HT18
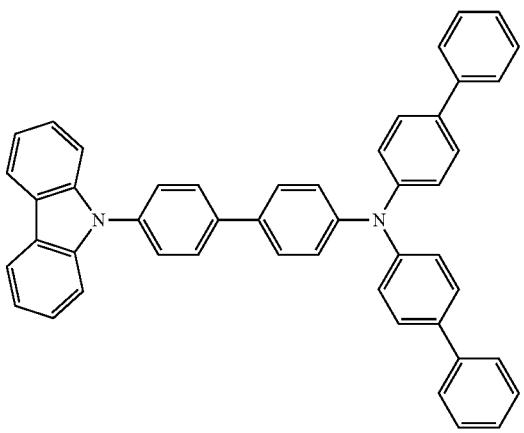

-continued
HT19
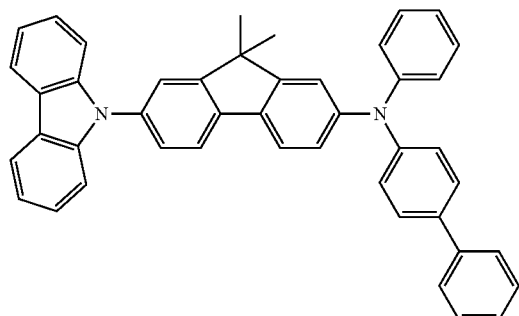
HT20
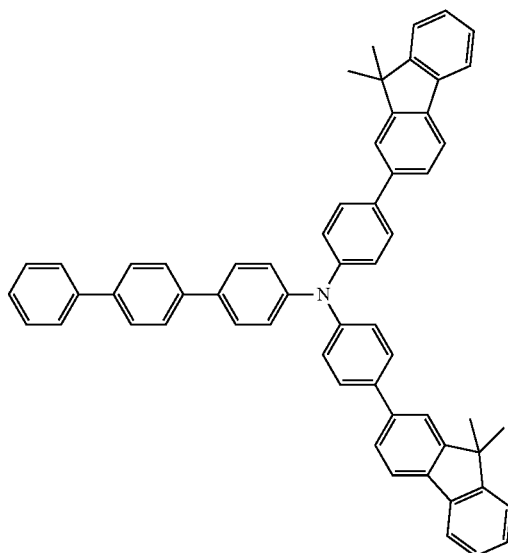
HT21
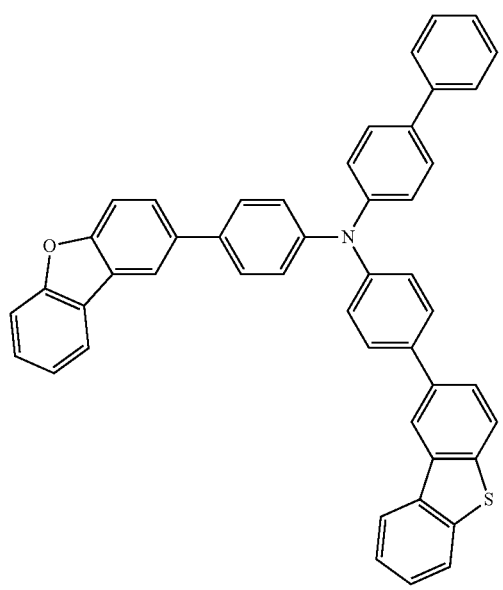
HT22
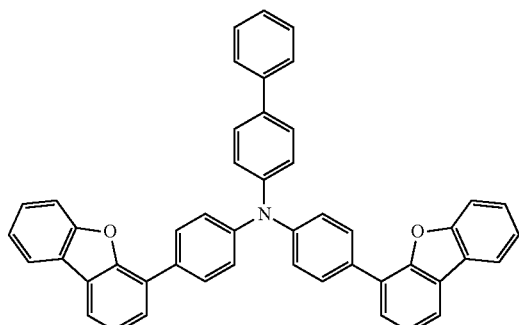
HT23
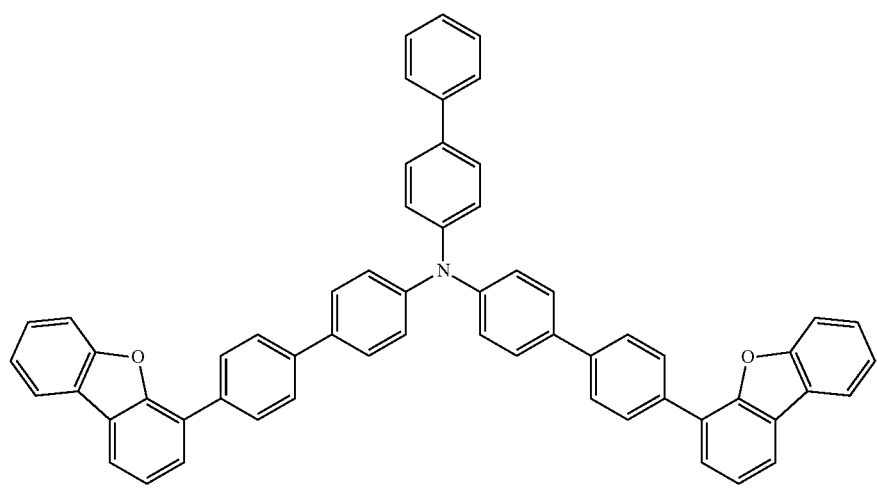

-continued
HT24
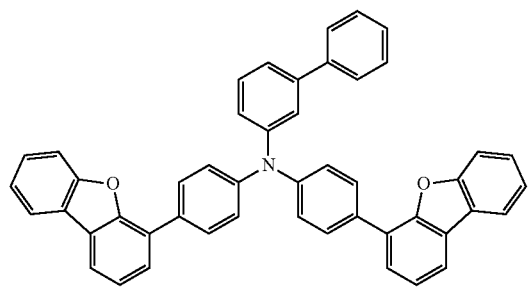
HT25
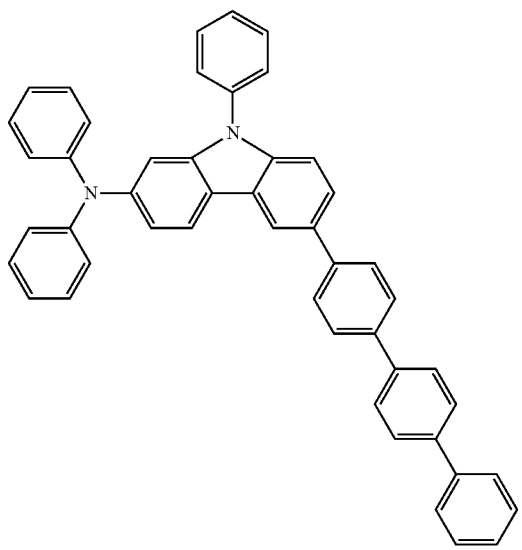
HT26
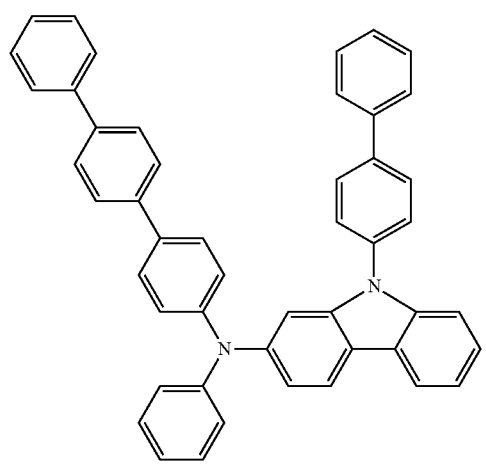
HT27
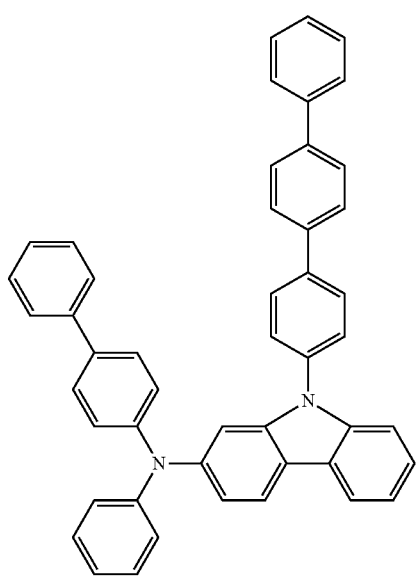
HT28
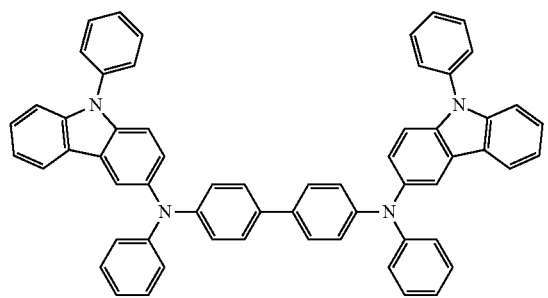
HT29
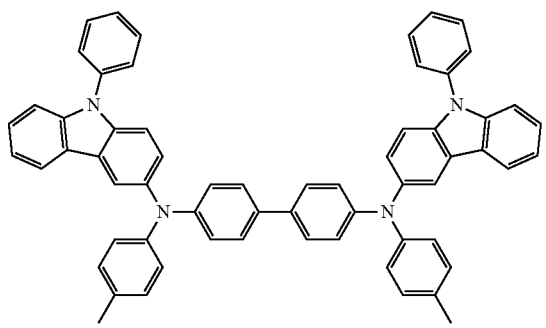

-continued
HT30
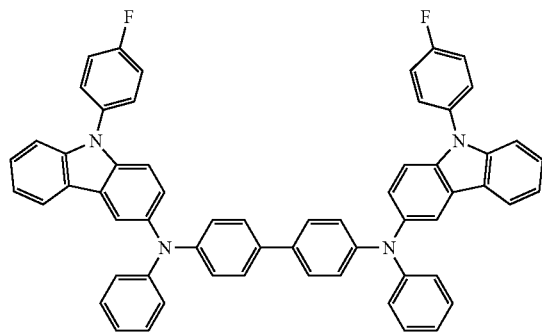
HT31
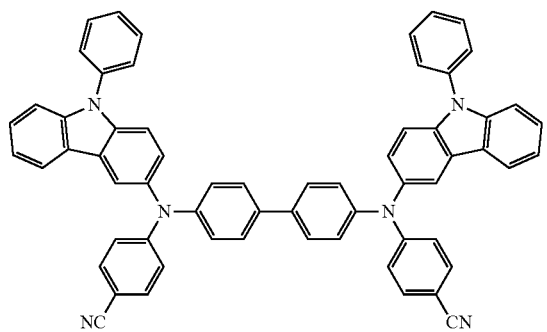
HT32
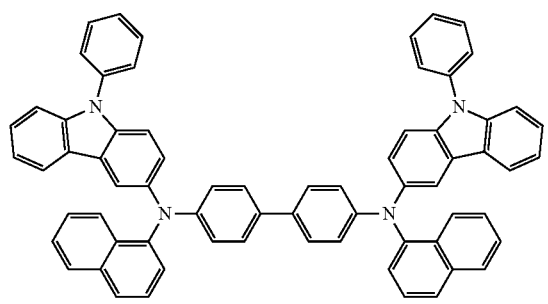
HT33
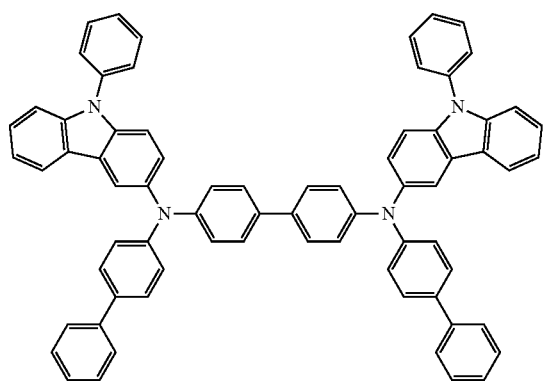
HT34
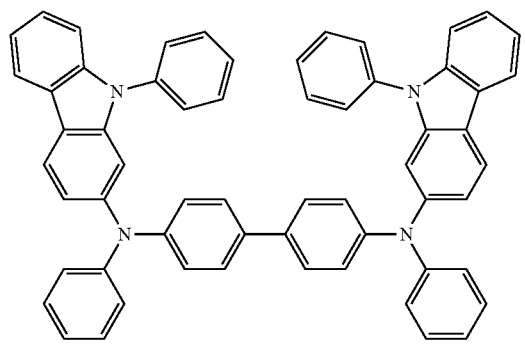
HT35
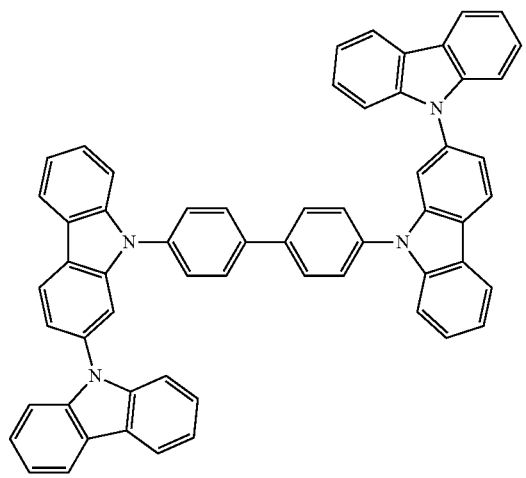

HT36
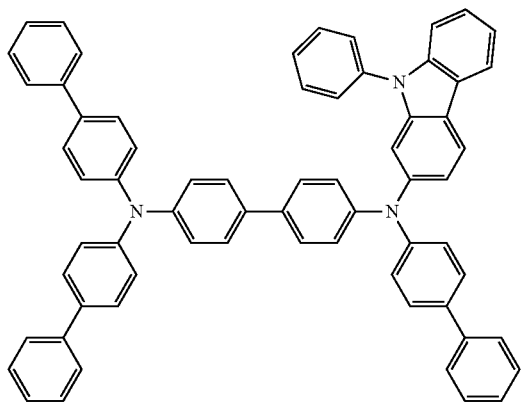
HT37
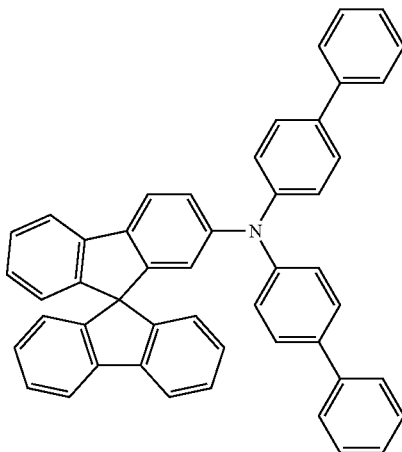
HT38
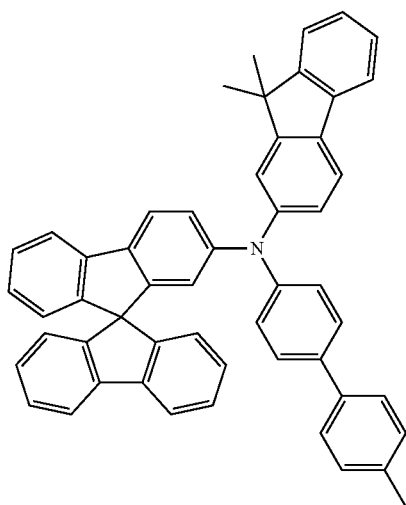
HT39
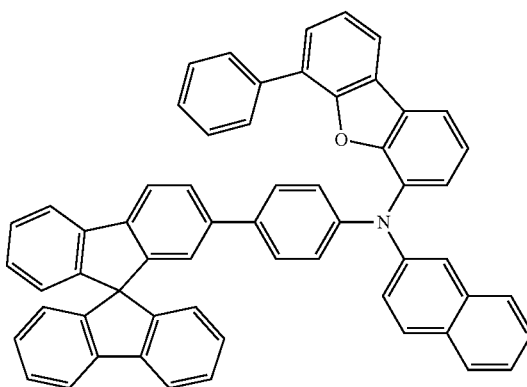
HT40
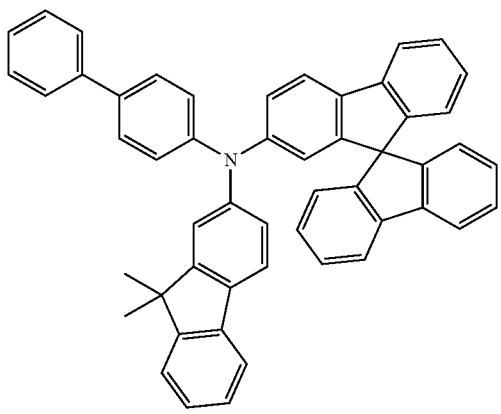
HT41
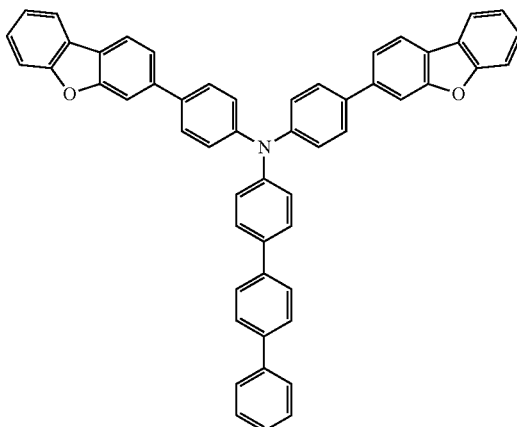

-continued
HT42
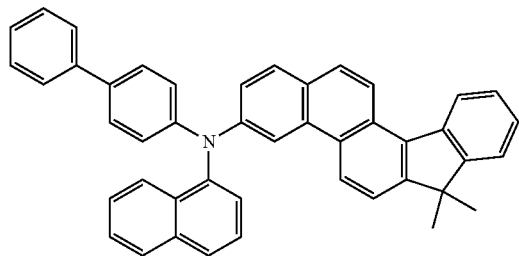
HT43
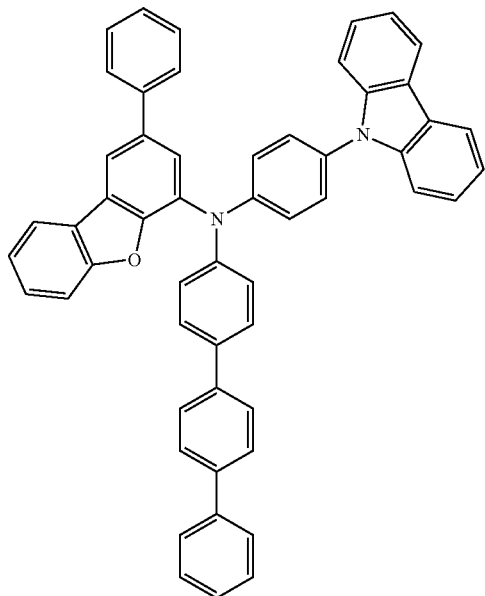
HT44
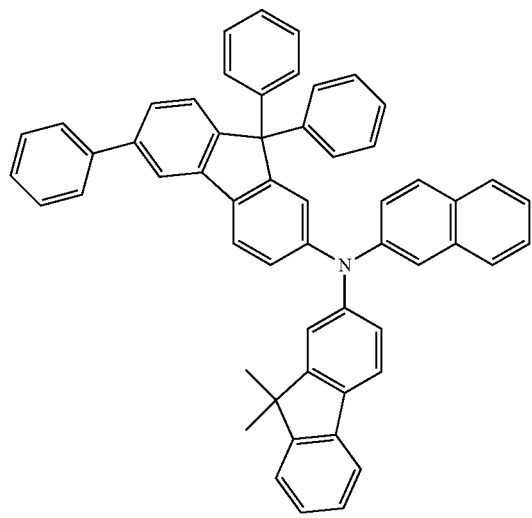

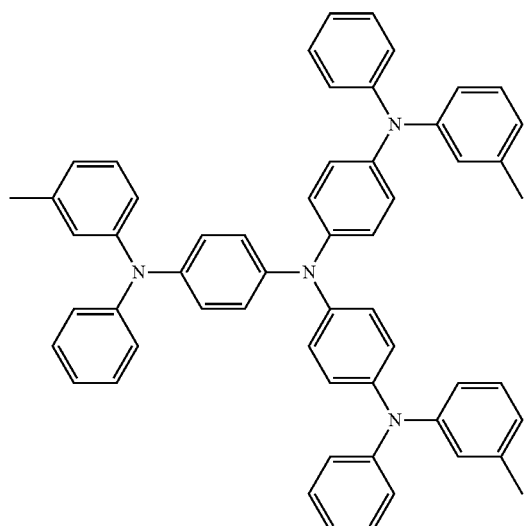
m-MTDATA
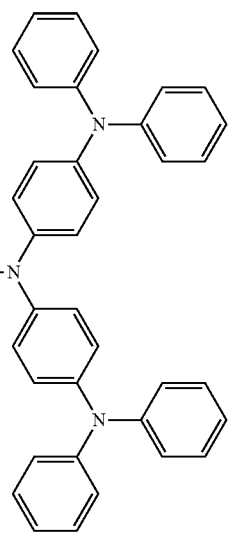
TDATA
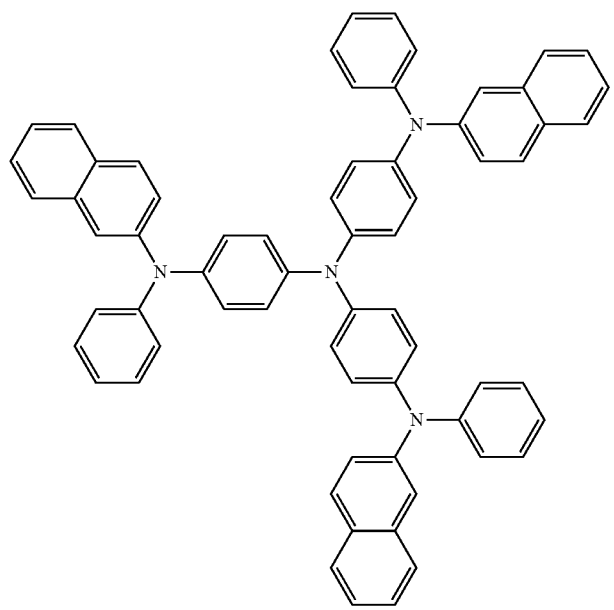
2-TNATA
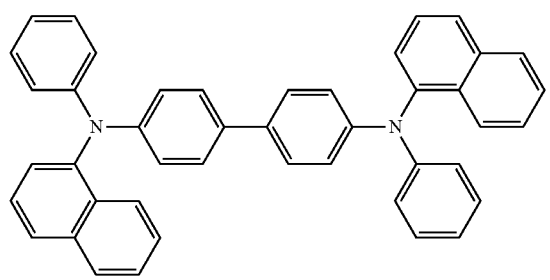
NPB

-continued
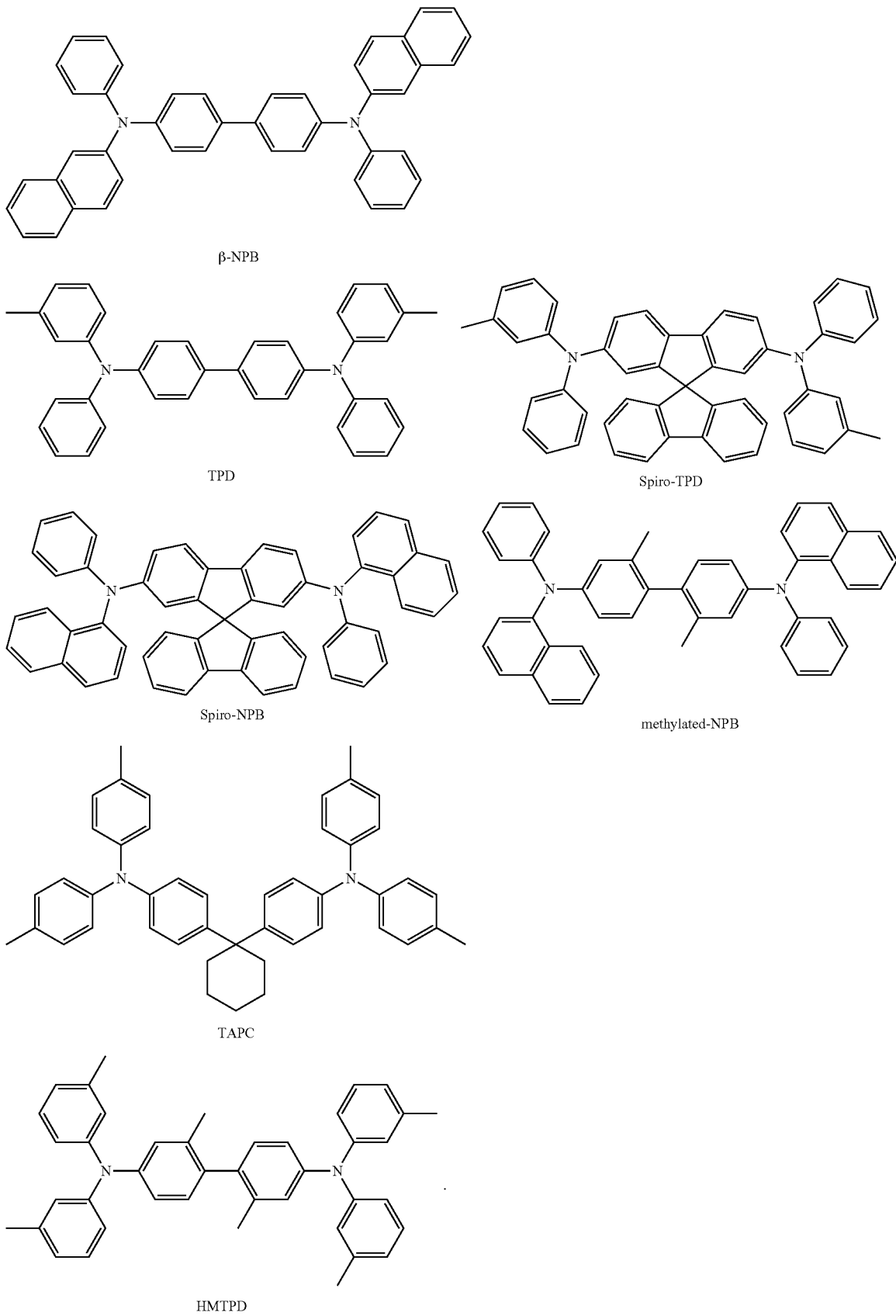

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory (or suitable) hole transporting characteristics may be obtained without a substantial increase in driving voltage.

The emission auxiliary layer may increase light-emission efficiency by compensating for an optical resonance distance according to the wavelength of light emitted by the emission layers 130 and 140, and the electron blocking layer may block or reduce the flow of electrons from the electron transport region. The emission auxiliary layer and the electron blocking layer may include any of the materials described above.

p-Dopant

The hole transport region may further include, in addition to the materials described above, a charge-generation material for the improvement of conductive properties. The charge-generation material may be uniformly or non-uniformly dispersed in the hole transport region (for example, in the form of a single layer including or consisting of a charge-generation material).

The charge-generation material may be, for example, a p-dopant.

For example, a lowest unoccupied molecular orbital (LUMO) energy level of the p-dopant may be equal to or less than about −3.5 eV.

In one or more embodiments, the p-dopant may include a quinone derivative, a cyano group-containing compound, a compound containing element EL1 and element EL2, or any combination thereof.

Non-limiting examples of the quinone derivative are TCNQ, F4-TCNQ, and/or the like.

Non-limiting examples of the cyano group-containing compound are HAT-CN, a compound represented by Formula 221, and/or the like:

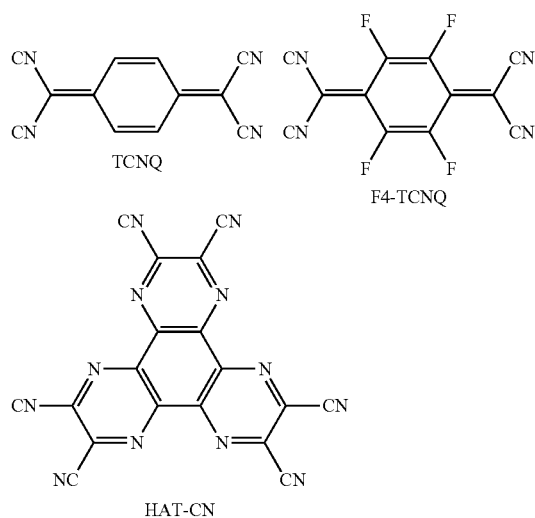

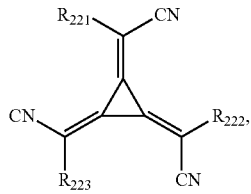

Formula 221 wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one selected from $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be metal, metalloid, or a combination thereof, and element EL2 may be non-metal, metalloid, or a combination thereof.

Examples of the metal are: alkali metal (for example, lithium (Li), sodium (Na), potassium (K), rubidium (Rb), cesium (Cs), etc.); alkaline earth metal (for example, beryllium (Be), magnesium (Mg), calcium (Ca), strontium (Sr), barium (Ba), etc.); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); post-transition metal (for example, zinc (Zn), indium (In), tin (Sn), etc.); and/or lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid are silicon (Si), antimony (Sb), and/or tellurium (Te).

Examples of the non-metal are oxygen (O) and/or halogen (for example, F, Cl, Br, I, etc.).

Examples of the compound containing element EL1 and element EL2 are metal oxide, metal halide (for example, metal fluoride, metal chloride, metal bromide, and/or metal iodide), metalloid halide (for example, metalloid fluoride, metalloid chloride, metalloid bromide, and/or metalloid iodide), metal telluride, or any combination thereof.

Examples of the metal oxide are tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and/or rhenium oxide (for example, $ReO_3$, etc.).

Examples of the metal halide are alkali metal halide, alkaline earth metal halide, transition metal halide, post-transition metal halide, and/or lanthanide metal halide.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, and/or CsI.

Examples of the alkaline earth metal halide are $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and/or $BaI_2$.

Examples of the transition metal halide are titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbC_{13}$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrC_{13}$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, $CuF$, $CuCl$, $CuBr$, $CuI$, etc.), silver halide (for example, $AgF$, $AgCl$, $AgBr$, $AgI$, etc.), and/or gold halide (for example, $AuF$, $AuCl$, $AuBr$, $AuI$, etc.).

Examples of the post-transition metal halide are zinc halide (for example, $ZnF_2$, $ZnCl_2$, $ZnBr_2$, $ZnI_2$, etc.), indium halide (for example, $InI_3$, etc.), and/or tin halide (for example, $SnI_2$, etc.).

Examples of the lanthanide metal halide are $YbF$, $YbF_2$, $YbF_3$, $SmF_3$, $YbCl$, $YbCl_2$, $YbCl_3$ $SmCl_3$, $YbBr$, $YbBr_2$, $YbBr_3$ $SmBr_3$, $YbI$, $YbI_2$, $YbI_3$, and/or $SmI_3$.

An example of the metalloid halide is antimony halide (for example, $SbCl_5$, etc.).

Examples of the metal telluride are alkali metal telluride (for example, $Li_2Te$, $Na_2Te$, $K_2Te$, $Rb_2Te$, $Cs_2Te$, etc.), alkaline earth metal telluride (for example, $BeTe$, $MgTe$, $CaTe$, $SrTe$, $BaTe$, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, $MnTe$, $TcTe$, $ReTe$, $FeTe$, $RuTe$, $OsTe$, $CoTe$, $RhTe$, $IrTe$, $NiTe$, $PdTe$, $PtTe$, $Cu_2Te$, $CuTe$, $Ag_2Te$, $AgTe$, $Au_2Te$, etc.), post-transition metal telluride (for example, $ZnTe$, etc.), and/or lanthanide metal telluride (for example, $LaTe$, $CeTe$, $PrTe$, $NdTe$, $PmTe$, $EuTe$, $GdTe$, $TbTe$, $DyTe$, $HoTe$, $ErTe$, $TmTe$, $YbTe$, $LuTe$, etc.).

Emission Layers 130 and 140 in Interlayer 150

The emission layer 150 may include the first emission layer 130 and the second emission layer 140. The first emission layer 130 and the second emission layer 140 may each be the same as described herein.

The first emission layer 130 may include first quantum dots 131, and the second emission layer 140 may include second quantum dots 141. The first quantum dots 131 and the second quantum dots 141 may each be the same as described herein.

The first emission layer 130 may be in direct contact with the second emission layer 140.

Host

In one or more embodiments, the host may include a compound represented by Formula 301:

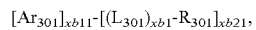

Formula 301 wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each be the same as described in connection with $Q_1$.

For example, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or any combination thereof:

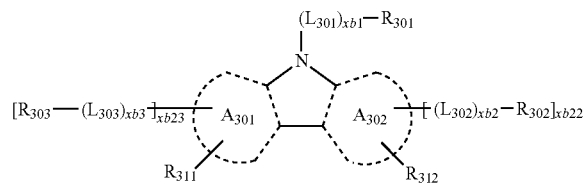

Formula 301-1

Formula 301-2

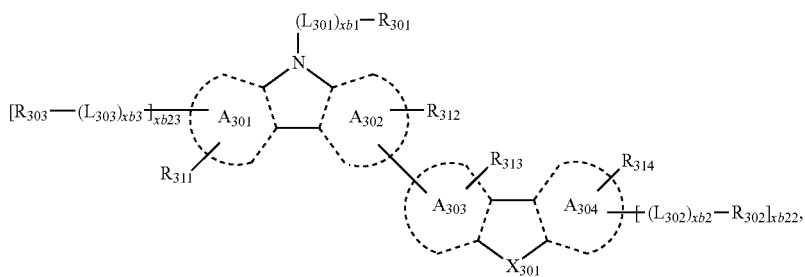

wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ may each be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each be the same as described in connection with $R_{301}$.

In one or more embodiments, the host may include an alkaline earth-metal complex. In one or more embodiments, the host may include a Be complex (for example, Compound H55), an Mg complex, a Zn complex, or any combination thereof.

In one or more embodiments, the host may include any of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

H1

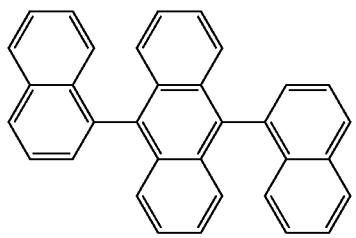

H2

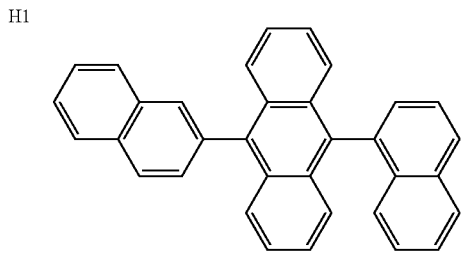

H3

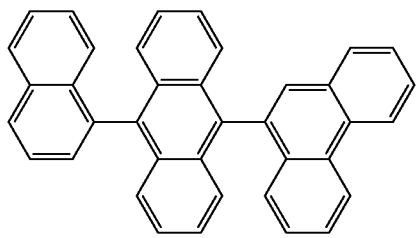

H4

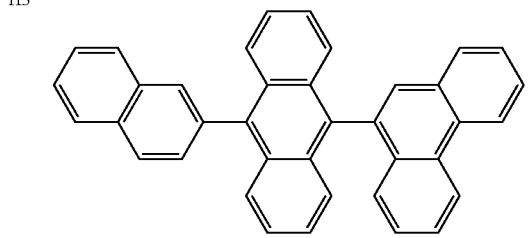

H5

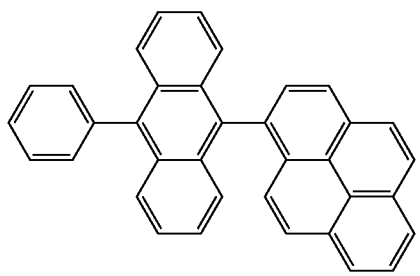

H6

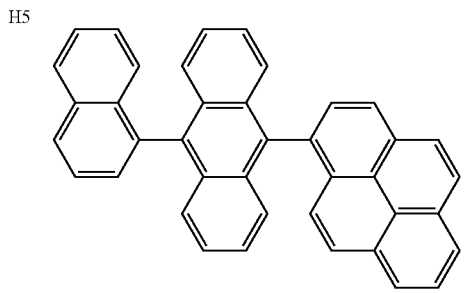

-continued
H7
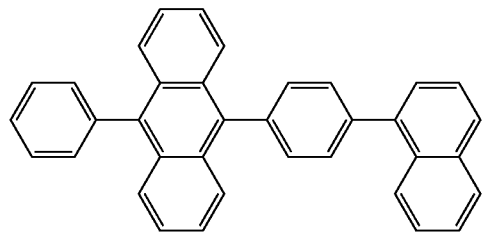
H8
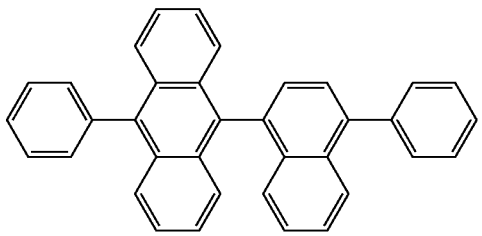
H9
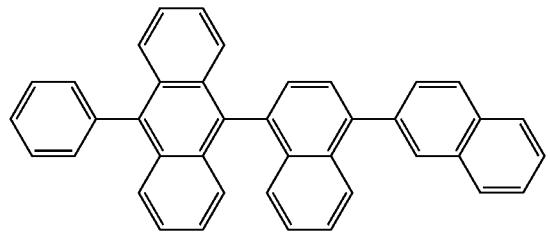
H10
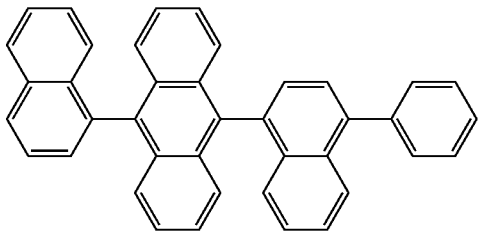
H11
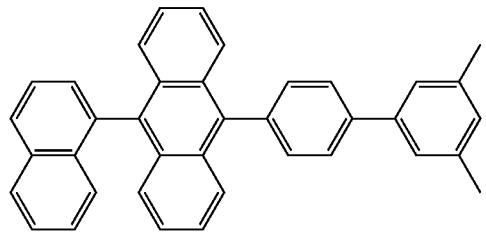
H12
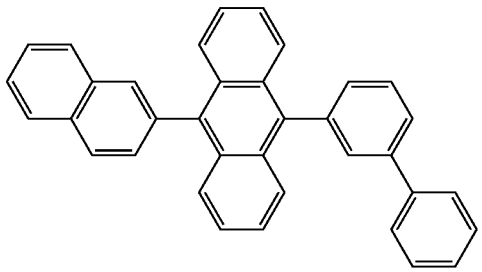
H13
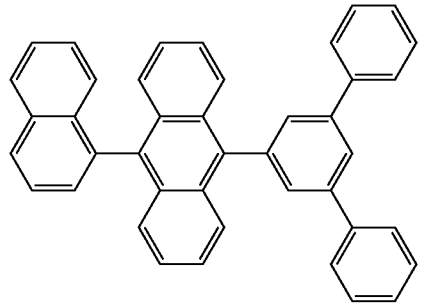
H14
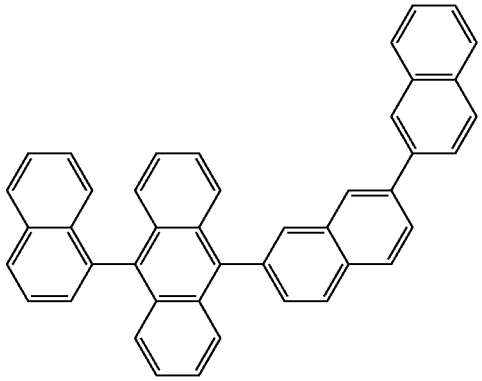
H15
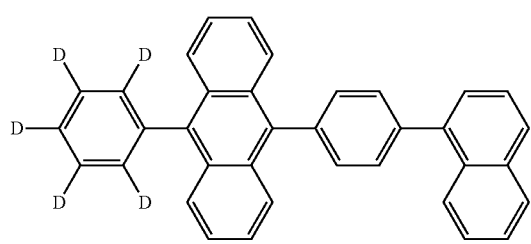
H16
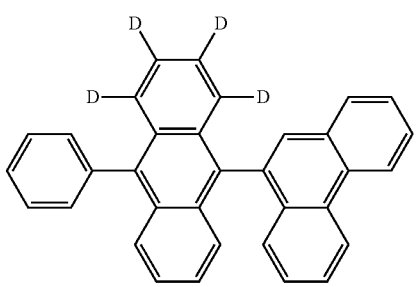

-continued
H17
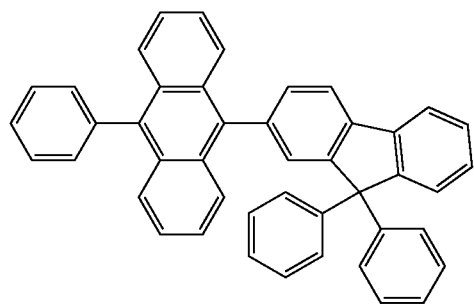
H18
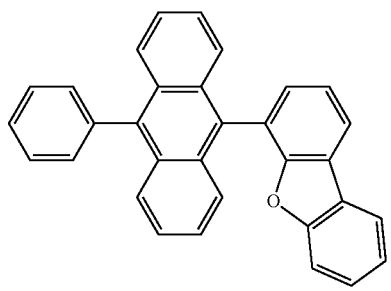
H19
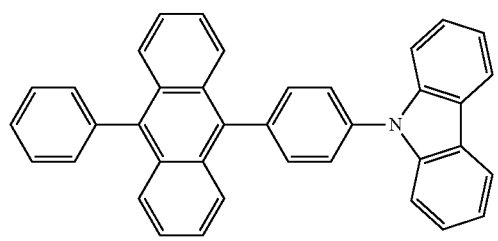
H20
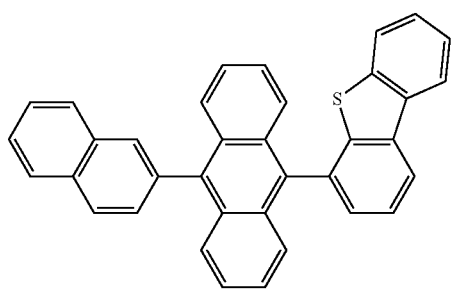
H21
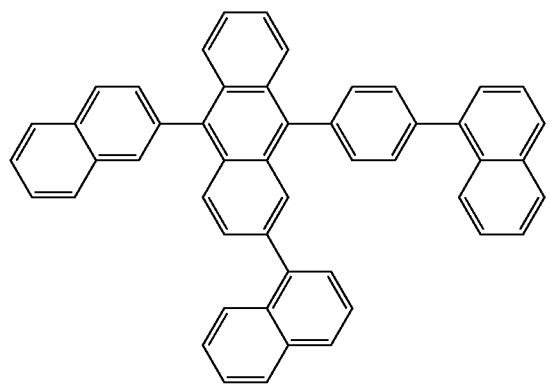
H22
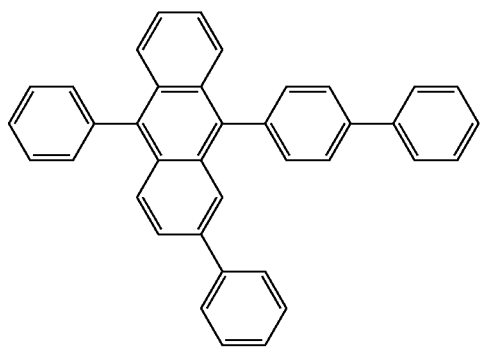
H23
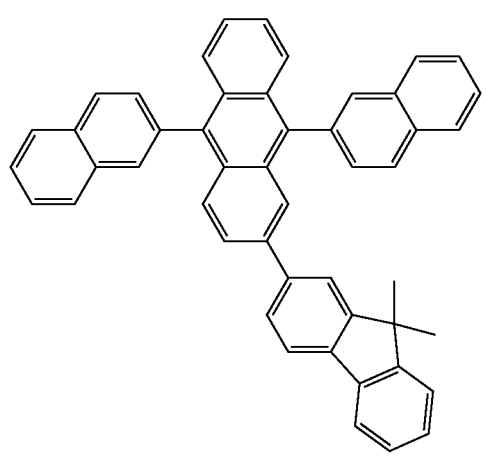
H24
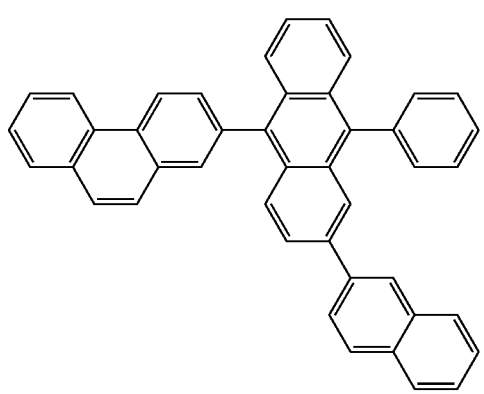

-continued
H25
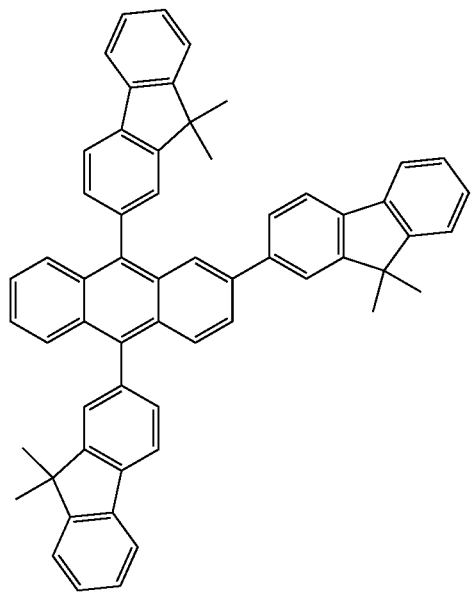
H26
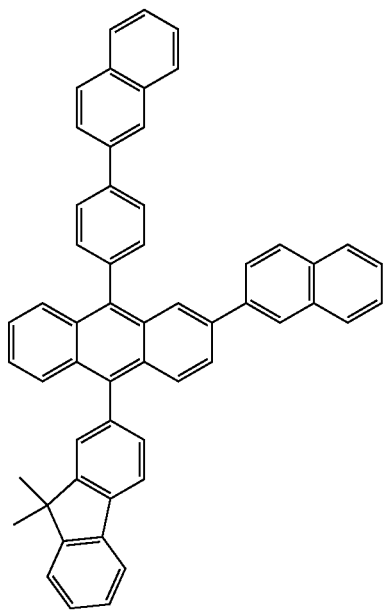
H27
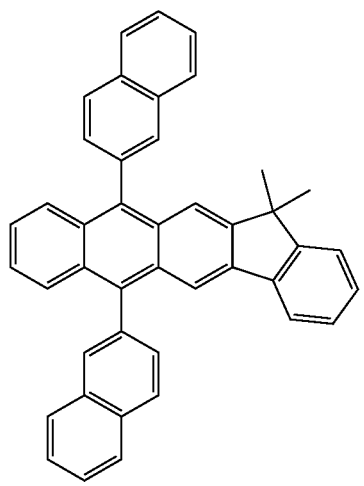
H28
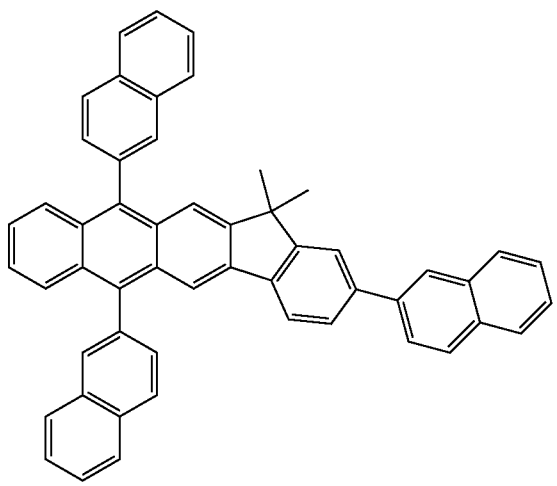
H29
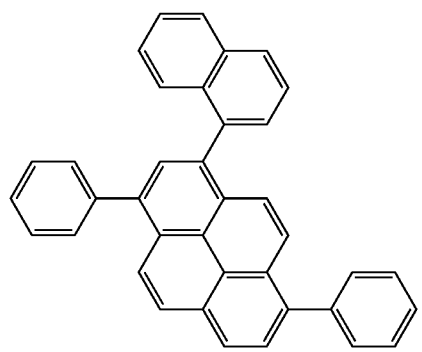
H30
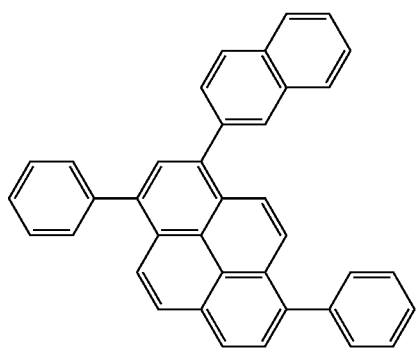

-continued
H31
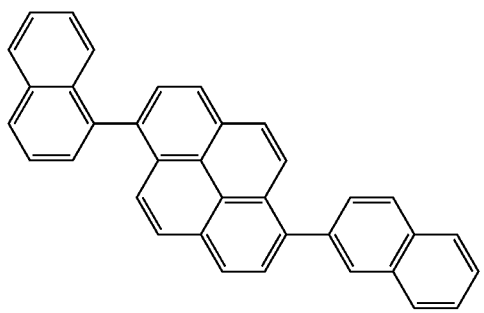
H32
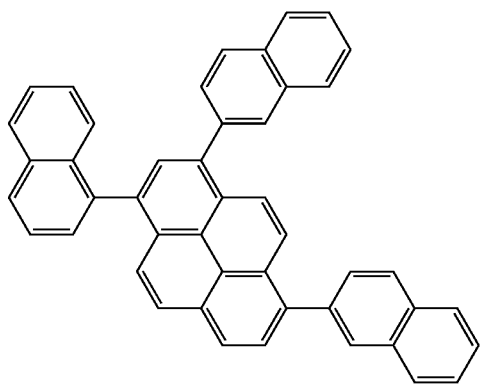
H33
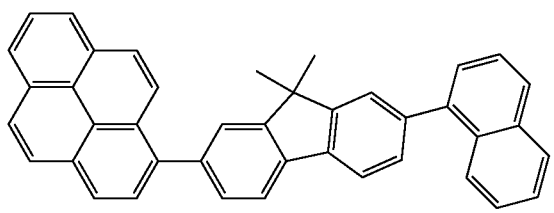
H34
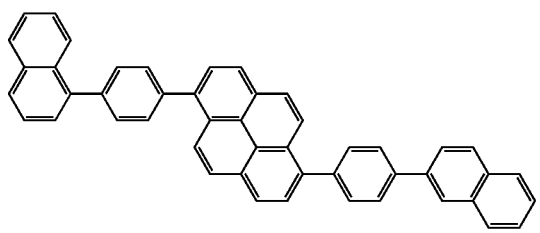
H35
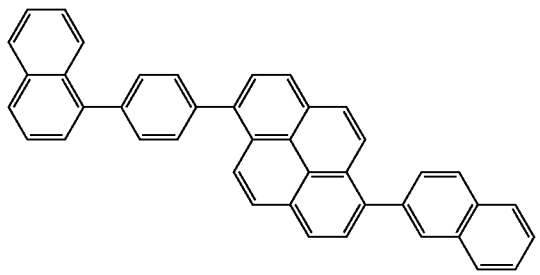
H36
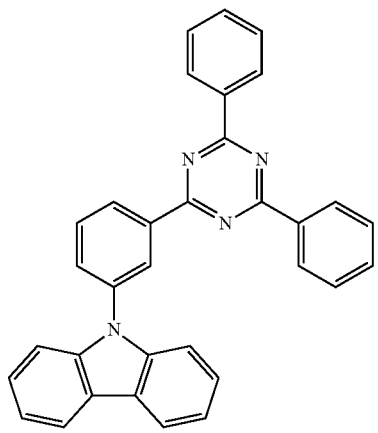
H37
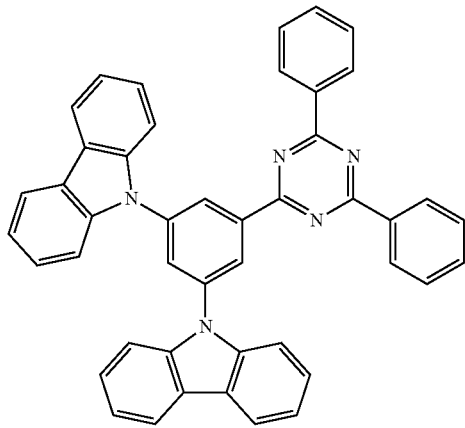
H38
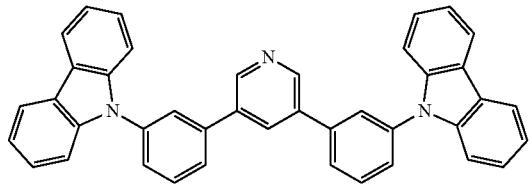

-continued
H39
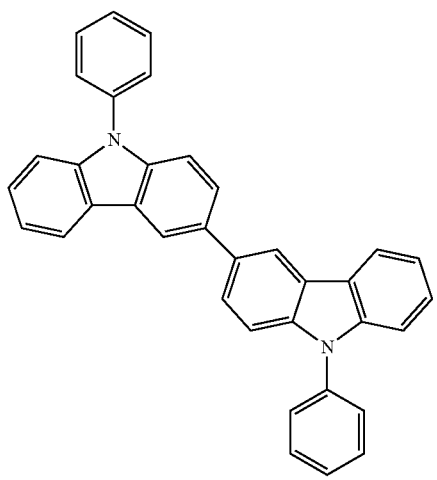
H40
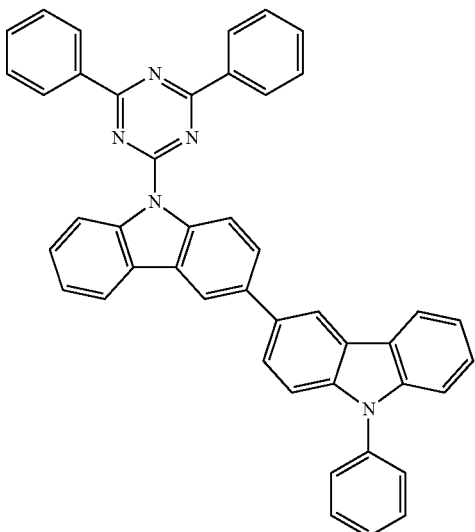
H41
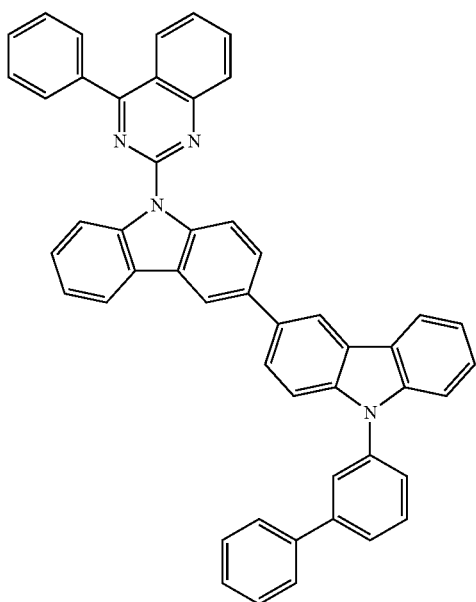
H42
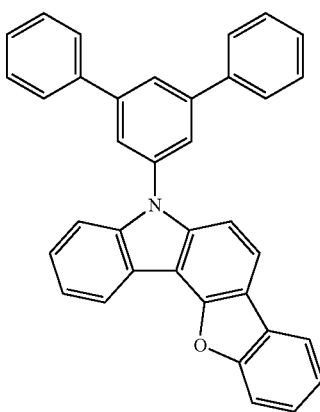
H43
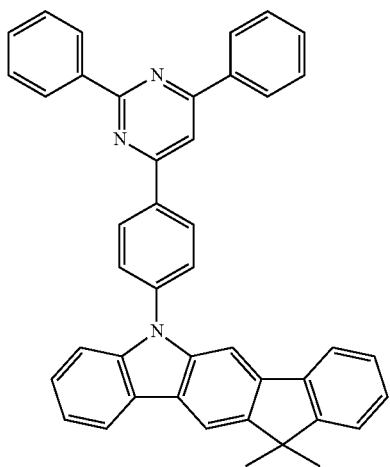
H44
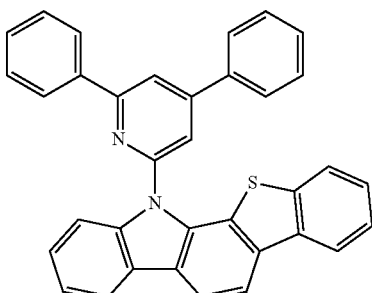

-continued
| | |
|---|---|
| H45 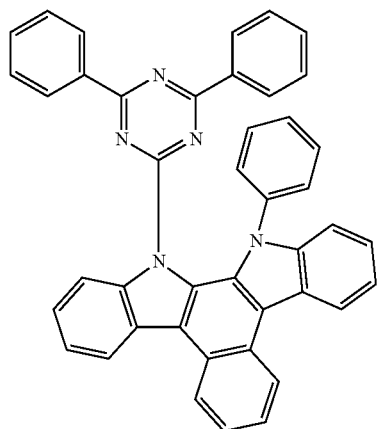 | H46 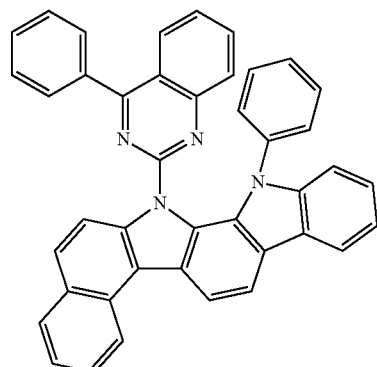 |
| H47 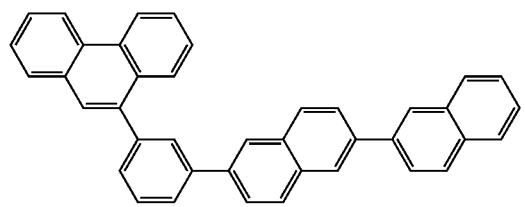 | H48 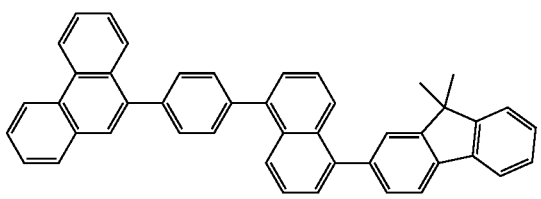 |
| H49 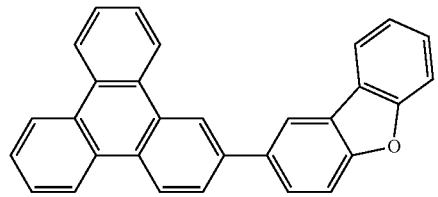 | H50 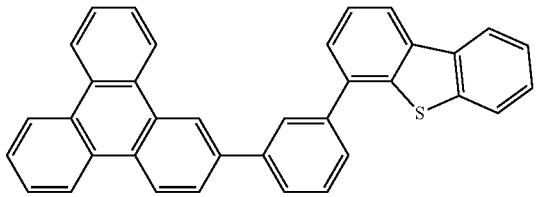 |
| H51 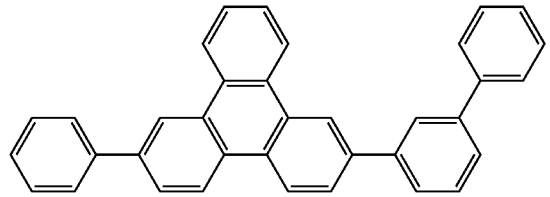 | H52 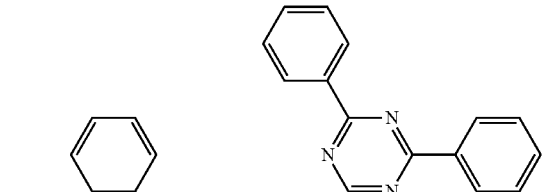 |
| H53 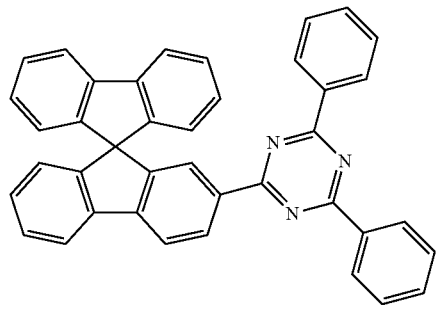 | H54 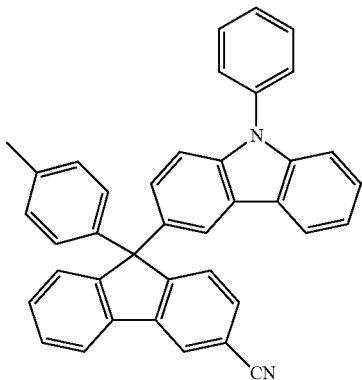 |

-continued
H55
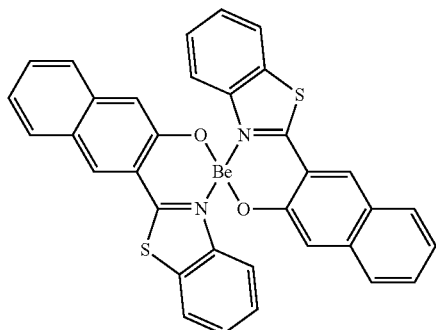
H56
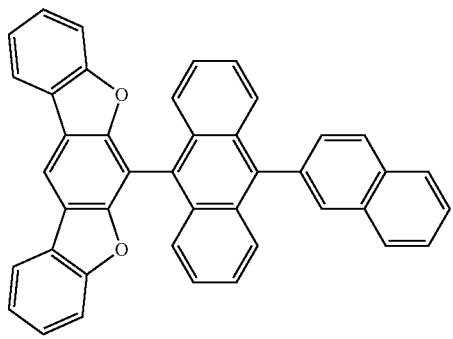
H57
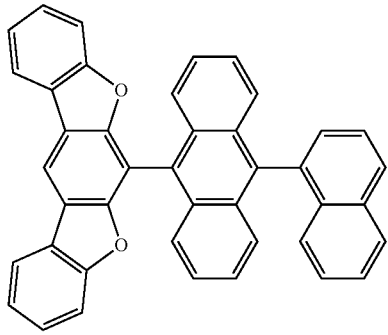
H58
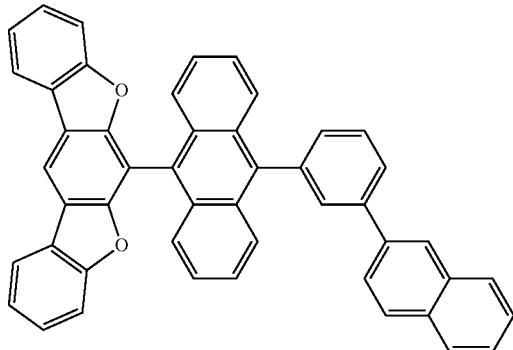
H59
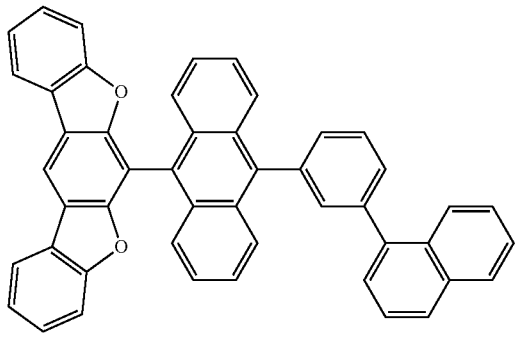
H60
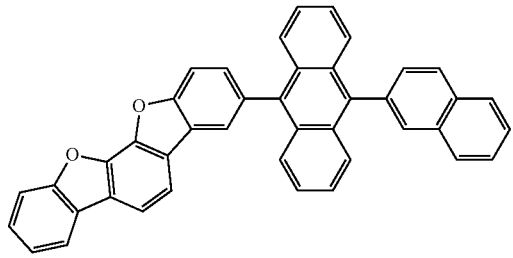
H61
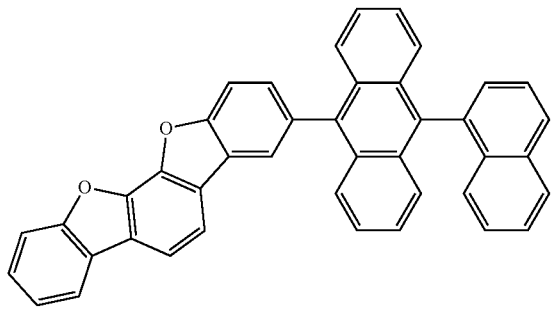
H62
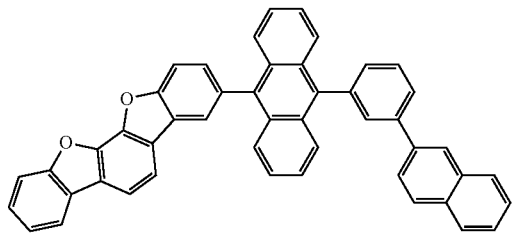

-continued
H63
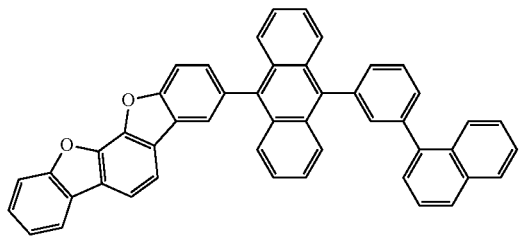
H64
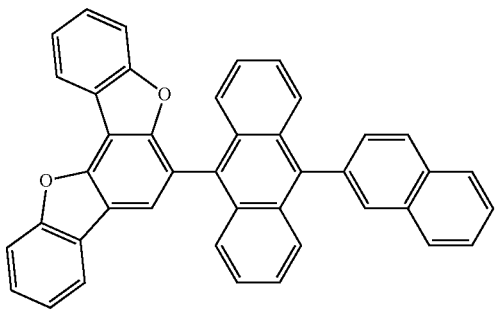
H65
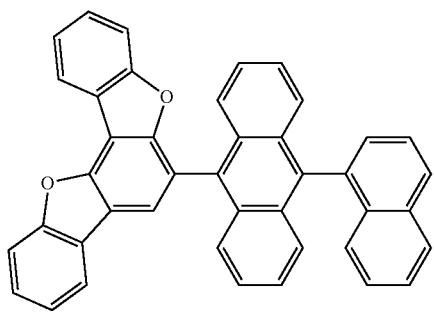
H66
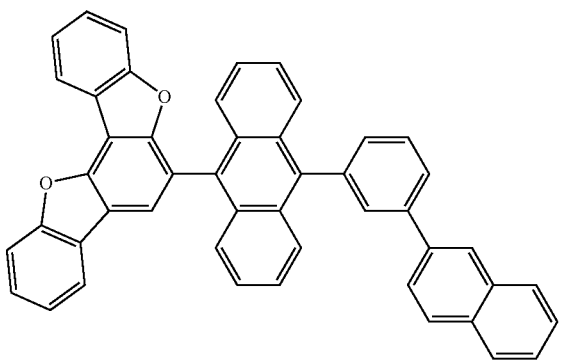
H67
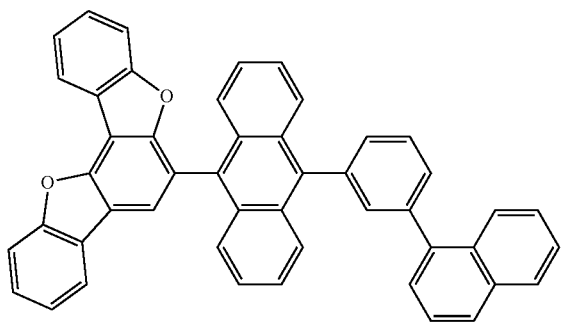
H68
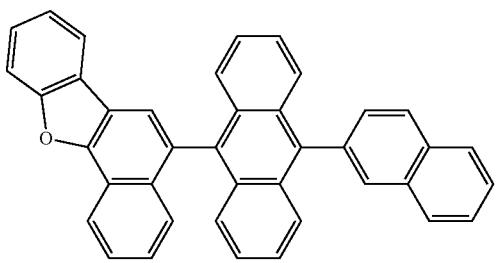
H69
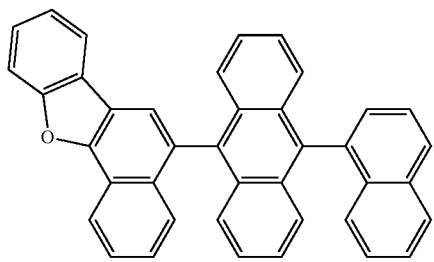
H70
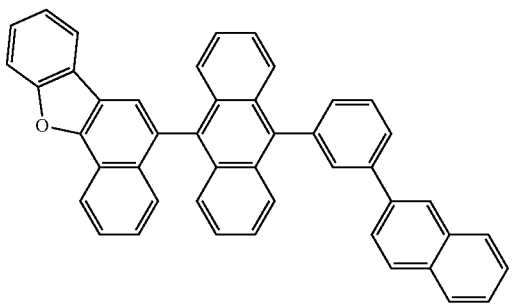

-continued
H71
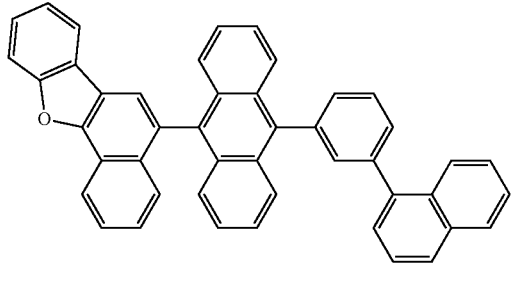
H72
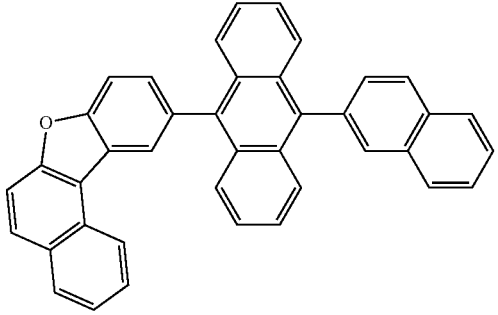
H73
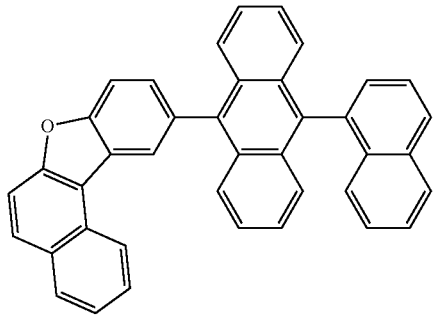
H74
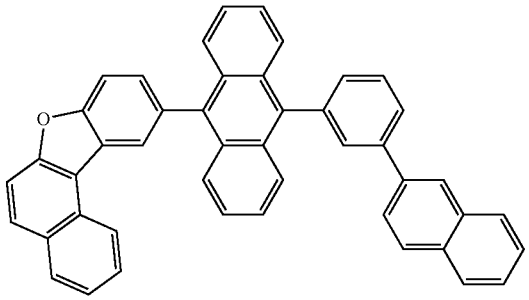
H75
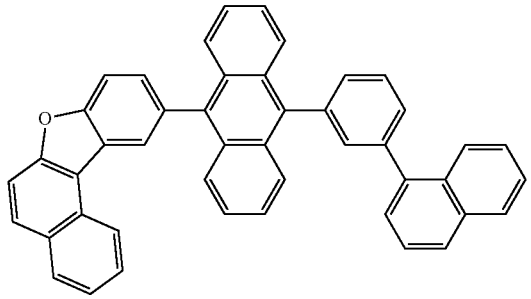
H76
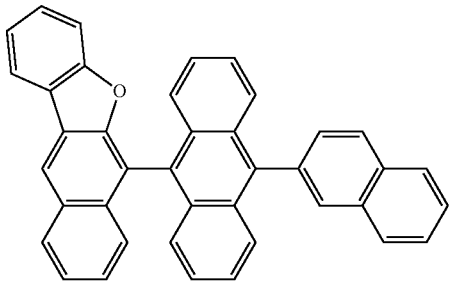
H77
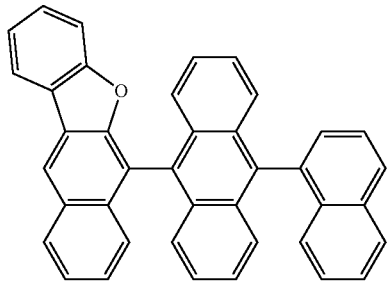
H78
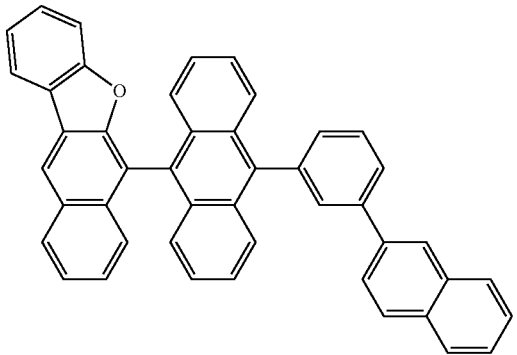

-continued
H79
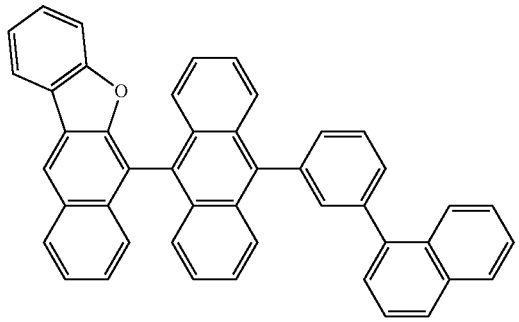
H80
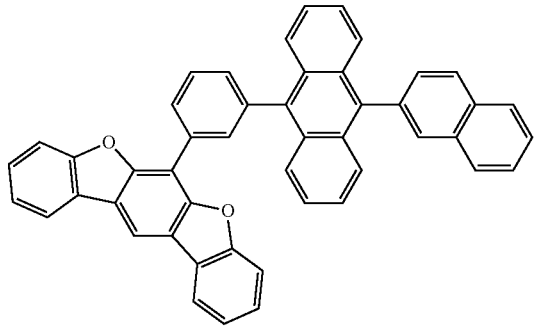
H81
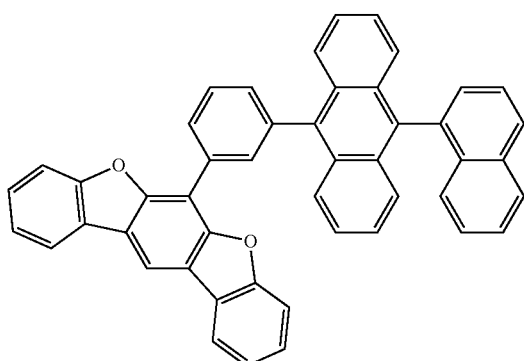
H82
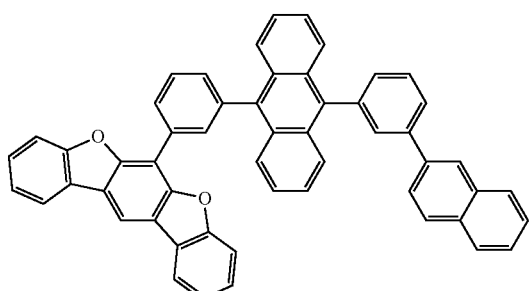
H83
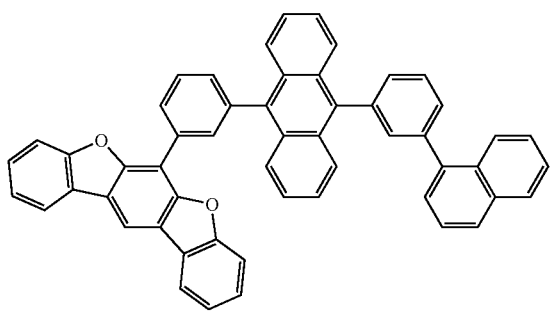
H84
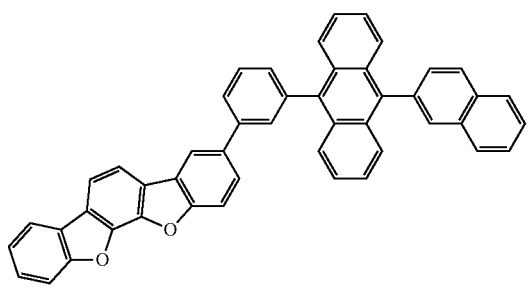
H85
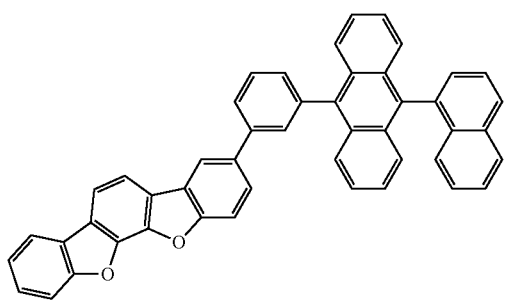
H86
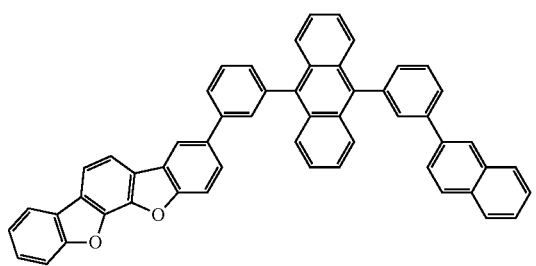

-continued
H87
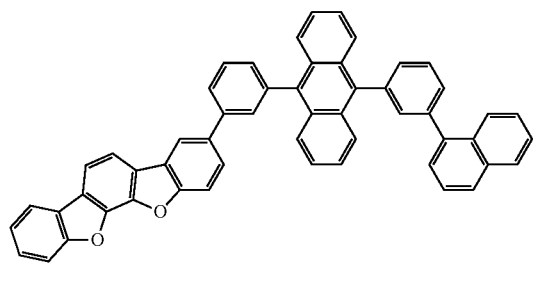
H88
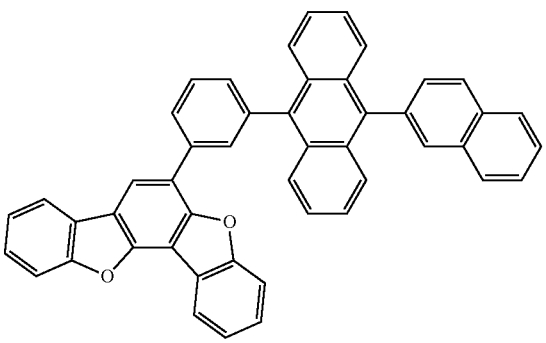
H89
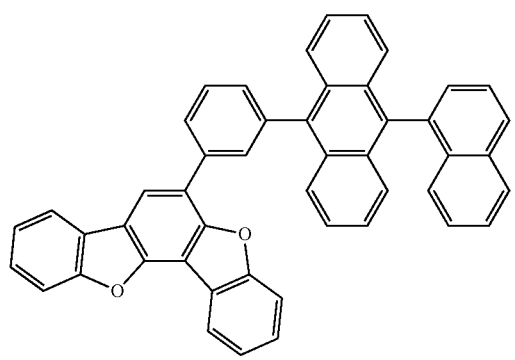
H90
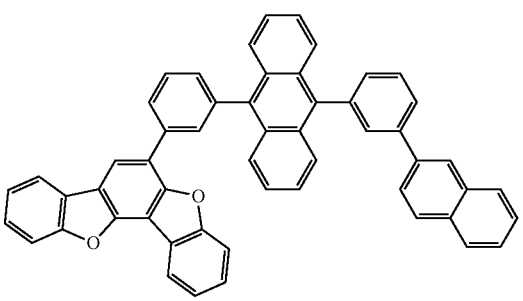
H91
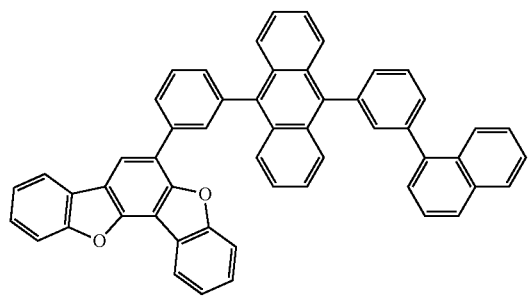
H92
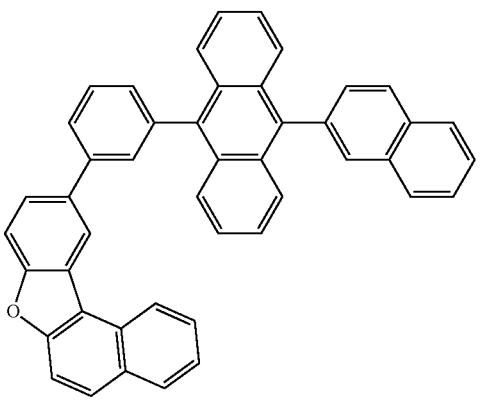
H93
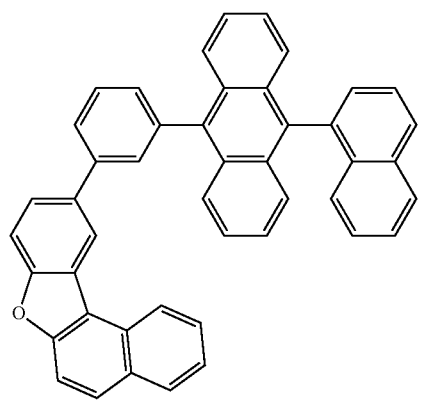
H94
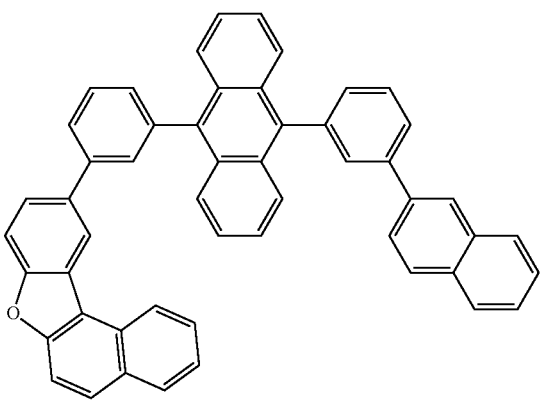

-continued
H95
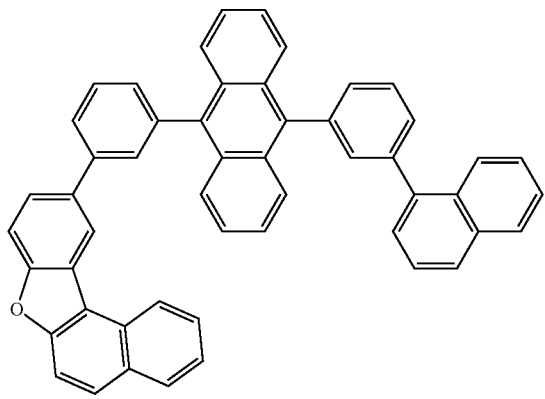
H96
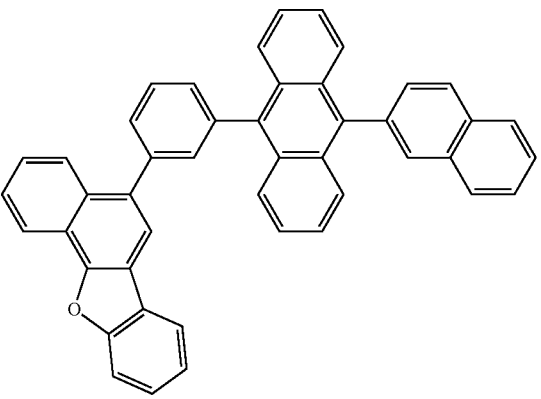
H97
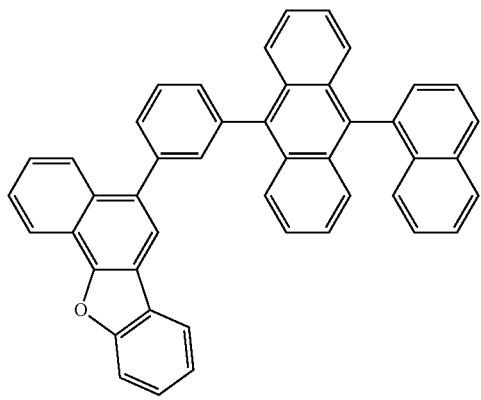
H98
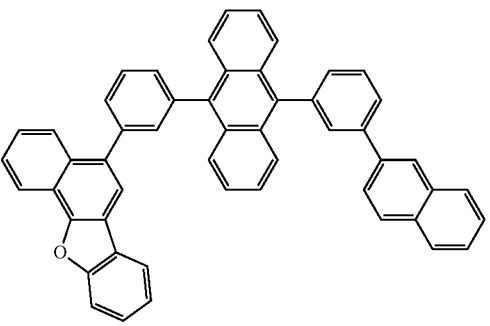
H99
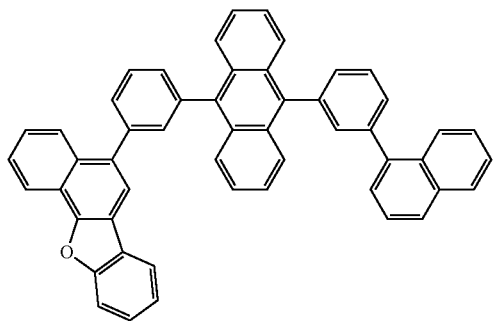
H100
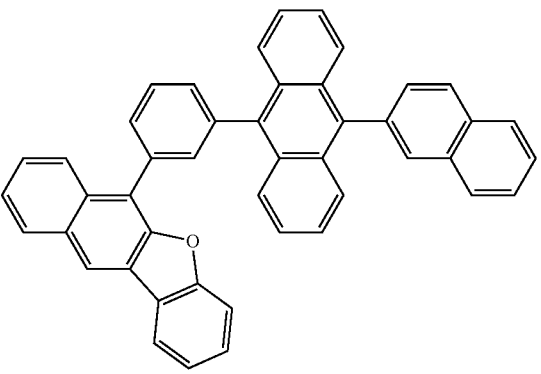
H101
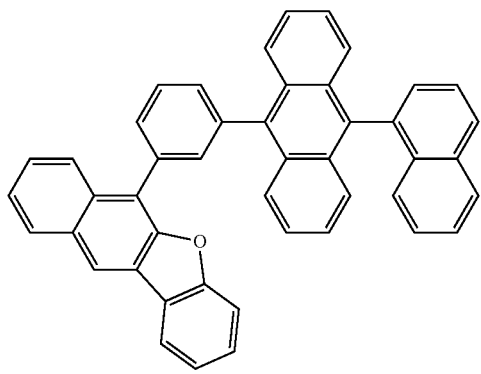
H102
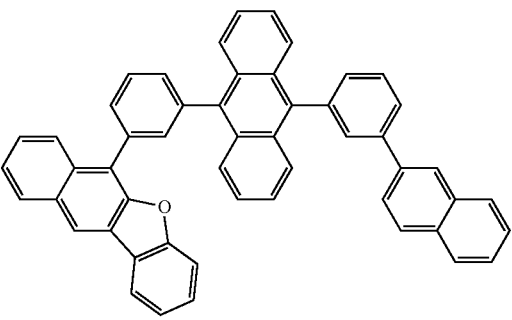

-continued
H103
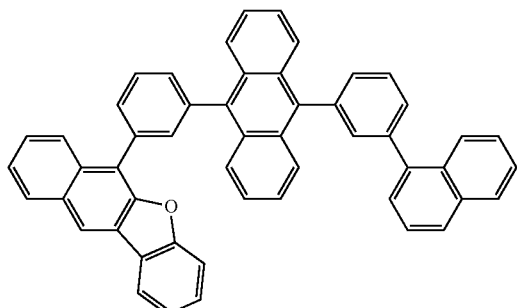
H104
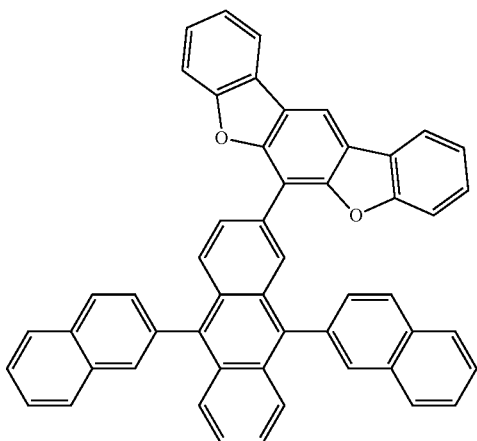
H105
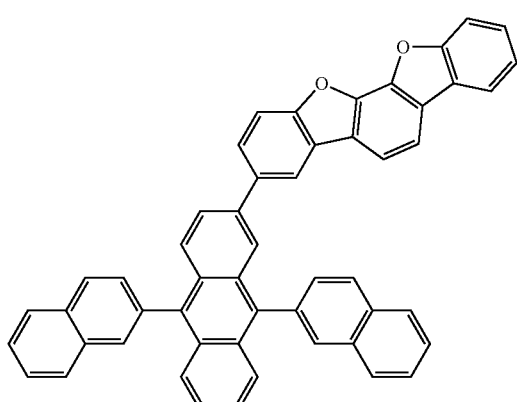
H106
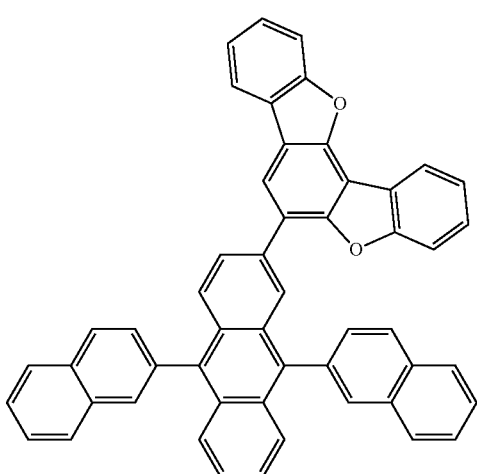
H107
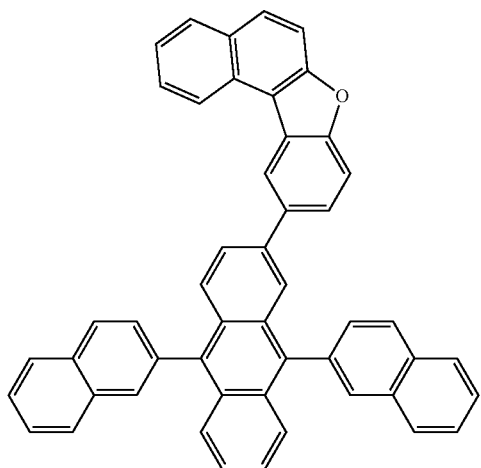
H108
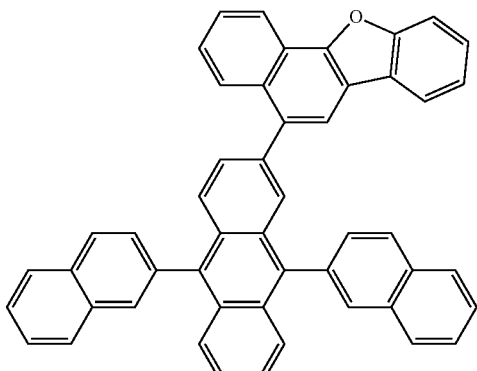

-continued
H109
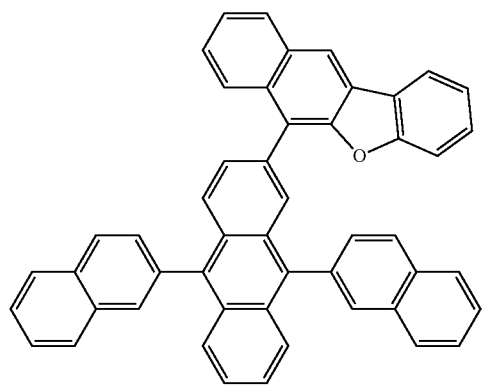
H110
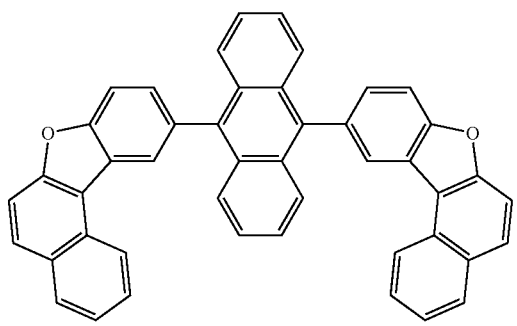
H111
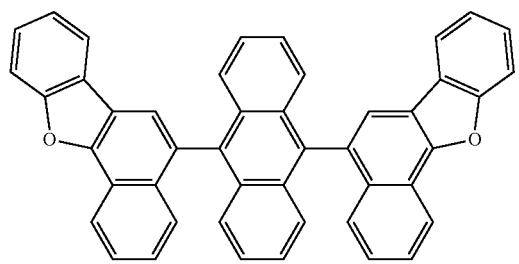
H112
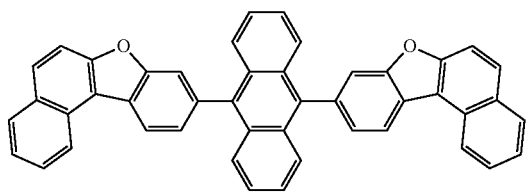
H113
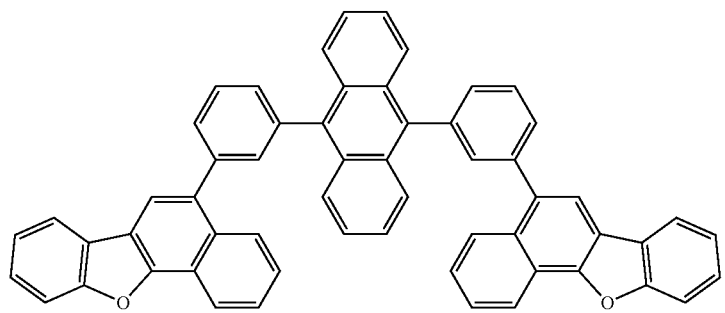
H114
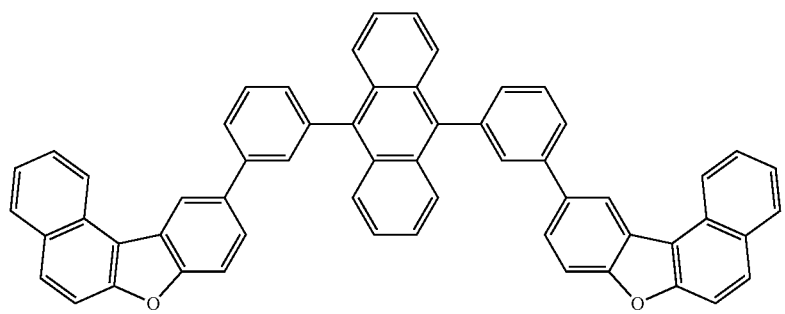

-continued
H115
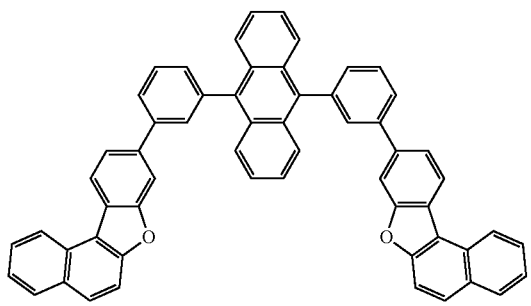
H116
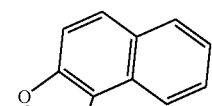
H117
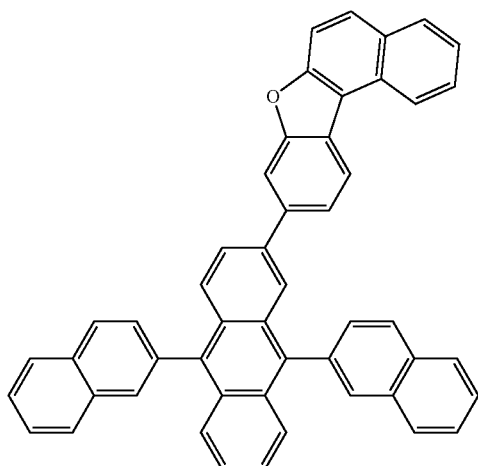
H118
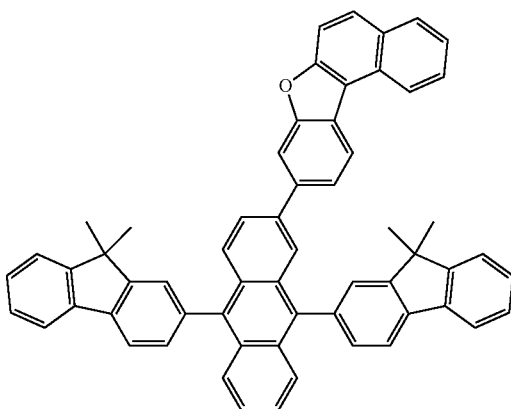
H119
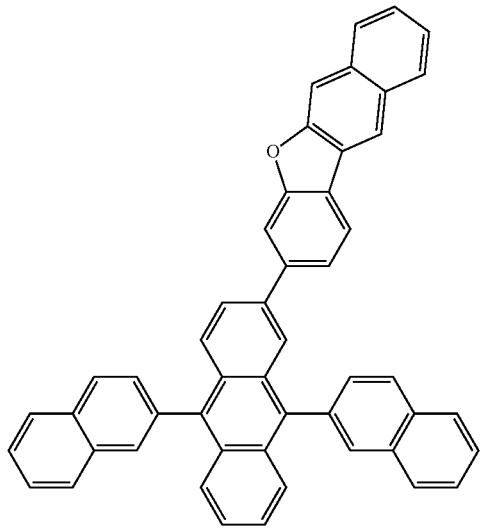
H120
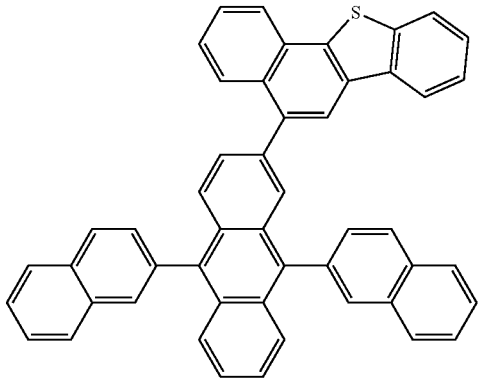

H121
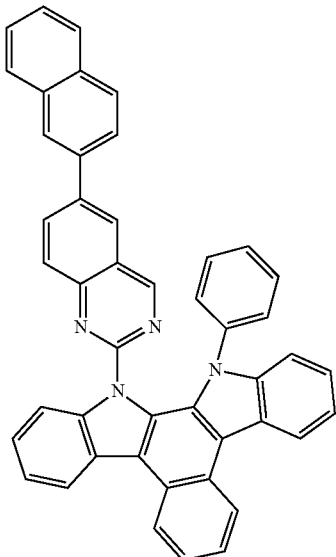

H122
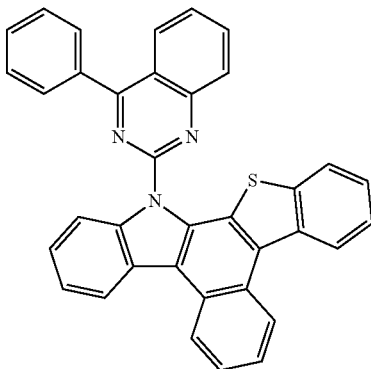

H123
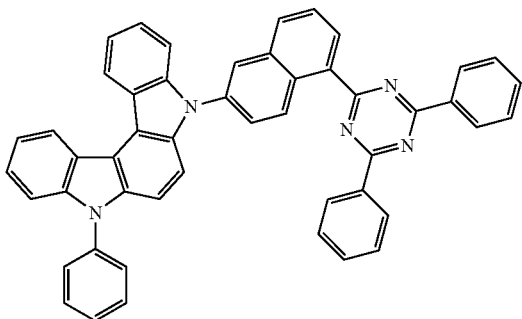

H124
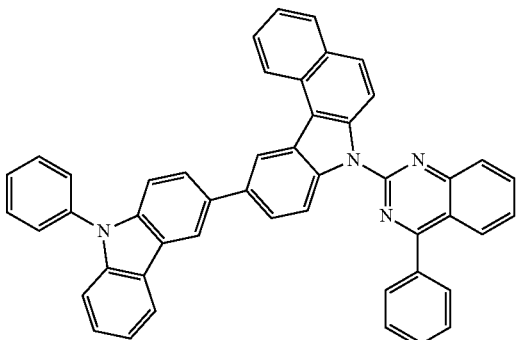

Phosphorescent Dopant

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

$$M(L_{401})_{xc1}(L_{402})_{xc2} \qquad \text{Formula 401}$$

Formula 402

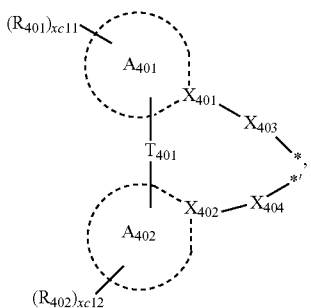

wherein, in Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 3 or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be the same as described in connection with $Q_1$, xc11 and xc12 may each independently be an integer from 0 to 10, and

* and *' in Formula 402 each indicate a binding site to M in Formula 401.

For example, in Formula 402, i) $X_{401}$ may be nitrogen and $X_{402}$ may be carbon, or ii) each of $X_{401}$ and $X_{402}$ may be nitrogen.

In one or more embodiments, in Formula 401, when xc1 is 2 or more, two rings $A_{401}$(s) in two or more of $L_{401}$(s) may be optionally linked to each other via $T_{402}$, which is a linking group, and two rings $A_{402}$(s) may optionally be linked to each other via $T_{403}$, which is a linking group (see e.g., Compounds PD1 to PD4 and PD7), wherein $T_{402}$ and $T_{403}$ may each be the same as described in connection with $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

The phosphorescent dopant may include, for example, one of compounds PD1 to PD25, or any combination thereof:

PD1

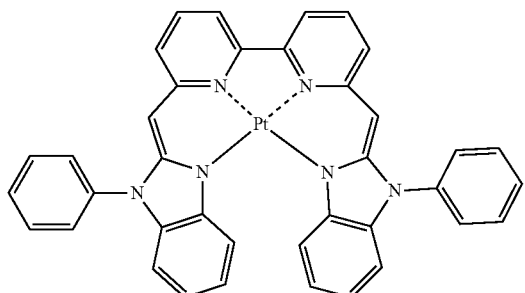

PD2

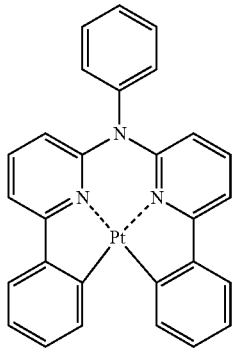

-continued

PD3

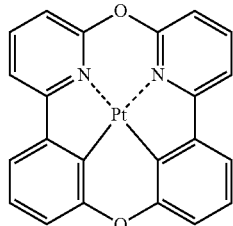

PD4

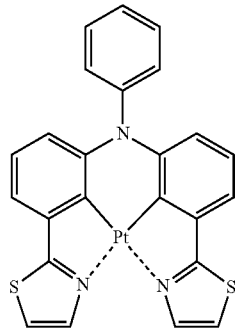

PD5

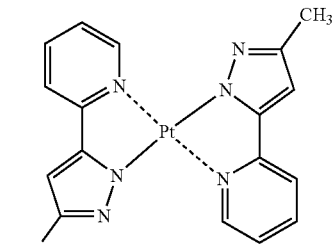

PD6

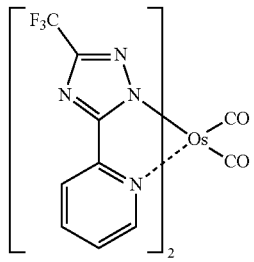

PD7

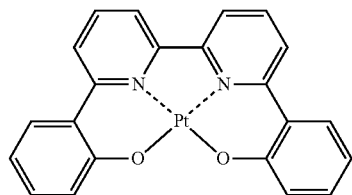

PD8

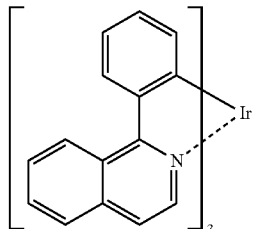

PD9 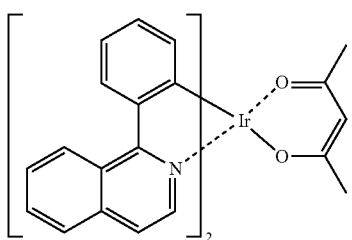
PD10 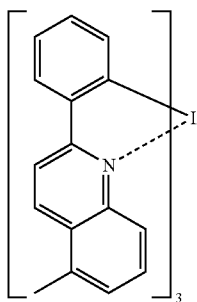
PD11 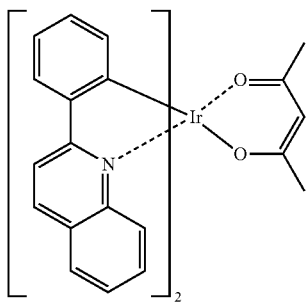
PD12 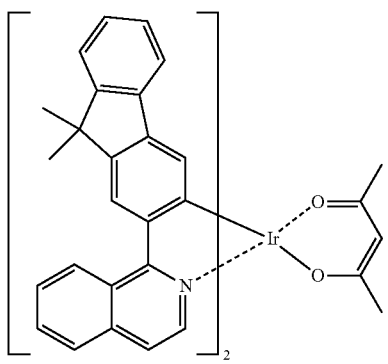
PD13 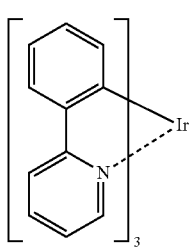
PD14 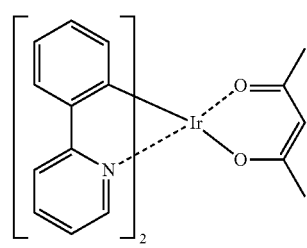
PD15 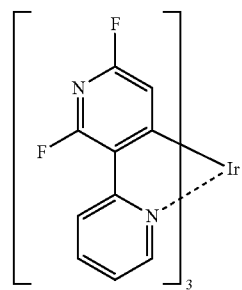
PD16 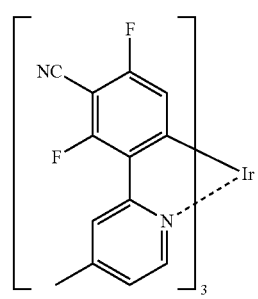
PD17 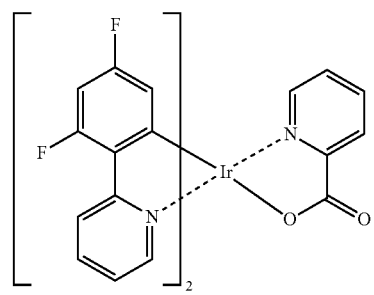
PD18 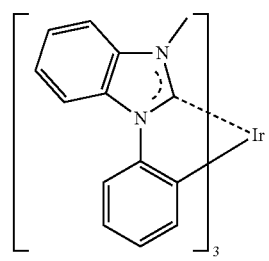

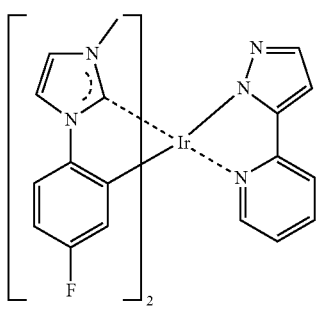

PD19

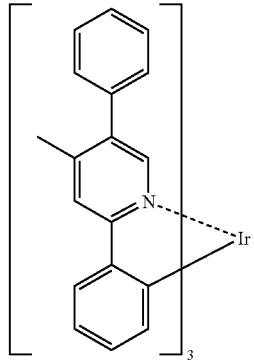

PD23

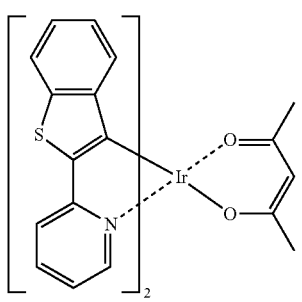

PD20

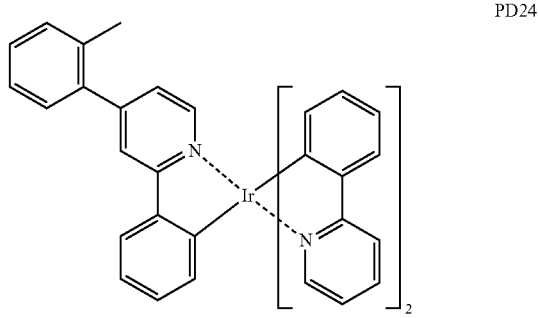

PD24

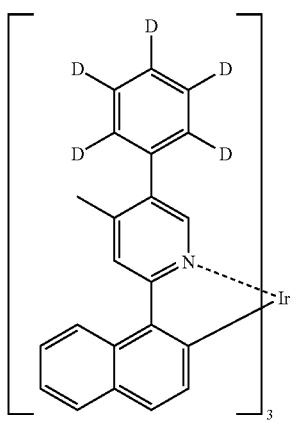

PD21

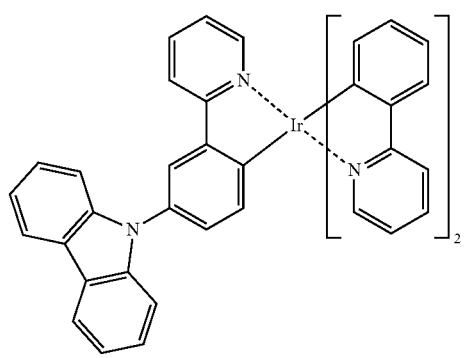

PD25

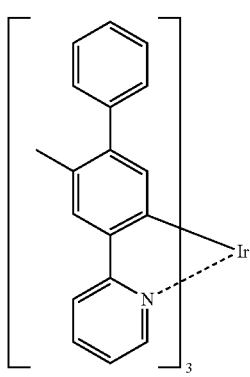

PD22

Fluorescent Dopant

The fluorescent dopant may include an amine group-containing compound, a styryl group-containing compound, or any combination thereof.

In one or more embodiments, the fluorescent dopant may include a compound represented by Formula 501:

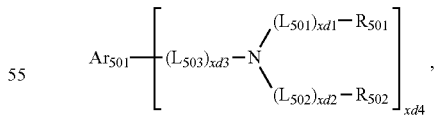

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In one or more embodiments, $Ar_{501}$ in Formula 501 may be a condensed cyclic group (for example, an anthracene group, a chrysene group, or a pyrene group) in which three or more monocyclic groups are condensed together.
In one or more embodiments, xd4 in Formula 501 may be 2.
For example, the fluorescent dopant may include any of Compounds FD1 to FD36, DPVBi, DPAVBi, or any combination thereof:
FD1
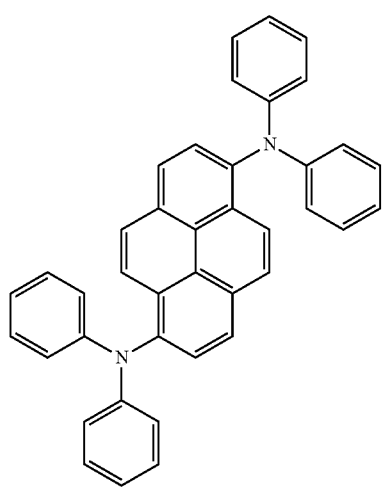
FD2
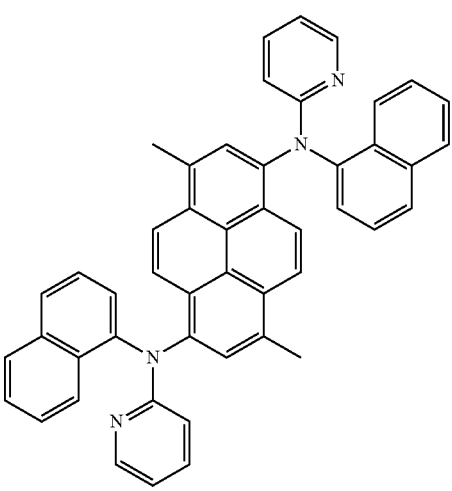
FD3
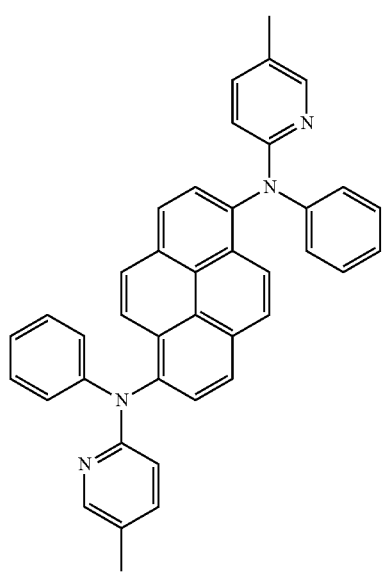
FD4
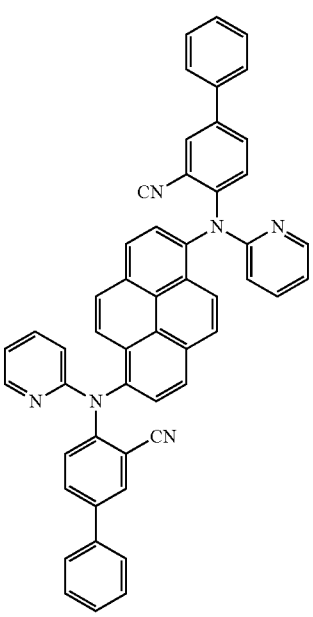
FD5
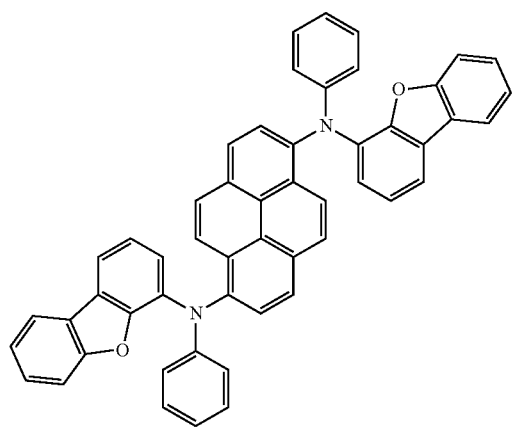
FD6
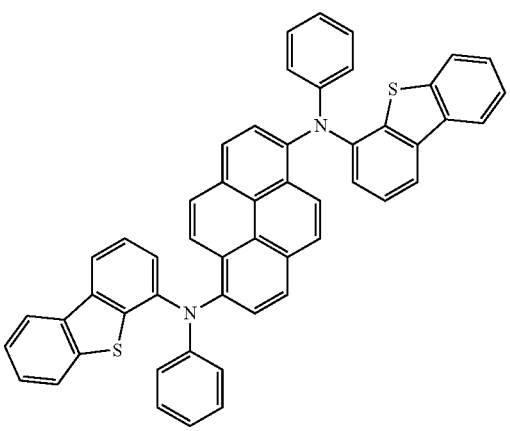

-continued
FD7
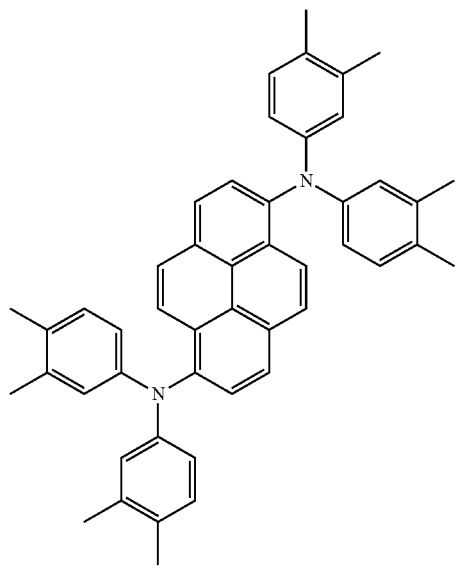
FD8
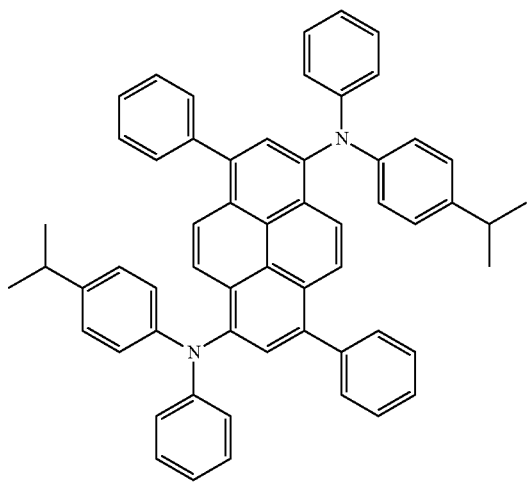
FD9
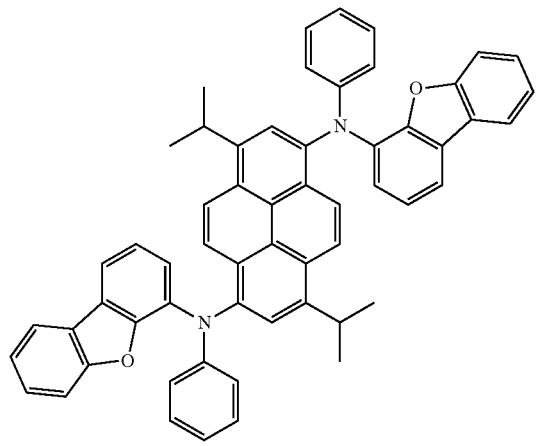
FD10
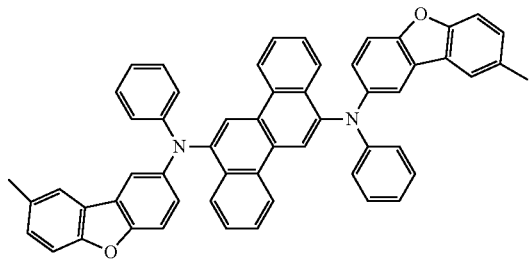
FD11
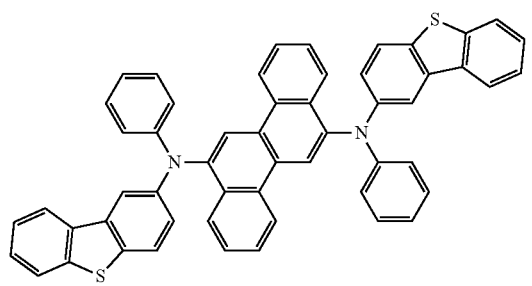
FD12
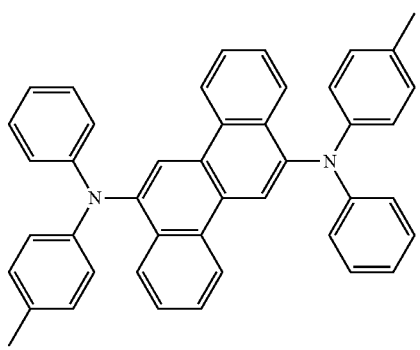

-continued
FD13
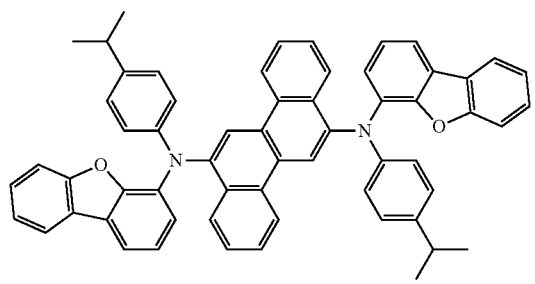
FD14
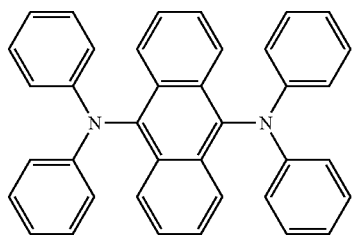
FD15
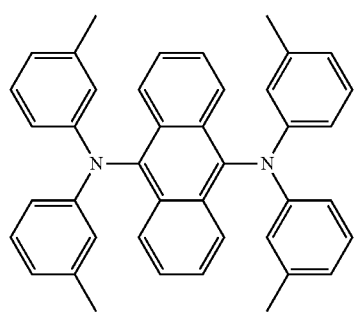
FD16
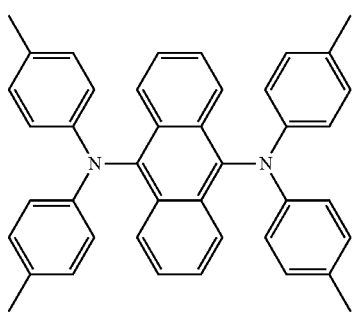
FD17
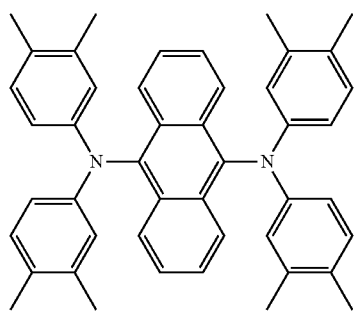
FD18
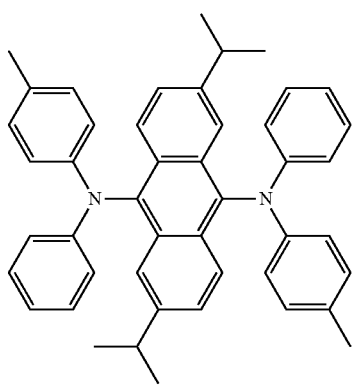
FD19
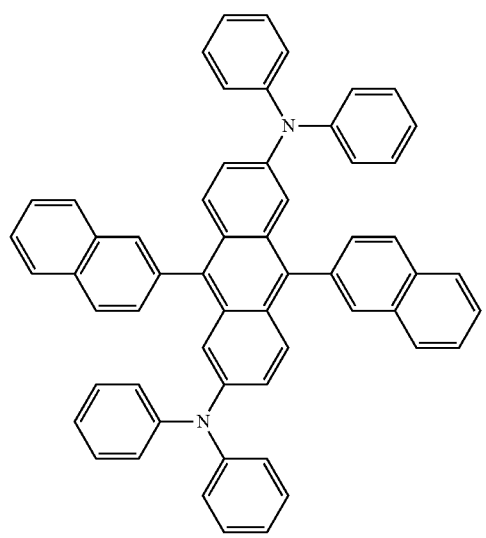
FD20
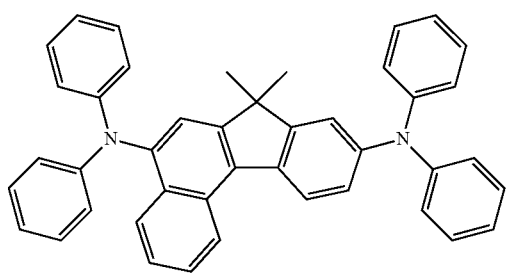

-continued
FD21
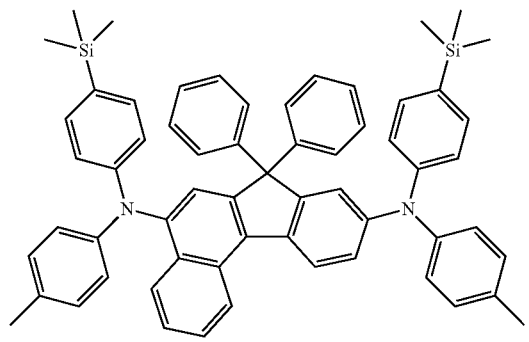
FD22
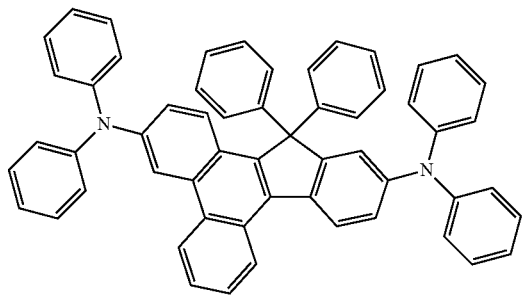
FD23
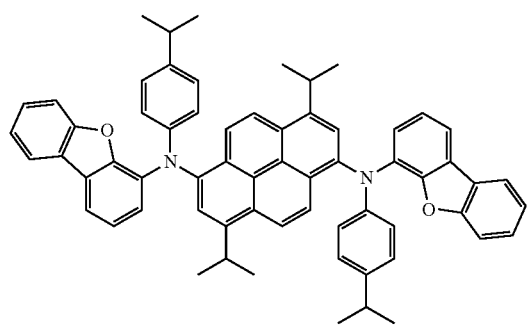
FD24
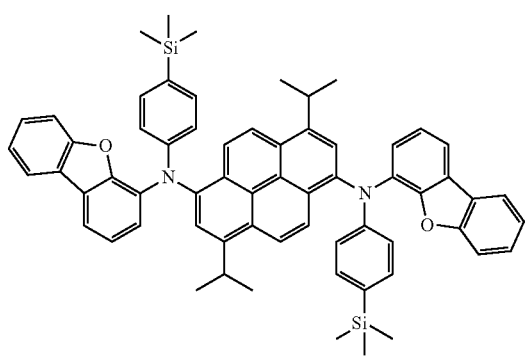
FD25
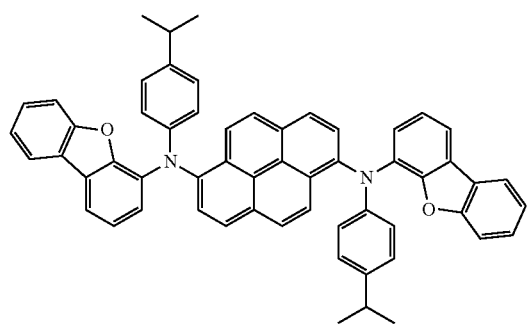
FD26
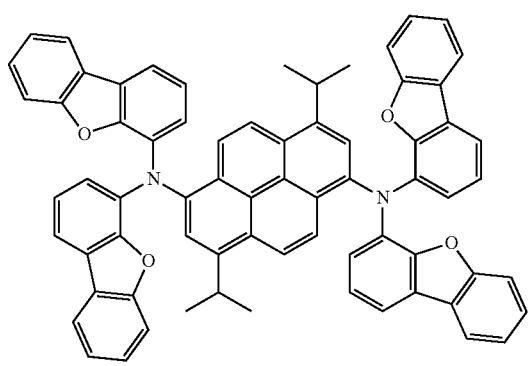
FD27
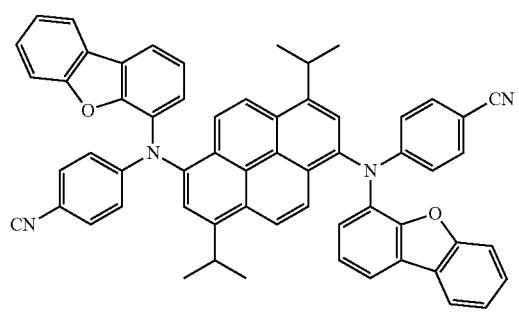
FD28
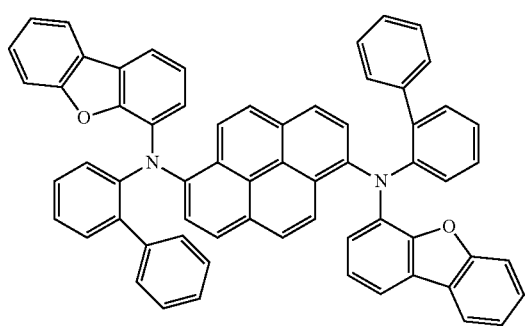

-continued
FD29
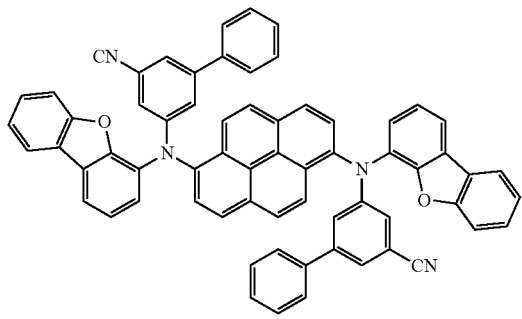
FD30
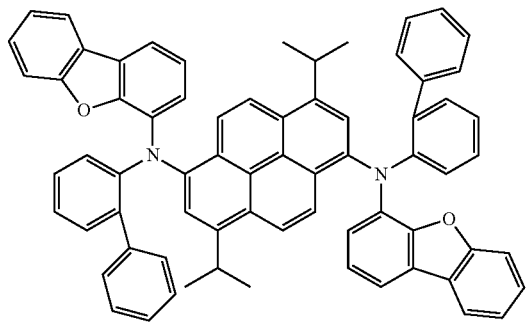
FD31
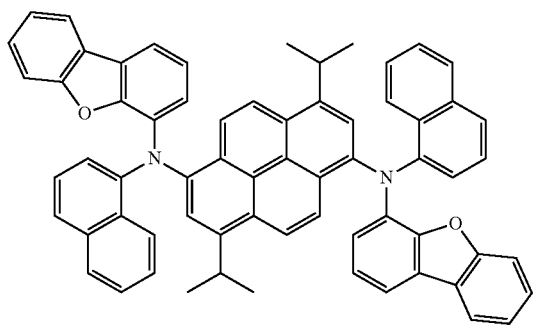
FD32
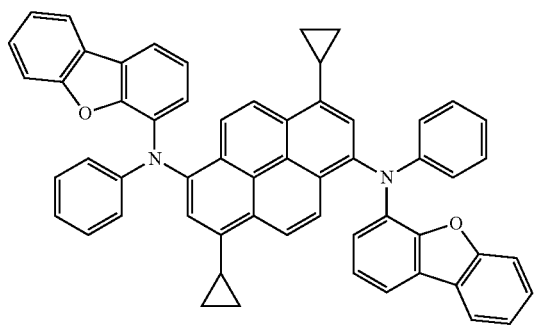
FD33
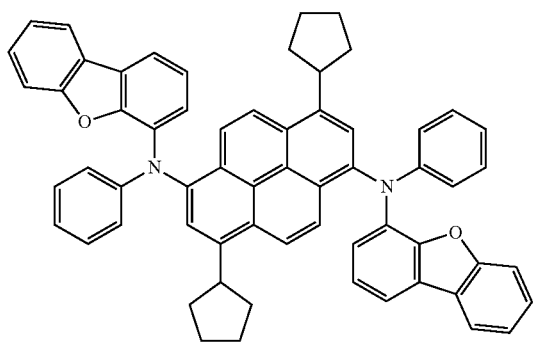
FD34
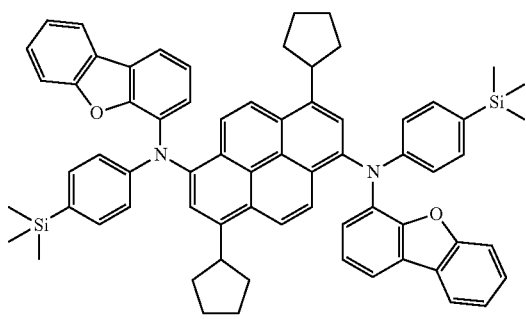
FD35
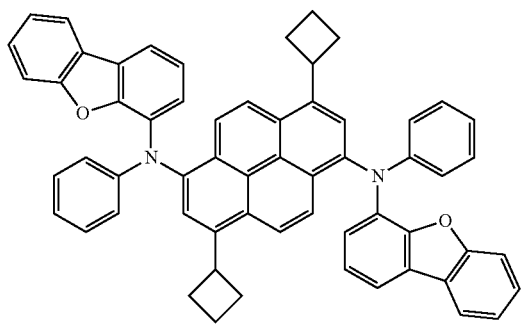
FD36
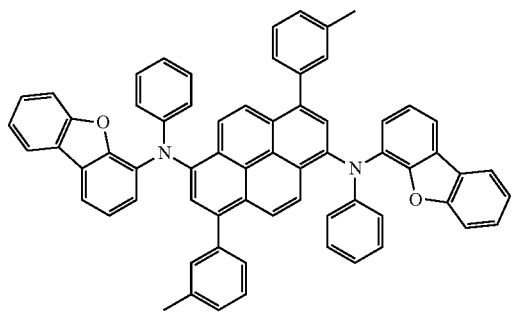

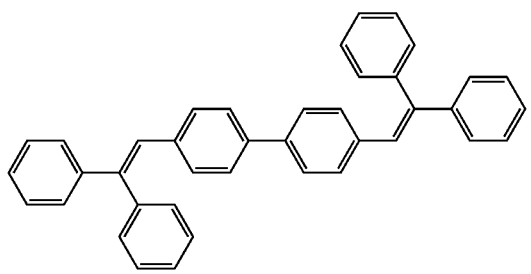

DPVBi

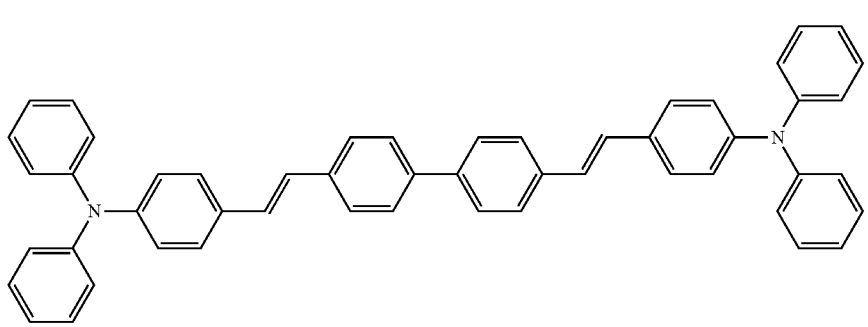

DPAVBi

Delayed Fluorescence Material

The emission layer may include a delayed fluorescence material.

In the present specification, the delayed fluorescence material may be selected from compounds capable of emitting delayed fluorescence based on a delayed fluorescence emission mechanism.

The delayed fluorescent material included in the emission layer may act as a host or a dopant depending on the type (or kind) of other materials included in the emission layer.

In one or more embodiments, a difference between a triplet energy level (eV) of the delayed fluorescence material and a singlet energy level (eV) of the delayed fluorescence material may be equal to or greater than 0 eV and equal to or less than about 0.5 eV. When the difference between the triplet energy level (eV) of the delayed fluorescence material and the singlet energy level (eV) of the delayed fluorescence material is satisfied within the range above, up-conversion from the triplet state to the singlet state of the delayed fluorescence materials may effectively (or suitably) occur, and thus, the light-emitting device 10 may have improved luminescence efficiency.

In one or more embodiments, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, and/or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

In one or more embodiments, the delayed fluorescence material may include at least one of Compounds DF1 to DF9:

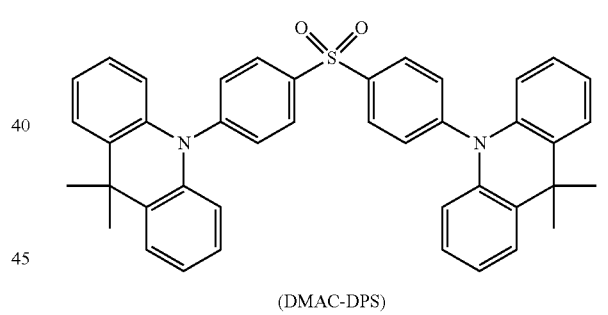

(DMAC-DPS)

DF1

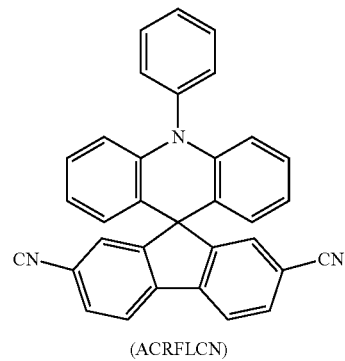

(ACRFLCN)

DF2

-continued

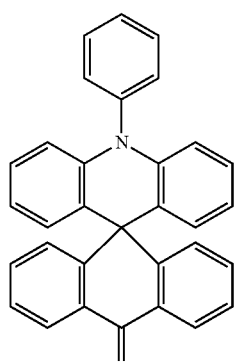
(ACRSA)

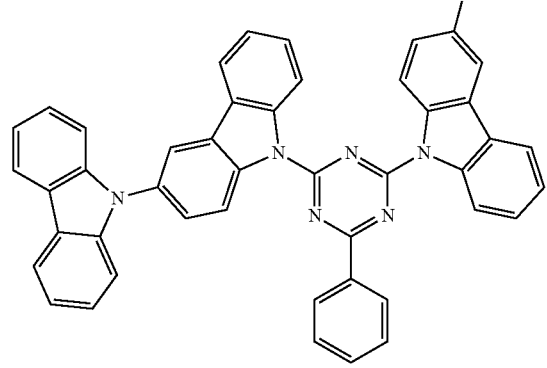
(CC2TA)

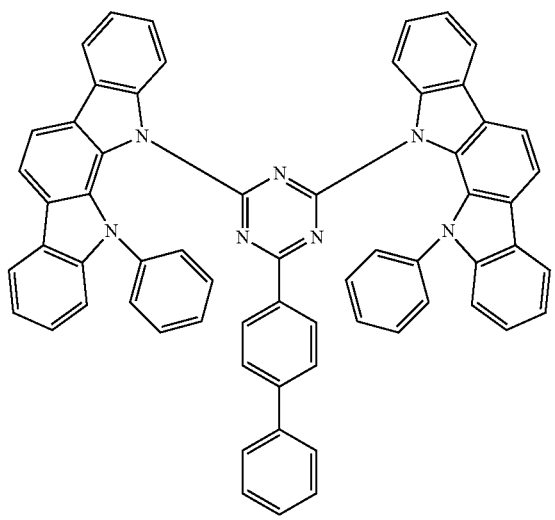
(PIC-TRZ)

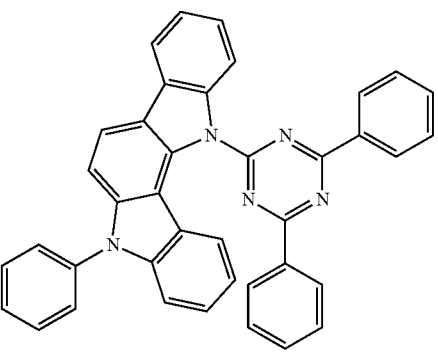
(PIC-TRZ2)

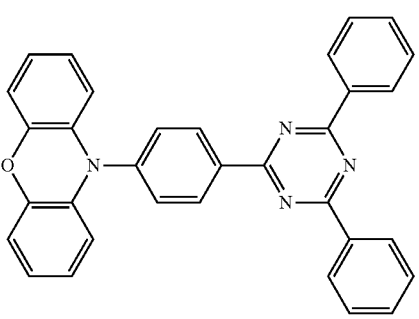
(PXZ-TRZ)

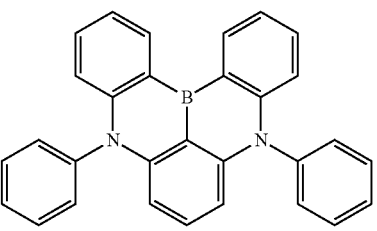
(DABNA-1)

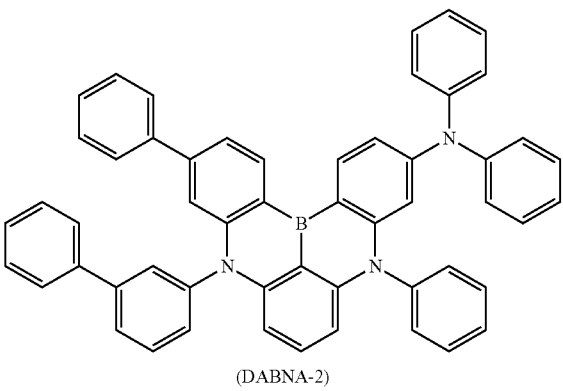
(DABNA-2)

Electron Transport Region in Interlayer 150

The electron transport region may have: i) a single-layered structure including or consisting of a single layer including or consisting of a single material, ii) a single-layered structure including or consisting of a single layer including or consisting of a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, in each structure, layers are sequentially stacked on the emission layers 130 and 140.

The electron transport region (for example, the buffer layer, the hole blocking layer, the electron control layer, and/or the electron transport layer in the electron transport region) may include a metal-free compound including at least one π electron-deficient nitrogen-containing $C_1$-$C_{60}$ cyclic group.

In one or more embodiments, the electron transport region may include a compound represented by Formula 601:

Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each be the same as described in connection with $Q_1$, xe21 may be 1, 2, 3, 4, or 5, and at least one of $Ar_{601}$, $L_{601}$, or $R_{601}$ may each independently be a π electron-deficient nitrogen-containing $C_1$-$C_{60}$ cyclic group unsubstituted or substituted with at least one $R_{10a}$.

In one or more embodiments, when xe11 in Formula 601 is 2 or more, two or more of $Ar_{601}$(s) may be linked together via a single bond.

In one or more embodiments, $Ar_{601}$ in Formula 601 may be a substituted or unsubstituted anthracene group.

In one or more embodiments, the electron transport region may include a compound represented by Formula 601-1:

Formula 601-1

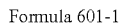
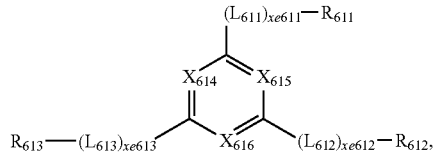

wherein, in Formula 601-1, $X_{614}$ may be N or C($R_{614}$), $X_{615}$ may be N or C($R_{615}$), and $X_{616}$ may be N or C($R_{616}$), wherein at least one of $X_{614}$ to $X_{616}$ may be N, $L_{611}$ to $L_{613}$ may each be the same as described in connection with $L_{601}$, xe611 to xe613 may each be the same as described in connection with xe1, $R_{611}$ to $R_{613}$ may each be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group substituted or unsubstituted at least one $R_{10a}$.

For example, xe1 and xe611 to xe613 in Formulae 601 and 601-1 may each independently be 0, 1, or 2.

The electron transport region may include any of Compounds ET1 to ET45, 2,9-dimethyl-4,7-diphenyl-1,10-phenanthroline (BCP), 4,7-diphenyl-1,10-phenanthroline (Bphen), Alq$_3$, BAlq, TAZ, NTAZ, or any combination thereof:

ET1

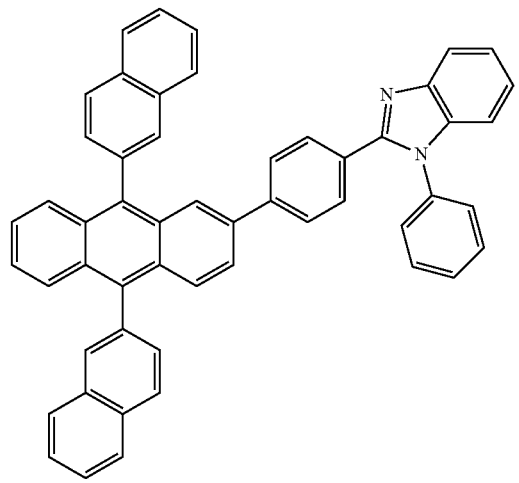

ET2

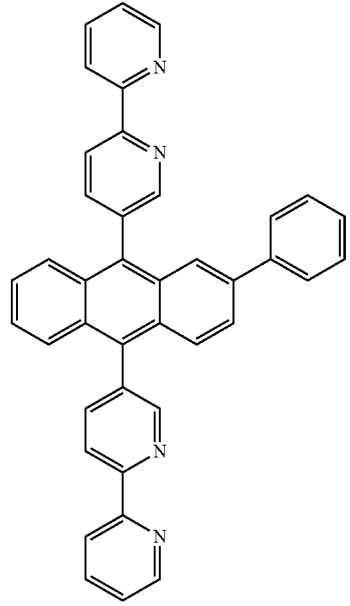

ET3
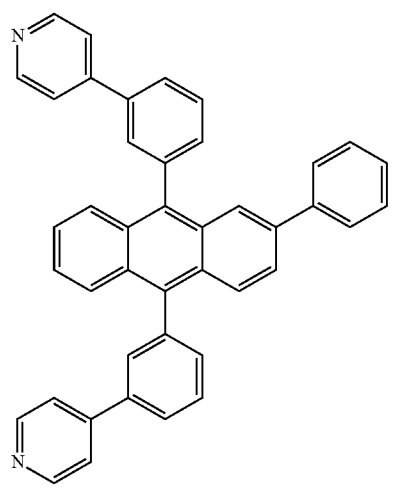
ET4
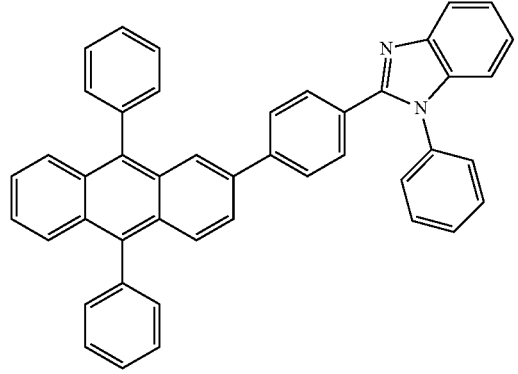
ET5
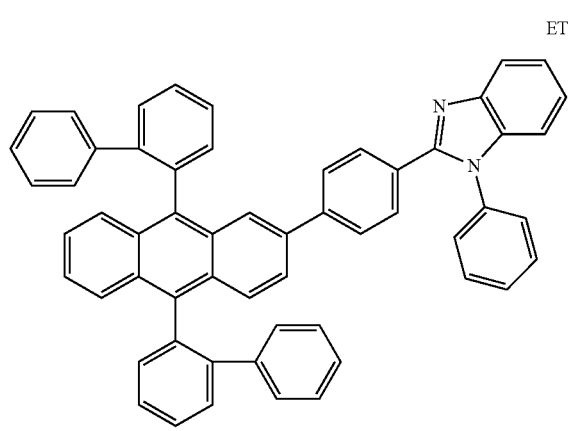
ET6
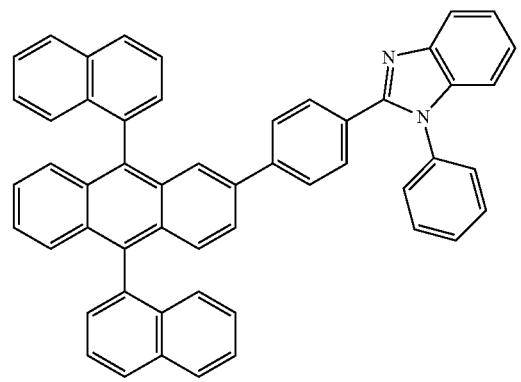
ET7
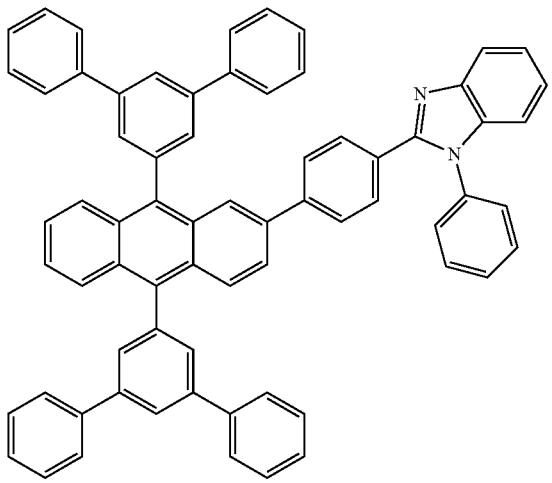
ET8
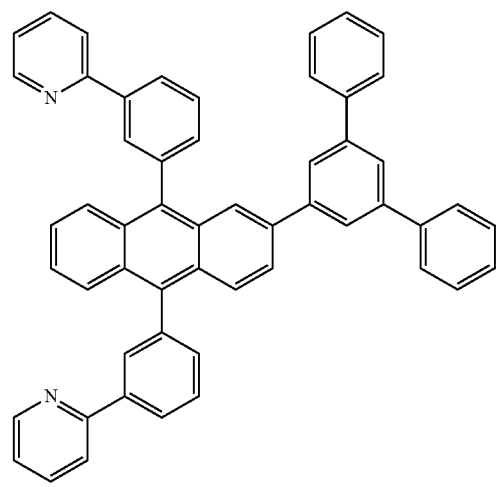

ET9
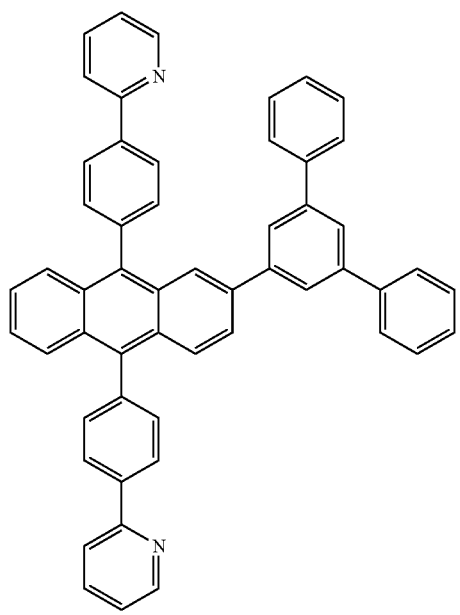
ET11
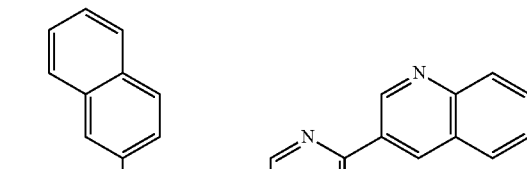
ET12
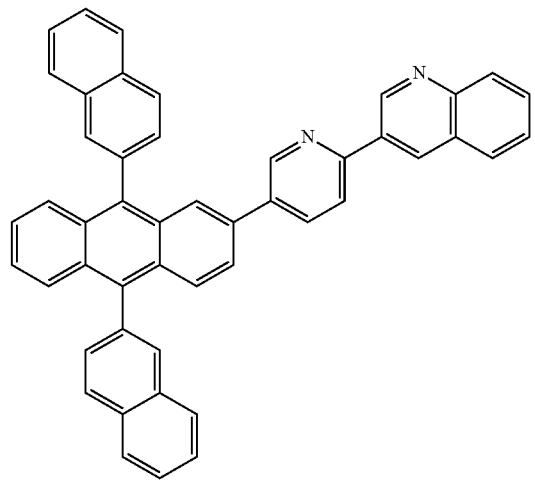
ET10
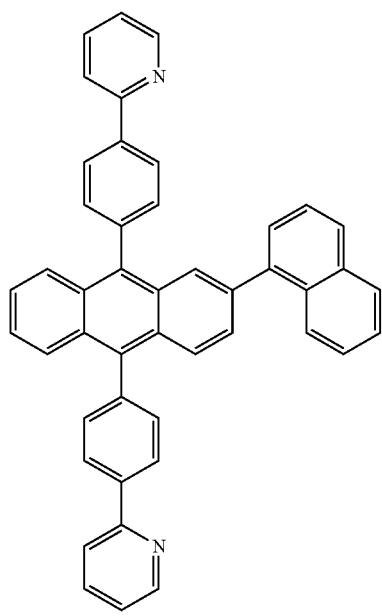
ET13
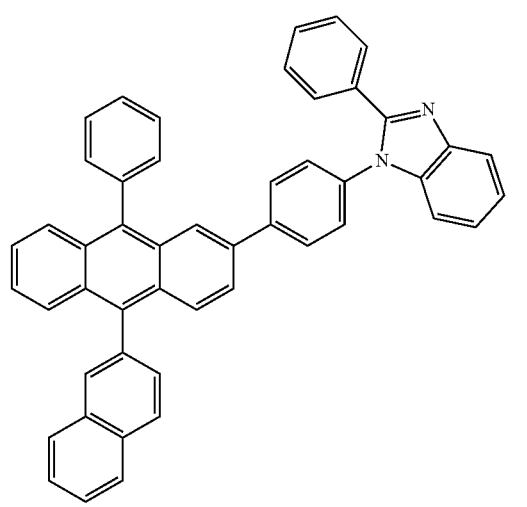

ET14
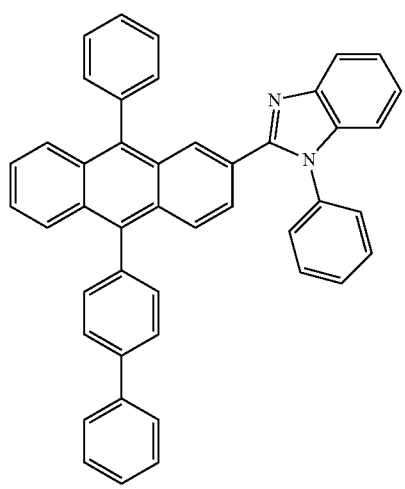
ET15
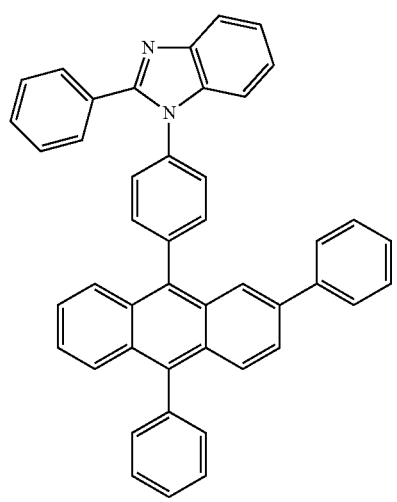
ET16
ET17
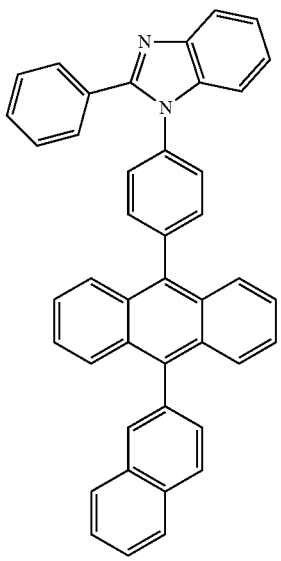
ET18
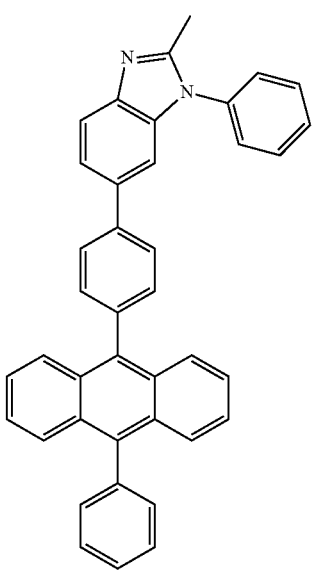
ET19
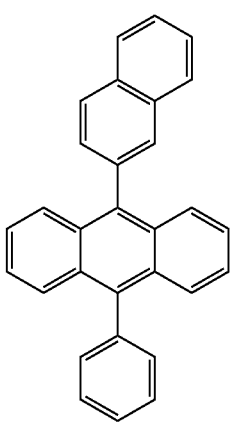

ET20
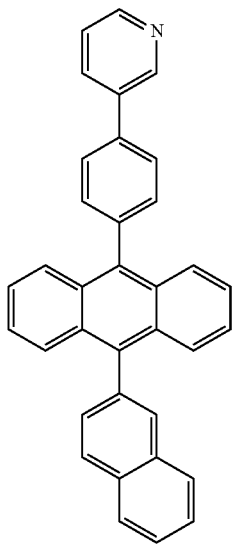
ET21
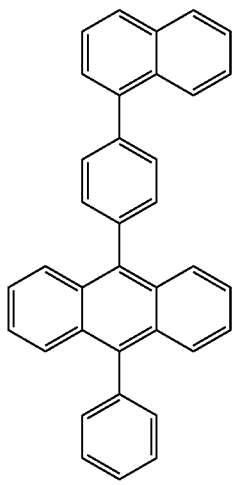
ET22
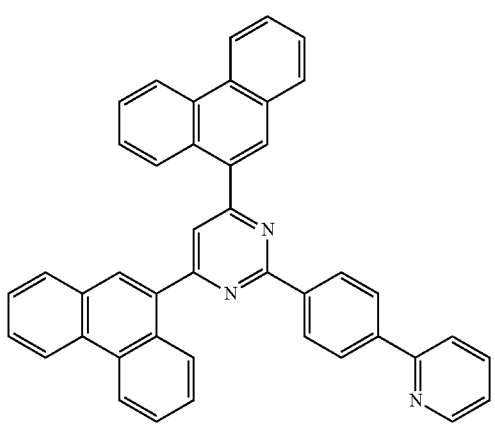
ET23
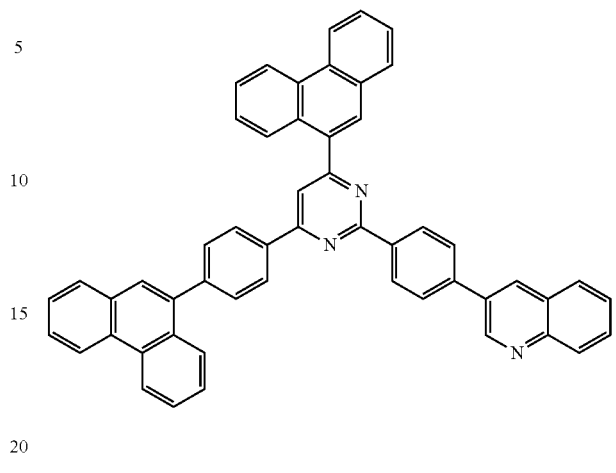
ET24
ET25
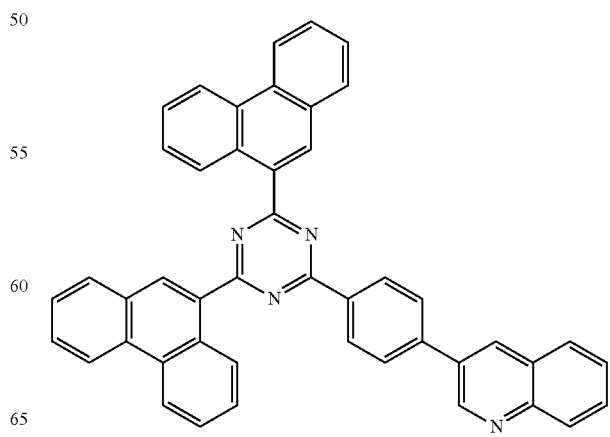

ET26
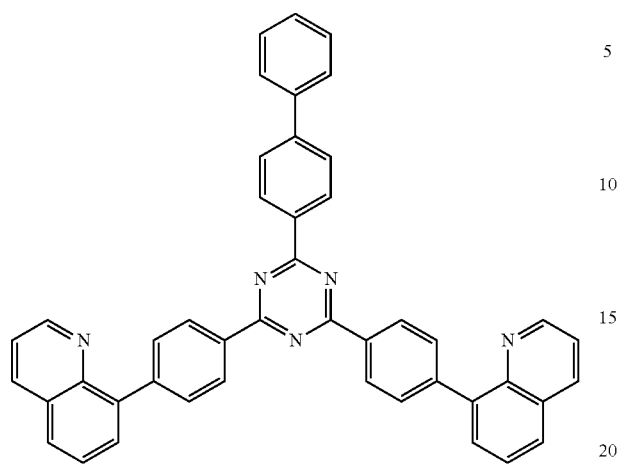
ET27
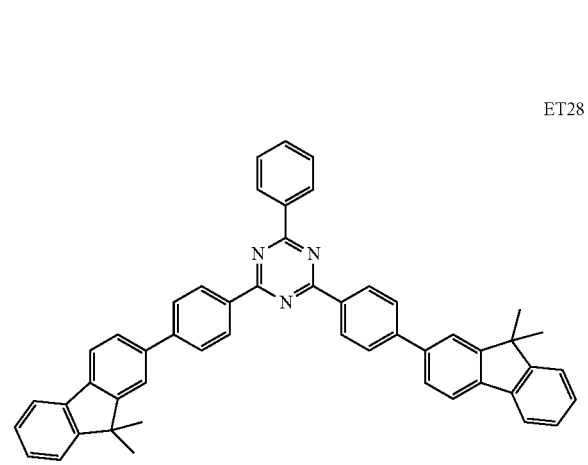 
ET28
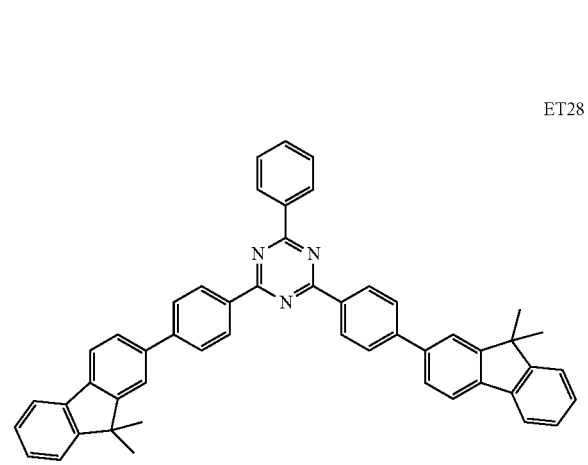
ET29
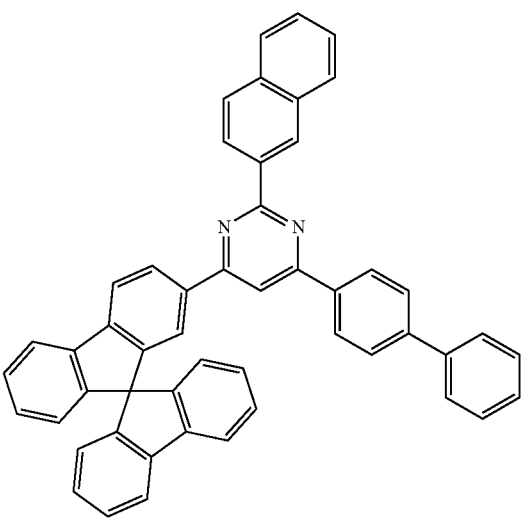
ET30
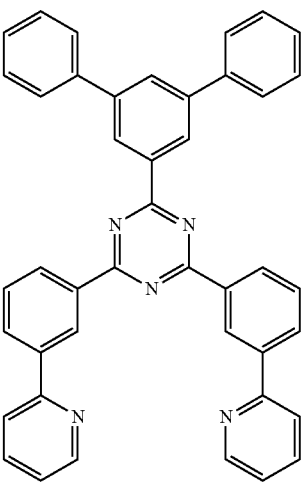
ET31
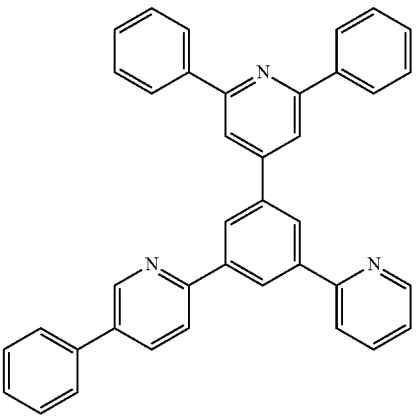

ET32
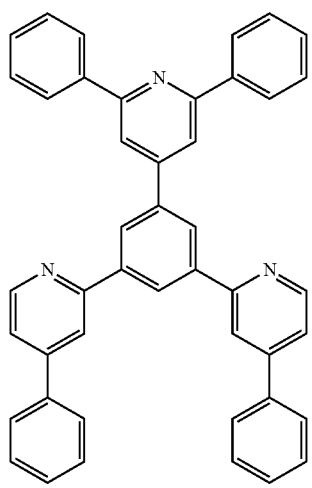
ET33
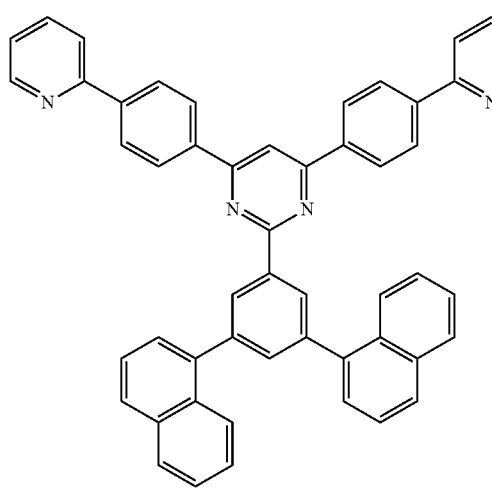
ET34
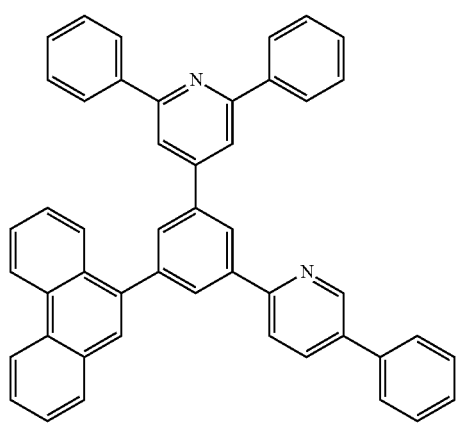
ET35
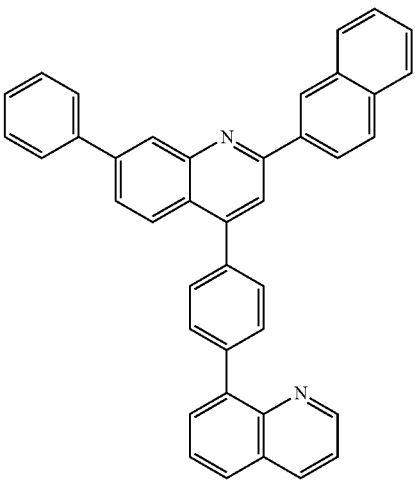
ET36
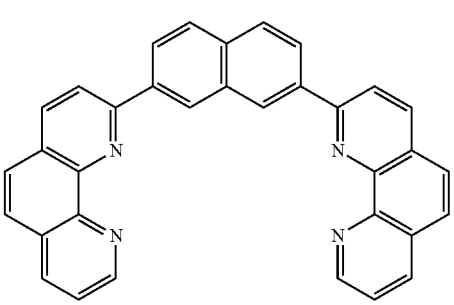
ET37
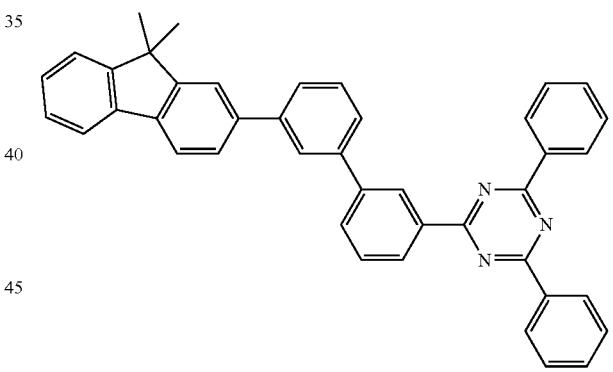
ET38
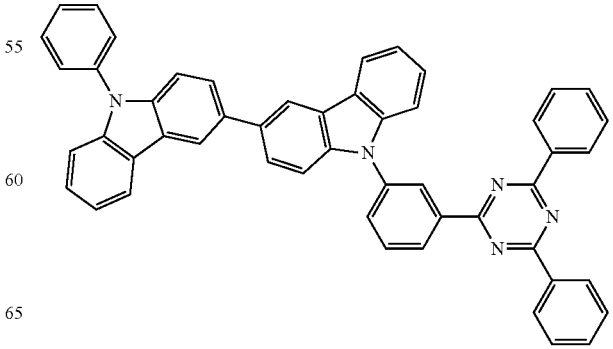

-continued
ET39
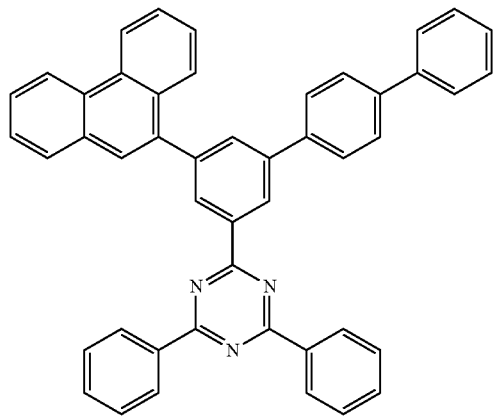
ET40
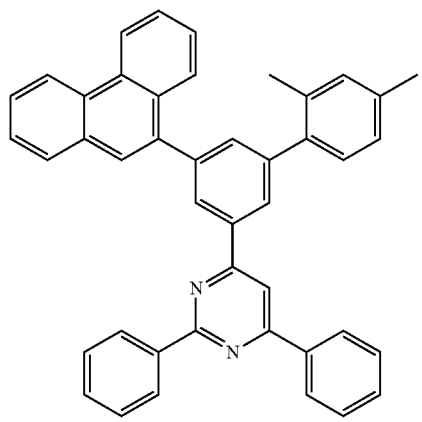
ET41
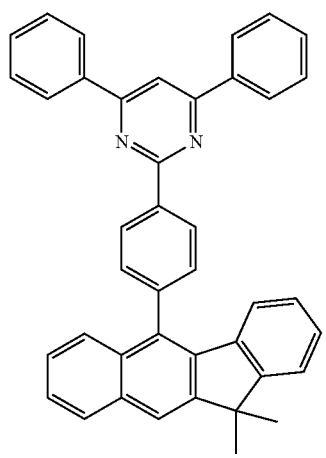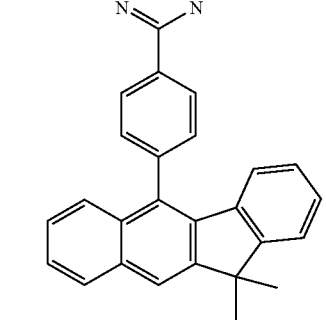
-continued
ET42
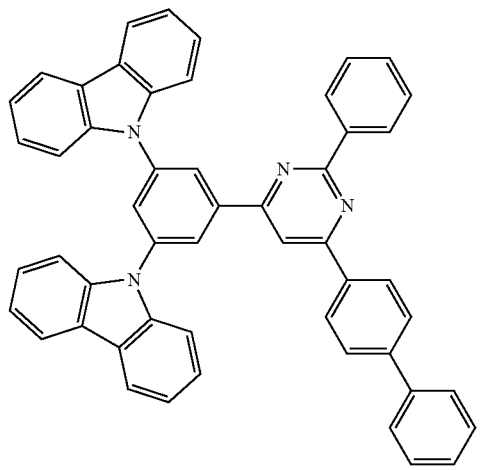
ET43
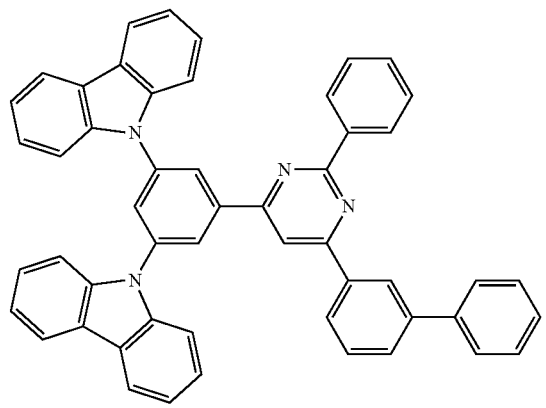
ET44
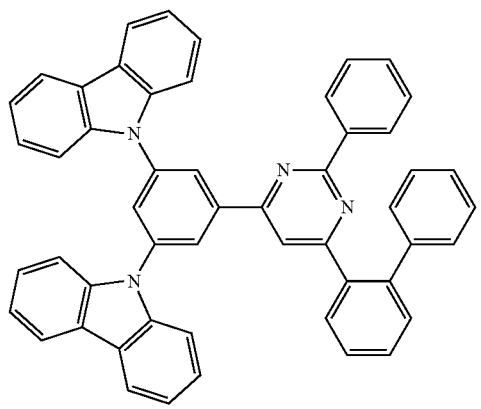
ET45
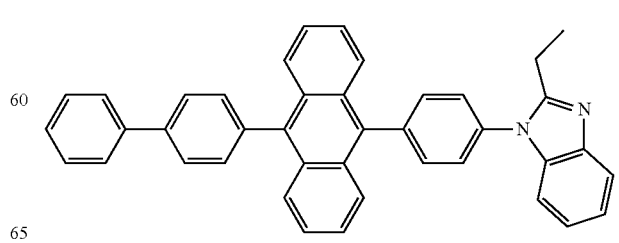

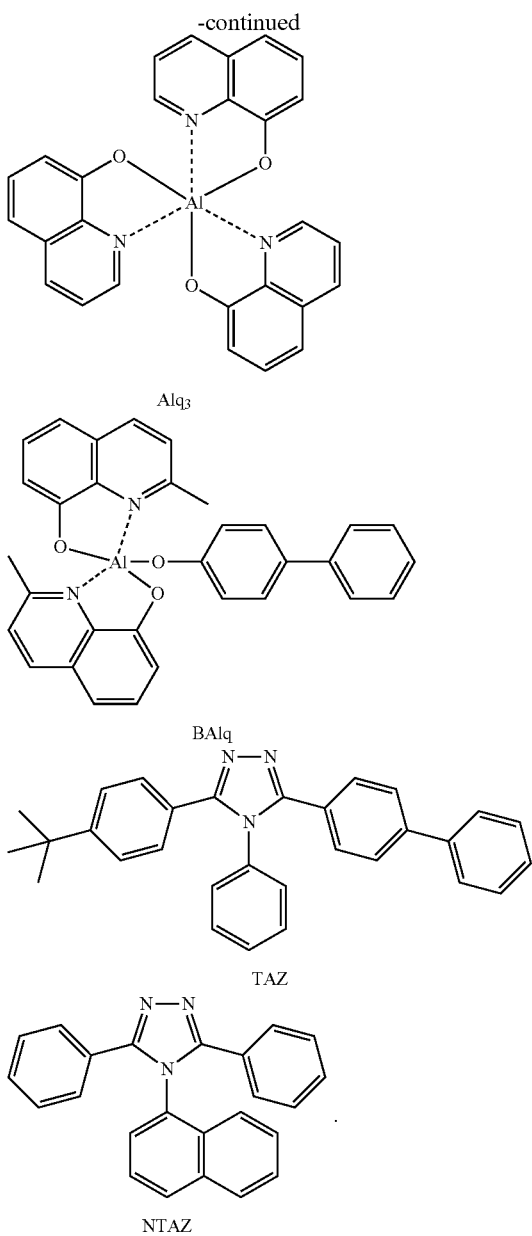

Alq₃

BAlq

TAZ

NTAZ

A thickness of the electron transport region may be in a range about 50 Å to about 5,000 Å, for example, about 100 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1000 Å, for example, about 30 Å to about 300 Å, and a thickness of the electron transport layer may be in a range of about 100 Å to about 1000 Å, for example, about 150 Å to about 500 Å. When the thicknesses of the buffer layer, the hole blocking layer, the electron control layer, the electron transport layer, and/or the electron transport layer are within these ranges, satisfactory (or suitable) hole transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, alkaline earth metal complex, or any combination thereof. A metal ion of the alkali metal complex may be a Li ion, a Na ion, a K ion, a Rb ion, or a Cs ion; and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) and/or Compound ET-D2:

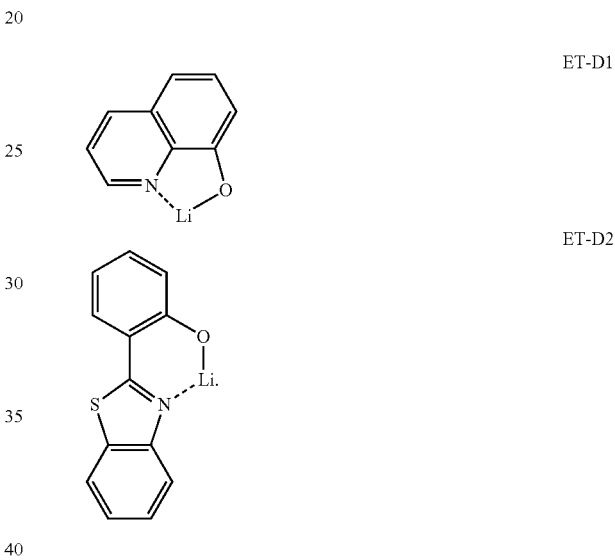

ET-D1

ET-D2

The electron transport region may include an electron injection layer that facilitates the injection of electrons from the second electrode 190. The electron injection layer may be in direct contact with the second electrode 190.

The electron injection layer may have: i) a single-layered structure including or consisting of a single layer including or consisting of a single material, ii) a single-layered structure including or consisting of a single layer including or consisting of a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be one or more oxides, halides (for example, fluorides, chlorides, bromides, and/or iodides), tellurides, or any combination thereof, of the alkali metal, the alkaline earth metal, and the rare earth metal, respectively.

The alkali metal-containing compound may include one or more alkali metal oxides (such as $Li_2O$, $Cs_2O$, and/or $K_2O$), alkali metal halides (such as LiF, NaF, CsF, KF, LiI, NaI, CsI, and/or KI), or any combination thereof. The alkaline earth metal-containing compound may include an alkaline earth metal compound, such as BaO, SrO, CaO, $Ba_xSr_{1-x}O$ (where x is a real number satisfying the condition of 0<x<1), $Ba_xCa_{1-x}O$ (where x is a real number satisfying the condition of 0<x<1), and/or the like. The rare earth metal-containing compound may include $YbF_3$, $ScF_3$, $Sc_2O_3$, $Y_2O_3$, $Ce_2O_3$, $GdF_3$, $TbF_3$, $Yb_{13}$, $ScI_3$, $Tb_{13}$, or any combination thereof. For example, the rare earth metal-containing compound may include lanthanide metal telluride. Non-limiting examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and/or $Lu_2Te_3$.

The alkali metal complex, the alkaline earth-metal complex, and the rare earth metal complex may include i) one of ions of the alkali metal, the alkaline earth metal, or the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may include or consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. For example, the electron injection layer may further include an organic material (for example, a compound represented by Formula 601).

In one or more embodiments, the electron injection layer may include or consist of i) an alkali metal-containing compound (for example, an alkali metal halide), or ii) a) an alkali metal-containing compound (for example, an alkali metal halide); and b) an alkali metal, an alkaline earth metal, a rare earth metal, or any combination thereof. For example, the electron injection layer may be a KI:Yb co-deposited layer, an RbI:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within these ranges, satisfactory (or suitable) electron injection characteristics may be obtained without a substantial increase in driving voltage.

Second Electrode 190

The second electrode 190 is arranged on the interlayer 150 having the above-described structure. The second electrode 190 may be a cathode, which is an electron injection electrode, and in this regard, as a material for forming the second electrode 190, a metal, an alloy, a suitable electrically conductive compound, or any combination thereof, each having a low work function, may be used.

The second electrode 150 may include at least one of lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 190 may be a transmissive electrode, a semi-transmissive electrode, or a reflective electrode.

The second electrode 190 may have a single-layered structure or a multi-layered structure including two or more layers.

Capping Layer

A first capping layer may be arranged outside the first electrode 110, and/or a second capping layer may be arranged outside the second electrode 190. For example, the light-emitting device 100 may have a structure in which the first capping layer, the first electrode 110, the interlayer 150, and the second electrode 190 are sequentially stacked in this stated order; a structure in which the first electrode 110, the interlayer 150, the second electrode 190, and the second capping layer are sequentially stacked in this stated order; or a structure in which the first capping layer, the first electrode 110, the interlayer 150, the second electrode 190, and the second capping layer are sequentially stacked in this stated order.

Light generated in the emission layer 130 or 140 included in the interlayer 150 of the light-emitting device 10 may be extracted toward the outside through the first electrode 110, which is a semi-transmissive electrode or a transmissive electrode, and the first capping layer, and/or light generated in the emission layer 130 or 140 included in the interlayer 150 of the light-emitting device 10 may be extracted toward the outside through the second electrode 150, which is a semi-transmissive electrode or a transmissive electrode, and the second capping layer.

The first capping layer and the second capping layer may increase external luminescence efficiency according to the principle of constructive interference. Accordingly, light extraction efficiency of the light-emitting device 10 may be increased, thereby improving luminescence efficiency of the light-emitting device 10.

Each of the first capping layer and second capping layer may include a material having a refractive index (at 589 nm) of equal to or more than about 1.6.

The first capping layer and the second capping layer may each independently be an organic capping layer including an organic material, an inorganic capping layer including an inorganic material, or a composite capping layer including an organic material and an inorganic material.

At least one of the first capping layer or the second capping layer may each independently include a carbocyclic compound, a heterocyclic compound, an amine group-containing compound, a porphyrin derivative, a phthalocyanine derivative, a naphthalocyanine derivative, an alkali metal complex, an alkaline earth-based complex, or any combination thereof. The carbocyclic compound, the heterocyclic compound, and the amine group-containing compound may each independently be optionally be substituted with a substituent containing O, N, S, Se, Si, F, Cl, Br, I, or any combination thereof. In one or more embodiments, at least one of the first capping layer or the second capping layer may each independently include the amine group-containing compound.

In one or more embodiments, at least one of the first capping layer or the second capping layer may each independently include a compound represented by Formula 201, a compound represented by Formula 202, or any combination thereof.

In one or more embodiments, at least one of the first capping layer or the second capping layer may each independently include any of Compounds HT28 to HT33, any of Compounds CP1 to CP6, β-NPB, or any combination thereof:

CP1
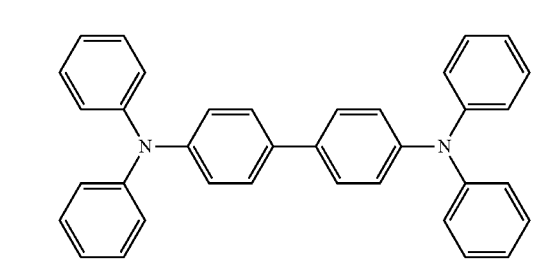

CP2
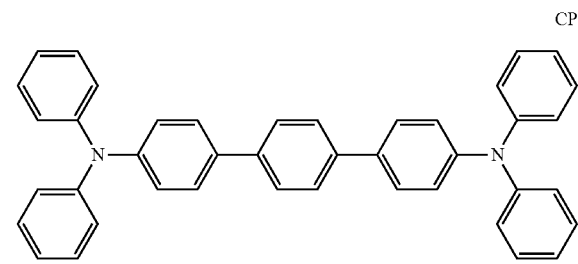

CP3
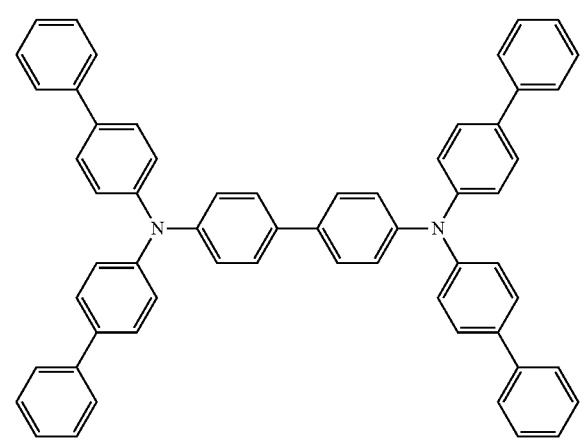

CP4
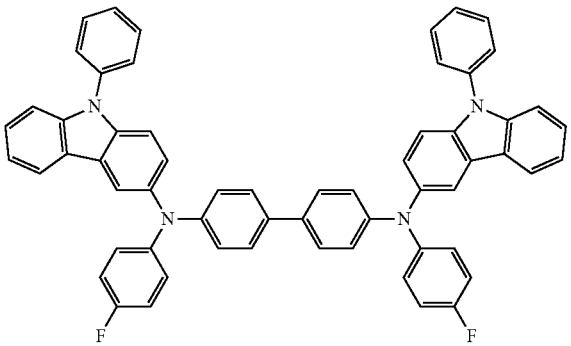

CP5
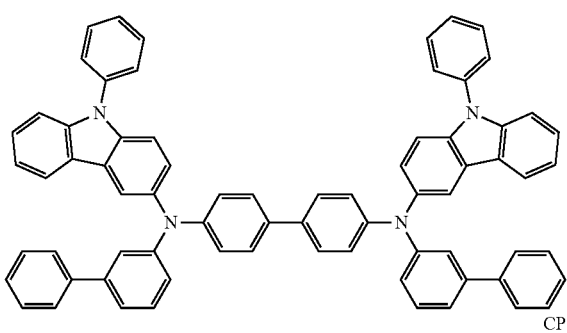

CP6
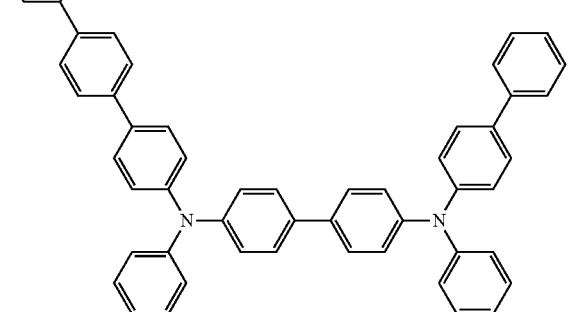

β-NPB
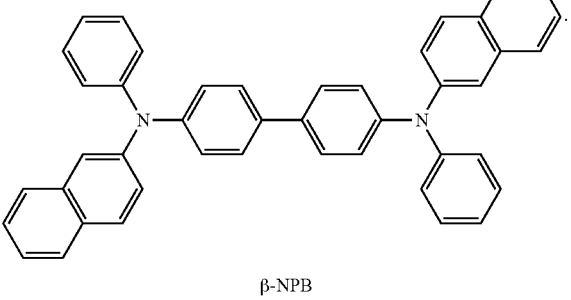

Electronic Apparatus

The light-emitting device may be included in various suitable electronic apparatuses. For example, an electronic apparatus including the light-emitting device may be a light-emitting apparatus, an authentication apparatus, and/or the like.

Such an electronic apparatus (for example, light-emitting apparatus) may further include, in addition to the light-emitting device, i) a color filter, ii) a color conversion layer, or iii) both a color filter and a color conversion layer. The color filter and/or the color conversion layer may be arranged in at least one traveling direction of light emitted from the light-emitting device. For example, light emitted from the light-emitting device may be blue light or white light. The light-emitting device may be the same as described above. In one or more embodiments, the color conversion layer may include quantum dots. The quantum dots may be, for example, the same as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be arranged among the subpixel areas to define each of the subpixel areas.

The color filter may further include a plurality of color filter areas, and light-blocking patterns located among the color filter areas, and the color conversion layer may include a plurality of color conversion areas, and light-blocking patterns located among the color conversion areas.

The color filter areas (and/or the color conversion areas) may include a first area to emit first color light, a second area to emit second color light, and/or a third area to emit third color light, and the first color light, the second color light, and/or the third color light may have different maximum emission wavelengths from one another. For example, the first color light may be red light, the second color light may be green light, and the third color light may be blue light. For example, the color filter areas (and/or the color conversion areas) may include quantum dots. In one or more embodiments, the first area may include red quantum dots, the second area may include green quantum dots, and the third area may not include quantum dots. The quantum dots may be the same as described herein. The first area, the second area, and/or the third area may each include a scatter.

For example, the light-emitting device may emit first light, the first area may absorb the first light to emit first first-color light, the second area may absorb the first light to emit second first-color light, and the third area may absorb the first light to emit third first-color light. Here, the first first-color light, the second first-color light, and the third-first light may have different maximum emission wavelengths from one another. For example, the first light may be blue light, the first first-color light may be red light, the second first-color light may be green light, and the third first-color light may be blue light.

The electronic apparatus may further include a thin-film transistor, in addition to the light-emitting device as described above. The thin-film transistor may include a source electrode, a drain electrode, and an active layer, wherein any one of the source electrode and the drain electrode may be electrically connected to any one of the first electrode and the second electrode of the light-emitting device.

The thin-film transistor may include a gate electrode, a gate insulating film, and/or the like.

The active layer may include crystalline silicon, amorphous silicon, organic semiconductor, oxide semiconductor, and/or the like.

The electronic apparatus may further include a sealing portion for sealing the light-emitting device. The sealing portion may be arranged between the color filter and the light-emitting device and/or between the color conversion layer and the light-emitting device. The sealing portion allows light from the light-emitting device to be extracted to the outside, while simultaneously (or concurrently) preventing or reducing the penetration of ambient air and/or moisture into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin-film encapsulation layer, the electronic apparatus may be flexible.

Various suitable functional layers may be additionally arranged on the sealing portion, in addition to the color filter and/or the color conversion layer, according to the use of the electronic apparatus. The functional layers may include a touch screen layer, a polarizing layer, and/or the like. The touch screen layer may be a pressure-sensitive touch screen layer, a capacitive touch screen layer, or an infra-red touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various measuring instruments, meters (for example, meters for a vehicle, an aircraft, and/or a vessel), projectors, and/or the like.

Respective layers included in the hole transport region, the emission layer, and respective layers included in the electron transport region may be formed in a certain region by using one or more suitable methods including vacuum deposition, spin coating, casting, Langmuir-Blodgett (LB) deposition, ink-jet printing, laser-printing, laser-induced thermal imaging, and/or the like.

When respective layers included in the hole transport region, the emission layer, and respective layers included in the electron transport region are formed by vacuum deposition, the deposition conditions may include, for example, a deposition temperature in a range of about 100° C. to about 500° C., a vacuum degree of about $10^{-8}$ torr to about $10^{-3}$ torr, and a deposition speed in a range of about 0.01 Å/sec to about 100 Å/sec, depending on a material to be included in a layer to be formed and a structure of a layer to be formed.

Definition of Terms

The term "$C_3$-$C_{60}$ carbocyclic group" as used herein refers to a cyclic group consisting of carbon atoms only and having three to sixty carbon atoms, and the term "$C_1$-$C_{60}$ heterocyclic group" as used herein refers to a cyclic group that further includes a heteroatom in addition to 1 to 60 carbon atoms. The $C_3$-$C_{60}$ carbocyclic group and the $C_1$-$C_{60}$ heterocyclic group may each independently be a monocyclic group consisting of one ring, or a polycyclic group in which two or more rings are condensed with each other. For example, the number of ring-forming atoms of the $C_1$-$C_{60}$ heterocyclic group may be from 3 to 61.

The "cyclic group" as used herein may include both the $C_3$-$C_{60}$ carbocyclic group and the $C_1$-$C_{60}$ heterocyclic group.

The term "$T_1$ electron-rich $C_3$-$C_{60}$ cyclic group" as used herein refers to a cyclic group that includes 3 to 60 carbon atoms and does not include *—N=*' as a ring-forming moiety, and the term "$T_1$ electron-deficient nitrogen-containing $C_1$-$C_{60}$ cyclic group" as used herein refers to a heterocyclic group that includes 1 to 60 carbon atoms and includes *—N=*' as a ring-forming moiety.

For example, the $C_3$-$C_{60}$ carbocyclic group may be i) group T1 or ii) a condensed cyclic group in which two or more groups $T_1$ are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and/or an indenoanthracene group), the $C_1$-$C_{60}$ heterocyclic group may be i) group T2, ii) a condensed cyclic group in which two or more groups $T_2$ are condensed with each other, or iii) a condensed cyclic group in which at least one group T2 and at least one group T1 are condensed with each other (for example, the $C_1$-$C_{60}$ heterocyclic group may be a pyrrole group, a thiophene group, a furan group, an indole group, a benzoindole group, a naphtho indole group, an isoindole group, a benzoisoindole group, a naphtho isoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups $T_1$ are condensed with each other, iii) group $T_3$, iv) a condensed cyclic group in which two or more groups $T_3$ are condensed with each other, or v) a condensed cyclic group in which at least one group T3 and at least one group T1 are condensed with each other (for example, the π electron-rich $C_3$-$C_{60}$ cyclic group may be the $C_3$-$C_{60}$ carbocyclic group, a pyrrole group, a thiophene group, a furan group, an indole group, a benzoindole group, a naphtho indole group, an isoindole group, a benzoisoindole group, a naphtho isoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more groups $T_4$ are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, and/or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, and/or a tetrazine group, group T3 may be a furan group, a thiophene group, a 1H-pyrrole group, a silole group, and/or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, and/or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, and/or the π electron-deficient nitrogen-containing $C_1$-$C_{60}$ cyclic group" as used herein refer to a group condensed to any cyclic group or a polyvalent group (for example, a divalent group, a trivalent group, a tetravalent group, etc.), depending on the structure of a formula in connection with which the terms are used. For example, "a benzene group" may be a benzo group, a phenyl group, a phenylene group, and/or the like, which should be easily understood by one of ordinary skill in the art according to the structure of a formula including the "benzene group".

Non-limiting examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and/or a monovalent non-aromatic condensed heteropolycyclic group, and non-limiting examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and/or a substituted or unsubstituted divalent non-aromatic condensed heteropolycyclic group.

The term "$C_1$-$C_{60}$ alkyl group" as used herein refers to a linear or branched aliphatic hydrocarbon monovalent group that includes 1 to 60 carbon atoms, and non-limiting examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and/or a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle and/or at either terminus of the $C_2$-$C_{60}$ alkyl group, and non-limiting examples thereof are an ethenyl group, a propenyl group, and/or a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at either terminus of the $C_2$-$C_{60}$ alkyl group, and non-limiting examples thereof include an ethynyl group, and/or a propynyl group. The term "$C_1$-$C_{60}$ alkynylene group" as used herein refers to a divalent group having the same structure as the $C_1$-$C_{60}$ alkynyl group.

The term "$C_1$-$C_{60}$ alkoxy group" as used herein refers to a monovalent group represented by —$OA_{101}$ (wherein Ani is the $C_1$-$C_{60}$ alkyl group), and non-limiting examples thereof include a methoxy group, an ethoxy group, and/or an isopropyloxy group.

The term "$C_3$-$C_{10}$ cycloalkyl group" as used herein refers to a monovalent saturated hydrocarbon cyclic group having 3 to 10 carbon atoms, and non-limiting examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and/or a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that has 1 to 10 carbon atoms and includes at least one heteroatom as a ring-forming atom, in addition to ring-forming carbon atoms, and non-limiting examples thereof are a 1,2,3,4-oxatriazolidinyl group, a tetrahydrofuranyl group, and/or a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that includes 3 to 10 carbon atoms and at least one carbon-carbon double bond in the ring thereof and has no aromaticity, and non-limiting examples thereof are a cyclopentenyl group, a cyclohexenyl group, and/or a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has 1 to 10 carbon atoms and at least one heteroatom as a ring-forming atom, in addition to ring-forming carbon atoms, and at least one carbon-carbon double bond in the cyclic structure thereof. Non-limiting examples of the $C_1$-$C_{10}$ heterocycloalkenyl group include a 4,5-dihydro-1,2,3,4-oxatriazolyl group, a 2,3-dihydrofuranyl group, and/or a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system including 6 to 60 carbon atoms. Non-limiting examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and/or an ovalenyl group. The term "$C_6$-$C_{60}$ arylene group" as used herein refers to a divalent group having the same structure as the $C_6$-$C_{60}$ aryl group. When the $C_6$-$C_{60}$ aryl group and the $C_6$-$C_{60}$ arylene group each independently include two or more rings, the respective two or more rings may be condensed with each other.

The term "$C_1$-$C_{60}$ heteroaryl group" as used herein refers to a monovalent group having a heterocyclic aromatic system that has 1 to 60 carbon atoms and at least one heteroatom as a ring-forming atom, in addition to ring-forming carbon atoms. The term "$C_1$-$C_{60}$ heteroarylene group" as used herein refers to a divalent group having a heterocyclic aromatic system that has the same structure as the $C_1$-$C_{60}$ heteroaryl group. Non-limiting examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and/or a naphthyridinyl group. When the $C_1$-$C_{60}$ heteroaryl group and the $C_1$-$C_{60}$ heteroarylene group each independently include two or more rings, the respective two or more rings may be condensed with each other.

The term "monovalent non-aromatic condensed polycyclic group" as used herein refers to a monovalent group having two or more rings condensed to each other, only carbon atoms (for example, having 8 to 60 carbon atoms) as ring-forming atoms, and no aromaticity in its molecular structure when considered as a whole. Non-limiting examples of the monovalent non-aromatic condensed polycyclic group are an indenyl group, a fluorenyl group, a spiro-bifluorenyl group, a benzofluorenyl group, an indenophenanthrenyl group, and/or an indenoanthracenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group having two or more rings condensed to each other, at least one heteroatom other than carbon atoms (for example, having 1 to 60 carbon atoms), as a ring-forming atom, and no aromaticity in its molecular structure when considered as a whole. Non-limiting examples of the monovalent non-aromatic condensed heteropolycyclic group are a 9,10-dihydroacridinyl group and/or 9H-xanthenyl group. The term "divalent non-aromatic condensed heteropolycyclic group" as used herein refers to a divalent group having the same structure as a monovalent non-aromatic condensed heteropolycyclic group.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$R_{10a}$" as used herein refers to:
deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; $C_1$-$C_{60}$ alkyl group; $C_2$-$C_{60}$ alkenyl group; $C_2$-$C_{60}$ alkynyl group; $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Non-limiting examples of the heteroatom are O, S, N, P, Si, B, Ge, Se, and/or any combination thereof.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, and the term "OMe" as used herein refers to a methoxy group.

The term "biphenyl group" as used herein refers to "a phenyl group substituted with a phenyl group". For example, the "biphenyl group" may be a substituted phenyl group having a $C_6$-$C_{60}$ aryl group as a substituent.

The term "terphenyl group" as used herein refers to "a phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, a quantum dot composition and a light-emitting device according to embodiments will be described in more detail with reference to Examples.

EXAMPLES

Preparation Example 1: Preparation of Surface-Modified Quantum Dot Dispersion Solution 0.5 g of quantum dots having core/shell compositions (core: InP/shell: ZnSe/ZnS) were dissolved in 10 g of 1-octadecene, 0.2 g of Ligand A was added thereto. Then, the reaction was allowed to proceed for 0.5 hours, while raising and maintaining the temperature at 100° C. in the nitrogen atmosphere, thereby preparing surface-modified first quantum dots. Surface-modified second quantum dots were prepared in substantially the same manner as described above, except that Ligand A was changed to dodecanthiol.

Ligand A

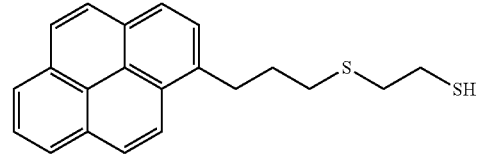

Subsequently, 1.5 g of the surface-modified first quantum dots and 1.5 g of the surface-modified second quantum dots were dispersed in 100 g of a mixed solvent of cyclohexylbenzene and n-hexadecane (at a weight ratio 1:1), thereby eventually preparing a surface-modified quantum dot dispersion solution having a solid content concentration of 3 wt %.

Preparation Example 2: Preparation of Quantum Dot Dispersion Solution 3.0 g of the surface-modified first quantum dots was dispersed in 100 g of a solvent of cyclohexylbenzene, thereby preparing a quantum dot dispersion solution having a solid content concentration of 3 wt %.

Evaluation Example 1: Evaluation of Electron and Hole Concentrations

A light-emitting device having the following composition and thickness was used as a light-emitting device of Example 1 for simulation evaluation:

ITO anode (125 nm)/PEDOT:PSS hole injection layer (140 nm)/TFB hole transport layer (40 nm)/first emission layer (first quantum dots) (10 nm)/second emission layer (second quantum dots) (10 nm)/ZnO electron transport layer (70 nm)/LiQ:Ag cathode (5 nm:100 nm).

A light-emitting device having the following composition and thickness was used as a light-emitting device of Comparative Example 1 for simulation evaluation:

ITO anode (125 nm)/PEDOT:PSS hole injection layer (140 nm)/TFB hole transport layer (40 nm)/emission layer (first quantum dots) (20 nm)/ZnO electron transport layer (70 nm)/LiQ:Ag cathode (5 nm:100 nm).

To evaluate electron concentration and hole concentration according to the distance from the anode in the light-emitting devices of Example 1 and Comparative Example 1, a simulation program to which an interface model was applied was used as a method of confirming a charge concentration level in the emission layer. Results thereof are each shown in FIGS. 2 and 3.

Figure 2:
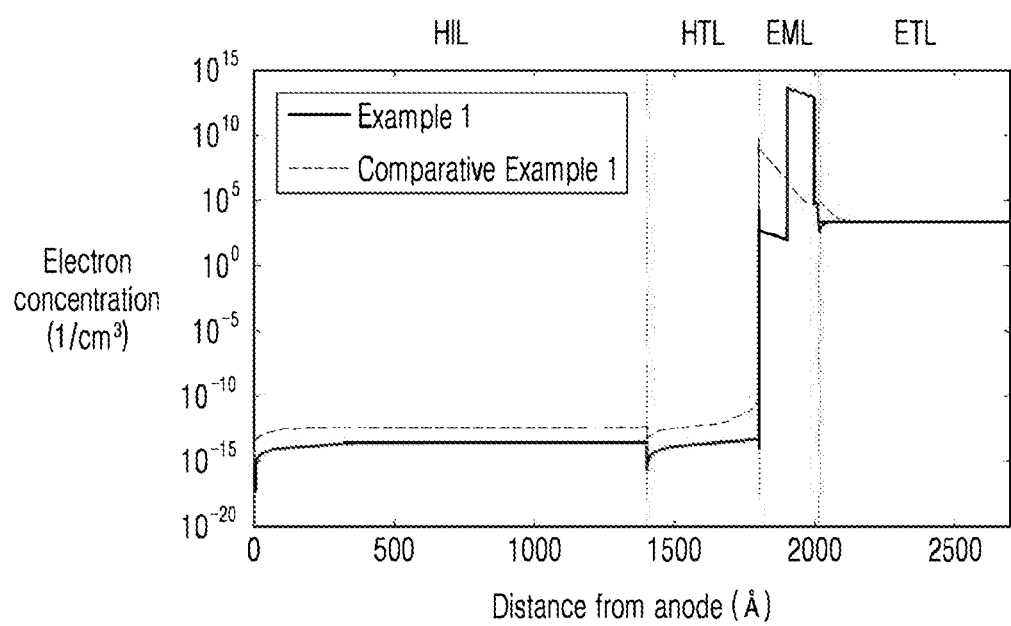
FIG. 2 is a graph of simulation results of electron concentration according to distance from an anode in each of light-emitting devices of Example 1 and Comparative Example 1.
Figure 3:
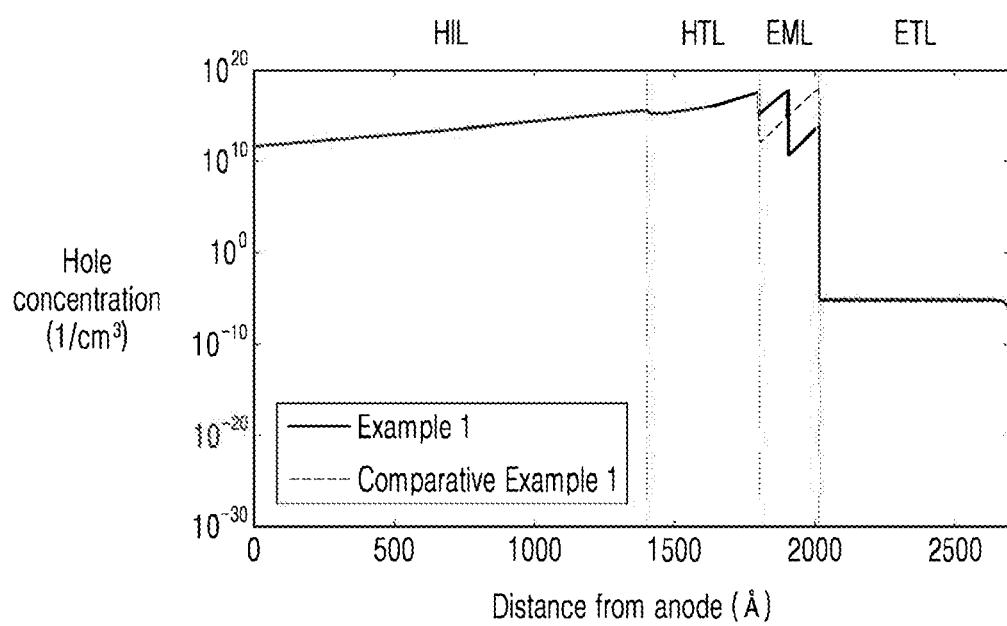
FIG. 3 is a graph of simulation results of hole concentration according to distance from an anode in each of light-emitting devices of Example 1 and Comparative Example 1.

Referring to FIGS. 2 and 3, it was confirmed that the light-emitting device of Example 1 had, compared to the light-emitting device of Comparative Example 1, an increased electron concentration in a region of the emission layer close to the electron transport layer and an increased hole concentration in a region of the emission layer close to the hole transport layer.

That is, it can be understood that, by forming an emission layer as a double-layered emission layer according to the present embodiments, the holes and electrons can be smoothly injected into the emission layer based on the appropriately (or suitably) adjusted HOMO and LUMO energy levels of the emission layer. However, the mechanism of the present disclosure is not limited thereto.

Evaluation Example 2: J-V Curve Evaluation

As a light-emitting device of Example 1, a light-emitting device having the following composition and thickness was prepared using the quantum dot dispersion solution of Preparation Example 1, and was used for evaluation:

ITO (125 nm)/PEDOT:PSS (140 nm)/TFB (40 nm)/first emission layer (first quantum dots) (10 nm)/second emission layer (second quantum dots) (10 nm)/ZnO (70 nm)/LiQ:Ag (5 nm:100 nm).

As a light-emitting device of Comparative Example 1, a light-emitting device having the following composition and thickness was prepared using the quantum dot dispersion solution of Preparation Example 2, and was used for evaluation:

ITO (125 nm)/PEDOT:PSS (140 nm)/TFB (40 nm)/emission layer (first quantum dots) (20 nm)/ZnO (70 nm)/LiQ:Ag (5 nm:100 nm).

Figure 4:
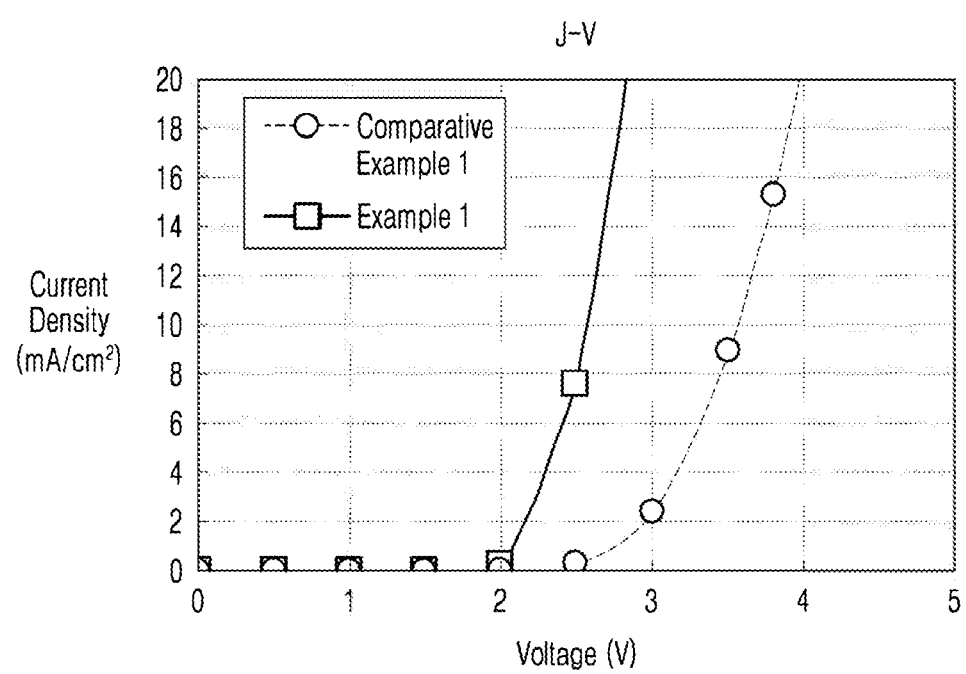
FIG. 4 shows J-V curves as results of evaluating current density according to voltage of light-emitting devices of Example 1 and Comparative Example 1.

The current density according to the voltage of each device was evaluated, and results are shown in J-V curves in FIG. 4.

As shown in FIG. 4, it was confirmed that the current density of the light-emitting device of Example 1 increased when driving at the same voltage, compared to the light-emitting device of Comparative Example 1. That is, it can be understood that, by forming an emission layer as a double-layered emission layer according to the present embodiments, using, for example, the quantum dot dispersion solution of Preparation Example 1, the holes and electrons can be smoothly injected in to the emission layer based on the appropriately (or suitably) adjusted HOMO and LUMO energy levels of the emission layer. However, the mechanism of the present disclosure is not limited thereto.

According to the one or more embodiments, a quantum dot composition may have improved dispersibility of quantum dots in a solvent. When manufacturing a light-emitting device using the quantum dot composition, a double-layered emission layer may be formed by a single process, thereby simplifying a process step.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. A quantum dot composition comprising:
a first solvent;
a second solvent different from the first solvent;
first quantum dots comprising a hole-transporting ligand; and
second quantum dots comprising an electron-transporting ligand,
wherein the first solvent and the second solvent are miscible solvents having different boiling points from each other,
a degree of dispersion of the first quantum dots is greater in the first solvent than in the second solvent, and
a degree of dispersion of the second quantum dots is greater in the second solvent than in the first solvent.

2. The quantum dot composition of claim 1, wherein the first quantum dots and the second quantum dots are each independently a Group III-VI semiconductor compound, a Group II-VI semiconductor compound, a Group III-V semiconductor compound, a Group semiconductor compound, a Group IV-VI semiconductor compound, a Group IV element, a Group IV compound, or any combination thereof.

3. The quantum dot composition of claim 1, wherein the hole-transporting ligand comprises an aromatic hydrocarbon group-containing compound.

4. The quantum dot composition of claim 1, wherein the hole-transporting ligand is an aromatic hydrocarbon group-containing carboxylic acid, an aromatic hydrocarbon group-containing amine, an aromatic hydrocarbon group-containing alcohol, an aromatic hydrocarbon group-containing thiol, an aromatic hydrocarbon group-containing phosphine oxide, an aromatic hydrocarbon group-containing phosphine, an aromatic hydrocarbon group-containing phosphonic acid, an aromatic hydrocarbon group-containing ester, an aromatic hydrocarbon group-containing acid anhydride, or any combination thereof.

5. The quantum dot composition of claim 1, wherein the electron-transporting ligand is an aliphatic hydrocarbon group-containing compound, a halogen ion, $BF_4^-$, or any combination thereof.

6. The quantum dot composition of claim 1, wherein the electron-transporting ligand is an aliphatic hydrocarbon group-containing carboxylic acid, an aliphatic hydrocarbon group-containing amine, an aliphatic hydrocarbon group-containing alcohol, an aliphatic hydrocarbon group-containing thiol, an aliphatic hydrocarbon group-containing phosphine oxide, an aliphatic hydrocarbon group-containing phosphine, an aliphatic hydrocarbon group-containing phosphonic acid, an aliphatic hydrocarbon group-containing ester, an aliphatic hydrocarbon group-containing acid anhydride, an aliphatic hydrocarbon group-containing halide, an aliphatic hydrocarbon group-containing acyl halide, a halogen ion, $BF_4^-$, or any combination thereof.

7. The quantum dot composition of claim 1, wherein the hole-transporting ligand is an aromatic hydrocarbon group-containing thiol, and
the electron-transporting ligand is an aliphatic hydrocarbon group-containing thiol.

8. The quantum dot composition of claim 1, wherein the first solvent comprises an aromatic hydrocarbon solvent.

9. The quantum dot composition of claim 1, wherein the first solvent comprises toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, propylanisole, 1-ethylnaphthalene, 2-ethylnaphthalene, 2-ethylbiphenyl, octylbenzene, or any combination thereof.

10. The quantum dot composition of claim 1, wherein the second solvent comprises an aliphatic hydrocarbon solvent, an aromatic hydrocarbon solvent, or any combination thereof.

11. The quantum dot composition of claim 1, wherein the second solvent comprises n-octane, n-nonane, n-decane, n-undecane, n-dodecane, n-tridecane, n-tetradecane, n-pentadecane, n-hexadecane, 2-methylheptane, 3-methylheptane, 4-methylheptane, 2,2-dimethylhexane, 2,3-dimethylhexane, 2,4-dimethylhexane, 2,5-dimethylhexane, 3,3-dimethylhexane, 3-ethylhexane, 2,2,4-trimethylpentane, 2-methyloctane, 2-methylnonane, 2-methyldecane, 2-methylundecane, 2-methyldodecane, 2-methyltridecane, methylcyclohexane, ethylcyclohexane, 1,1-dimethylcyclohexane, 1,2-dimethylcyclohexane, cycloheptane, methylcycloheptane, bicyclohexyl, decaline, toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, propylanisole, 1-ethylnaphthalene, 2-ethylnaphthalene, 2-ethylbiphenyl, octylbenzene, or any combination thereof.

12. The quantum dot composition of claim 1, wherein a total amount of the first quantum dots and the second quantum dots is in a range of about 0.1 wt % to about 20 wt % based on a total weight of the quantum dot composition, and a total amount of the first solvent and the second solvent is in a range of about 80 wt % to about 99.9 wt % based on the total weight of the quantum dot composition.

13. The quantum dot composition of claim 1, wherein a volume ratio of the first solvent to the second solvent is in a range of about 1:9 to about 9:1.

14. The quantum dot composition of claim 1, further comprising at least one additive selected from a dispersant, an adhesion promoter, a leveling agent, an antioxidant, and an ultraviolet absorber.

15. A method of manufacturing a light-emitting device, the method comprising:
providing a quantum dot composition on a first electrode, wherein the quantum dot composition comprises:
a first solvent,
a second solvent different from the first solvent,
first quantum dots comprising a hole-transporting ligand, and
second quantum dots comprising an electron-transporting ligand,
wherein the first solvent and the second solvent are miscible solvents having different boiling points from each other, a degree of dispersion of the first quantum dots is greater in the first solvent than in the second solvent, and a degree of dispersion of the second quantum dots is greater in the second solvent than in the first solvent,
forming a first emission layer by removing a solvent having a lower boiling point among the first solvent and the second solvent;
forming a second emission layer by removing a solvent having a higher boiling point among the first solvent and the second solvent; and
forming a second electrode on the second emission layer.

16. The method of claim 15, wherein the providing of the quantum dot composition on the first electrode is performed by an inkjet printing process.

17. The method of claim 15, wherein a boiling point of the first solvent is lower than a boiling point of the second solvent, and
a first quantum dot-containing first emission layer and a second quantum dot-containing second emission layer are sequentially formed on the first electrode.

18. The method of claim 17, further comprising:
before the providing of the quantum dot composition on the first electrode, forming a hole transport region on the first electrode; and
before the forming of the second electrode, forming an electron transport region on the second emission layer,
wherein the first electrode is an anode, and the second electrode is a cathode.

19. The method of claim 15, wherein a boiling point of the second solvent is lower than a boiling point of the first solvent, and
a second quantum dot-containing first emission layer and a first quantum dot-containing second emission layer are sequentially formed on the first electrode.

20. The method of claim 19, further comprising:
before the providing of the quantum dot composition on the first electrode, forming an electron transport region on the first electrode; and
before the forming of the second electrode, forming a hole transport region on the second emission layer,
wherein the first electrode is a cathode, and the second electrode is an anode.

* * * * *